United States Patent
Langguth et al.

(10) Patent No.: US 12,161,008 B2
(45) Date of Patent: Dec. 3, 2024

(54) DISPLAY DEVICE COMPRISING A COMMON CHARGE GENERATION LAYER AND METHOD FOR MAKING THE SAME

(71) Applicant: Novaled GmbH, Dresden (DE)

(72) Inventors: Oliver Langguth, Dresden (DE);
Thomas Rosenow, Dresden (DE);
Steffen Runge, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 18/262,484

(22) PCT Filed: Dec. 16, 2022

(86) PCT No.: PCT/EP2022/086328
§ 371 (c)(1),
(2) Date: Jul. 21, 2023

(87) PCT Pub. No.: WO2023/117748
PCT Pub. Date: Jun. 29, 2023

(65) Prior Publication Data
US 2024/0121974 A1    Apr. 11, 2024

(30) Foreign Application Priority Data

Dec. 20, 2021    (EP) .................................... 21215941

(51) Int. Cl.
*H10K 50/13*    (2023.01)
*H10K 50/12*    (2023.01)
(Continued)

(52) U.S. Cl.
CPC ............. *H10K 50/13* (2023.02); *H10K 50/12* (2023.02); *H10K 50/15* (2023.02); *H10K 50/16* (2023.02); *H10K 59/80517* (2023.02); *H10K 71/70* (2023.02); *H10K 85/654* (2023.02); *H10K 2101/30* (2023.02); *H10K 2101/40* (2023.02); *H10K 2102/103* (2023.02); *H10K 2102/351* (2023.02)

(58) Field of Classification Search
CPC .... H10K 50/13; H10K 50/131; H10K 50/155; H10K 50/165
See application file for complete search history.

(56) References Cited

U.S. PATENT DOCUMENTS

| | | | |
|---|---|---|---|
| 5,093,698 A | 3/1992 | Egusa | |
| 2015/0214498 A1* | 7/2015 | Ichikawa | ............... H10K 59/32 257/40 |

(Continued)

FOREIGN PATENT DOCUMENTS

| | | |
|---|---|---|
| EP | 2722908 A1 | 4/2014 |
| EP | 3799143 A1 | 3/2021 |

(Continued)

OTHER PUBLICATIONS

Sai-Wing Tsang, J. Appl. Phys. 100, 063708 (2006).*
(Continued)

*Primary Examiner* — Vu A Nguyen
(74) *Attorney, Agent, or Firm* — Eversheds Sutherland (US) LLP

(57) ABSTRACT

The present invention relates to a display device comprising a common charge generation layer and method for making the same.

19 Claims, 5 Drawing Sheets

1 bilayer    2 bilayers    3 bilayers

(51) Int. Cl.
- *H10K 50/15* (2023.01)
- *H10K 50/16* (2023.01)
- *H10K 59/80* (2023.01)
- *H10K 71/70* (2023.01)
- *H10K 85/60* (2023.01)
- *H10K 101/30* (2023.01)
- *H10K 101/40* (2023.01)
- *H10K 102/00* (2023.01)
- *H10K 102/10* (2023.01)

(56) References Cited

U.S. PATENT DOCUMENTS

| | | | |
|---|---|---|---|
| 2020/0388779 A1 | 12/2020 | Ohsawa et al. | |
| 2021/0296606 A1* | 9/2021 | Kim | H10K 50/19 |
| 2022/0238608 A1* | 7/2022 | Moon | H10K 50/19 |

FOREIGN PATENT DOCUMENTS

| | | | |
|---|---|---|---|
| EP | 4047674 A2 | 8/2022 | |
| GB | 2492400 A | 1/2013 | |
| KR | 20170062522 A | 6/2017 | |
| KR | 20190116462 A | 10/2019 | |
| KR | 20200128068 A | 11/2020 | |
| WO | 0215292 A2 | 2/2002 | |

OTHER PUBLICATIONS https://www.ossila.com/products/f4tcnq.*
https://www.ossila.com/products/alq3.*
C. W. Tang et al., Organic electroluminescent diodes, Appl. Phys. Lett., (1987), vol. 51, No. 12, pp. 913-915.
Yamazaki et al., Spatial Resolution Characteristics of Organic Light-emitting Diode Displays: A comparative Analysis of MTF for Handheld and Workstation Formats, SID Symposium Digest of Technical Papers (2013), vol. 44, pp. 419-422.
First Office Action issued in Korean application No. 10-2023-7008667, dated Dec. 13, 2023 (16 pages).
D'Andrade et al., Relationship between the ionization and oxidation potentials of molecular organic semiconductors, Org. Electron., (2005), vol. 6, pp. 11-20.
Shirota et al., Charge Carrier Transporting Molecular Materials and Their Applications in Devices, Chem. Rev., (2007), vol. 107, pp. 953-1010.

* cited by examiner

DISPLAY DEVICE COMPRISING A COMMON CHARGE GENERATION LAYER AND METHOD FOR MAKING THE SAME

CROSS-REFERENCE TO RELATED APPLICATIONS

This application is a U.S. national phase entry of PCT/EP2022/086328, filed Dec. 16, 2022, which claims priority to European Patent Application No. 21215941.2, filed Dec. 20, 2021. The content of these applications is incorporated by referenced herein.

TECHNICAL FIELD

The present invention relates to a display device comprising a common charge generation layer and method for making the same.

BACKGROUND ART

Since 1987, when low operating voltages have been demonstrated by Tang et al. (C. W. Tang et al. Appl. Phys. Lett. 51 (12) 913 (1987)), organic light-emitting diodes have been promising candidates for the realization of large-area displays. They consist of a sequence of thin (typically 1 nm to 1 μm) layers of organic materials, which can be deposited, for example, by thermal vacuum evaporation or solution processing, followed by formation of the electrical contacts through metallic layers. Organic electrical devices offer a great variety of electronic or optoelectronic components, such as diodes, light-emitting diodes, photodiodes and thin film transistors (TFT), which, in terms of properties, compete with established components based on inorganic materials.

In the case of organic light-emitting diodes (OLEDs), light is produced and emitted by the light-emitting diode through the injection of charge carriers (electrons from one side, holes from another side) from the contacts into adjacent organic layers as a result of an externally applied voltage, subsequent formation of excitons (electron-hole pairs) in an active zone, and radiative recombination of these excitons.

The advantage of such organic components over conventional inorganic components (based on inorganic semiconductors such as silicon or gallium arsenide) is the option to produce large-area elements, e.g. large display elements (visual displays, screens) or lamps (for lighting applications). Organic materials, compared to inorganic materials, are relatively inexpensive (less expenditure of material and energy). Moreover, these materials, because of their low processing temperature compared to inorganic materials, can be deposited on flexible substrates, thereby opening up a whole series of new applications in display and illuminating engineering. The basic construction of such a component includes an arrangement of one or more of the following layers: Carrier substrate; hole-injecting (positive contact) base electrode which is usually transparent; hole-injecting layer (HIL); hole-transporting layer (HTL); light-emitting layer (EL); electron-transporting layer (ETL); electron-injecting layer (EIL); electron-injecting (negative contact) cover electrode, usually a metal with low work function; and encapsulation, to exclude ambient influences.

While the foregoing represents the most typical case, often several layers may be (with the exception of HTL and ETL) omitted, or else one layer may combine several properties.

The use of doped charge-carrier transport layers (p-doping of the HTL by admixture of acceptor-like molecules, n-doping of the ETL by admixture of donor-like molecules) is described in document U.S. Pat. No. 5,093,698. Doping in this sense means that the admixture of doping substances into the layer increases the equilibrium charge-carrier concentration in this layer, compared to the pure layers of one of the two substances concerned, which results in improved electrical conductivity and better charge-carrier injection from the adjacent contact layers into this mixed layer. The transport of charge carriers still takes place on the matrix molecules. According to U.S. Pat. No. 5,093,698, the doped layers are used as injection layers at the interface to the contact materials, the light-emitting layer being found in between (or, when only one doped layer is used, next to the other contact). Equilibrium charge-carrier density, increased by doping, and associated band bending, facilitate charge-carrier injection. The energy levels of the organic layers (HOMO=highest occupied molecular orbital or highest energetic valence band energy; LUMO=lowest unoccupied molecular orbital or lowest energetic conduction band energy), according to U.S. Pat. No. 5,093,698, should be obtained so that electrons in the ETL as well as holes in the HTL can be injected into the EL (emitting layer) without further barriers, which requires very high ionization energy of the HTL material and very low electron affinity of the ETL material.

With respect to active OLED displays, so-called crosstalk between pixels of the display has been a major problem. Pixel or colour crosstalk refers to photons of one colour generated by a pixel falsely mixing with photons of another colour scattered from a close pixel. For example, documents GB 2 492 400 A and WO 2002/015292 A2 provide measures for reducing colourcrosstalk in OLED devices. In addition, or as an alternative aspect, electrical crosstalk may occur. In this case, for example, a driving current applied to one of the pixels may cause light emission from another pixel close to the pixel for which the driving current is provided. Both will have a negative impact on the performance of the display device, (see Yamazaki et al., A. (2013), 33.2: Spatial Resolution Characteristics of Organic Light-emitting Diode Displays: A comparative Analysis of MTF for Handheld and Workstation Formats. SID Symposium Digest of Technical Papers, 44: 419-422. doi: 10.1002/j.2168-0159.2013.tb06236.x).

In a typical commercial active-matrix OLED display, electrical pixel cross talk may be caused by the application of redox p-doping in a hole transport layer (HTL) which is shared by more OLED pixels (in the sense that the shared HTL is electrically connected to anodes of a plurality of pixels present in the display). The use of redox p-dopants which increase charge carrier density by creation of new charge carriers (holes) by transfer of an electron from a molecule of the doped matrix to a dopant molecule is beneficial for low-operating voltage, high operational stability and high production yield. On the other hand, redox p-doping increases electrical conductivity of hole transport layers from less than $10^{-8}$ S/cm without p-dopant, usually from less than $10^{-10}$ S/cm, to more than $10^{-6}$ S/cm (typically, with concentrations of the p-dopant in the range between 1 and 5 wt. %). Therefore, redox-doped HTL is usually responsible for any electrical pixel cross talk in active matrix displays comprising a HTL shared by plurality of pixels. The ETL, if n-doped with redox n-dopants, might also show similarly high conductivity as the redox-doped HTL, however, due to display layout with a common cathode, the ETL does not cause electrical pixel cross talk.

There remains a need to improve performance of display devices, as well as organic electronic devices thereof, in particular to achieve reduced crosstalk between pixels while providing good overall OLED performance.

Disclosure

An aspect of the present invention provides a device, comprising a plurality of pixels, wherein each pixel of the plurality of pixels comprises at least two vertically stacked electroluminescent units and at least one charge generation layer arranged between the at least two vertically stacked electroluminescent units, wherein each electroluminescent unit comprises at least one light-emitting layer;

wherein at least two pixels of the plurality of pixels share as the charge generation layer at least one common charge generation layer, wherein the at least one common charge generation layer comprises a common n-type charge generation layer comprising an organic electron transport compound and a metal dopant; and a common p-type charge generation layer comprising an organic hole transport compound and an organic p-dopant, wherein the organic hole transport compound is present in the p-type charge generation layer in an amount of ≥60 wt %, based on the total weight of the p-type charge generation layer;

wherein, the organic hole transport compound has a hole mobility, when measuring the voltage drop $V_{HOD}$, in the range of ≥1.2 V to ≤20 V, and/or a hole mobility, determined by measuring the voltage drop $V_{HOD}$, in the range of ≥1.2 V to ≤20 V, and/or a hole mobility in the range of ≥1.2 V to ≤20 V wherein the hole mobility is given as the voltage drop $V_{HOD}$.

and the organic electron transport compound has an electron mobility, when measuring the voltage drop $V_{EOD}$, in the range of ≥0.1 V to ≤20 V and/or an electron mobility, determined by measuring the voltage drop $V_{EOD}$, in the range of ≥0.1 V to ≤20 V and/or an electron mobility in the range of ≥0.1 V to ≤20 V, wherein the electron mobility is given as the voltage drop $V_{EOD}$, An aspect of the present invention provides a device, comprising a plurality of pixels, wherein each pixel of the plurality of pixels comprises at least two vertically stacked electroluminescent units and at least one charge generation layer arranged between the at least two vertically stacked electroluminescent units, wherein each electroluminescent unit comprises at least one light-emitting layer;

wherein at least two pixels of the plurality of pixels share as the charge generation layer at least one common charge generation layer, wherein the at least one common charge generation layer comprises a common n-type charge generation layer comprising an organic electron transport compound and a metal dopant; and a common p-type charge generation layer comprising an organic hole transport compound and an organic p-dopant, wherein the organic hole transport compound is present in the p-type charge generation layer in an amount of ≥60 wt %, based on the total weight of the p-type charge generation layer;

wherein, the organic hole transport compound has a hole mobility, when measuring the voltage drop $V_{HOD}$, in the range of ≥1.2 V to ≤20 V, and the organic electron transport compound has an electron mobility, when measuring the voltage drop $V_{EOD}$, in the range of ≥0.1 V to ≤20 V, and/or the organic hole transport compound has a hole mobility, determined by measuring the voltage drop $V_{HOD}$, in the range of ≥1.2 V to ≤20 V, and the organic electron transport compound has an electron mobility, determined by measuring the voltage drop $V_{EOD}$, in the range of ≥0.1 V to ≤20 V, and/or the organic hole transport compound has a hole mobility in the range of ≥1.2 V to ≤20 V wherein the hole mobility is given as the voltage drop $V_{HOD}$, and the organic electron transport compound has an electron mobility in the range of ≥0.1 V to ≤20 V, wherein the electron mobility is given as the voltage drop $V_{EOD}$, According to one embodiment of the present invention, the at least one common charge generation layer extends over the at least two pixel of the plurality of pixel.

According to one embodiment of the present invention, each pixel of the plurality of pixels shares as the charge generation layer at least one common charge generation layer extending over all of the plurality of pixels.

It should be noted that throughout the application and the claims any A″, Ar″, B″, R″ etc. always refer to the same moieties, unless otherwise noted.

In the present specification, when a definition is not otherwise provided, "substituted" refers to one substituted with a deuterium, $C_1$ to $C_{12}$ alkyl and $C_1$ to $C_{12}$ alkoxy.

However, in the present specification "aryl substituted" refers to a substitution with one or more aryl groups, which themselves may be substituted with one or more aryl and/or heteroaryl groups.

Correspondingly, in the present specification "heteroaryl substituted" refers to a substitution with one or more heteroaryl groups, which themselves may be substituted with one or more aryl and/or heteroaryl groups.

In the present specification, when a definition is not otherwise provided, an "alkyl group" refers to a saturated aliphatic hydrocarbyl group. The alkyl group may be a $C_1$ to $C_{12}$ alkyl group. More specifically, the alkyl group may be a $C_1$ to $C_{10}$ alkyl group or a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, and tert-butyl.

Specific examples of the alkyl group may be a methyl group, an ethyl group, a propyl group, an isopropyl group, a butyl group, an iso-butyl group, a sec-butyl group, a tert-butyl group, a pentyl group, a hexyl group.

The term "cycloalkyl" refers to saturated hydrocarbyl groups derived from a cycloalkane by formal abstraction of one hydrogen atom from a ring atom comprised in the corresponding cycloalkane. Examples of the cycloalkyl group may be a cyclopropyl group, a cyclobutyl group, a cyclopentyl group, a cyclohexyl group, a methylcyclohexyl group, an adamanty group and the like.

The term "hetero" is understood the way that at least one carbon atom, in a structure which may be formed by covalently bound carbon atoms, is replaced by another polyvalent atom. Preferably, the heteroatoms are selected from B, Si, N, P, O, S; more preferably from N, P, O, S.

In the present specification, "aryl group" refers to a hydrocarbyl group which can be created by formal abstraction of one hydrogen atom from an aromatic ring in the corresponding aromatic hydrocarbon. Aromatic hydrocarbon refers to a hydrocarbon which contains at least one aromatic ring or aromatic ring system. Aromatic ring or aromatic ring system refers to a planar ring or ring system of covalently bound carbon atoms, wherein the planar ring or ring system comprises a conjugated system of delocalized electrons fulfilling Hückel's rule. Examples of aryl groups include monocyclic groups like phenyl or tolyl, polycyclic groups which comprise more aromatic rings linked by single bonds, like biphenyl, and polycyclic groups comprising fused rings, like naphtyl or fluoren-2-yl.

Analogously, under heteroaryl, it is especially where suitable understood a group derived by formal abstraction of one ring hydrogen from a heterocyclic aromatic ring in a compound comprising at least one such ring.

Under heterocycloalkyl, it is especially where suitable understood a group derived by formal abstraction of one ring hydrogen from a saturated cycloalkyl ring in a compound comprising at least one such ring.

The term "fused aryl rings" or "condensed aryl rings" is understood the way that two aryl rings are considered fused or condensed when they share at least two common $sp^2$-hybridized carbon atoms In the present specification, the single bond refers to a direct bond.

The term "n-type charge generation layer" is sometimes in the art also named n-CGL or electron generation layer and is intended to include the both.

The term "p-type charge generation layer" is sometimes in the art also named p-CGL or hole generation layer and is intended to include the both.

The term "free of", "does not contain", "does not comprise" does not exclude impurities which may be present in the compounds prior to deposition. Impurities have no technical effect with respect to the object achieved by the present invention.

The term "contacting sandwiched" refers to an arrangement of three layers whereby the layer in the middle is in direct contact with the two adjacent layers.

The terms "light-absorbing layer" and "light absorption layer" are used synonymously.

The terms "light-emitting layer", "light emission layer" and "emission layer" are used synonymously.

The terms "OLED", "organic light-emitting diode" and "organic light-emitting device" are used synonymously.

The terms "anode", "anode layer" and "anode electrode" are used synonymously.

The terms "cathode", "cathode layer" and "cathode electrode" are used synonymously.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electrons formed in the cathode may be easily injected into the emission layer and transported in the emission layer due to conductive characteristics according to a lowest unoccupied molecular orbital (LUMO) level.

Advantageous Effects

Surprisingly, it was found that the display device according to the invention solves the problem underlying the present invention by enabling devices in various aspects superior over the display devices known in the art, in particular with respect to reduced crosstalk between pixels while providing good overall OLED performance.

According to one embodiment of the present invention, the hole mobility is measured by measuring the voltage drop $V_{HOD}$ at a fixed current density of 10 mA/cm² at 20° C. to 25° C., preferably 22° C., and the electron mobility is measured by measuring the voltage drop $V_{EOD}$ at a fixed current density of 15 mA/cm² at 20° C. to 25° C., preferably 22° C.

According to one embodiment of the present invention, the hole mobility is measured by measuring the voltage drop $V_{HOD}$ at a fixed current density of 10 mA/cm² at 20° C. to 25° C., preferably 22° C. for a hole only device, and the electron mobility is measured by measuring the voltage drop $V_{EOD}$ at a fixed current density of 15 mA/cm² at 20° C. to 25° C., preferably 22° C. for an electron only device.

According to one embodiment of the invention, the hole only device has a structure in the following order
  a glass substrate,
  90 nm anode layer consisting of ITO with a sheet resistance of 15 ohm/square,
  10 nm layer consisting of the organic hole transport compound and 10 wt % 4,4',4"-((1E,1'E,1"E)-cyclopropane-1,2,3-triylidenetris(cyanomethanylylidene))tris(2,3,5,6-tetrafluorobenzonitrile),
  400 nm layer consisting of the organic hole transport compound
  10 nm layer consisting of CNHAT,
  100 nm cathode layer consisting of silver, and wherein the electron only device has a structure in the following order
  glass substrate
  100 nm anode layer consisting of silver,
  30 nm anode layer consisting of Mg:Ag (90:10 vol %),
  1 nm layer consisting of 8-Hydroxyquinolinolato-lithium,
  36 nm layer consisting of the organic electron transport compound,
  1 nm layer consisting of 8-Hydroxyquinolinolato-lithium,
  30 nm cathode layer consisting of Mg:Ag (90:10 vol %),
  wherein the layer of the structure for measuring the voltage drop are deposited by evaporation.

According to one embodiment of the invention, the hole only device has a structure in the following order
  a glass substrate,
  90 nm anode layer consisting of ITO with a sheet resistance of 15 ohm/square,
  10 nm layer consisting of the organic hole transport compound and 10 wt % 4,4',4"-((1E,1'E,1"E)-cyclopropane-1,2,3-triylidenetris(cyanomethanylylidene))tris(2,3,5,6-tetrafluorobenzonitrile),
  400 nm layer consisting of the organic hole transport compound
  10 nm layer consisting of CNHAT,
  100 nm cathode layer consisting of silver, and
  wherein the electron only device has a structure in the following order
  glass substrate
  100 nm anode layer consisting of silver,
  30 nm anode layer consisting of Mg:Ag (90:10 vol %),
  1 nm layer consisting of 8-Hydroxyquinolinolato-lithium,
  36 nm layer consisting of the organic electron transport compound,
  1 nm layer consisting of 8-Hydroxyquinolinolato-lithium or 5 nm 3-Phenyl-3H-benzo[b]dinaphtho[2,1-d:1',2'-f]phosphepine-3-oxide:Yb (1 vol % of Yb),
  30 nm cathode layer consisting of Mg:Ag (90:10 vol %), wherein the layer of the structure for measuring the voltage drop are deposited by evaporation.

According to one embodiment of the invention, the hole only device has a structure in the following order
a glass substrate,
90 nm anode layer consisting of ITO with a sheet resistance of 15 ohm/square,
10 nm layer consisting of the organic hole transport compound and 10 wt % 4,4',4"-((1E,1'E,1"E)-cyclopropane-1,2,3-triylidenetris(cyanomethanylylidene))tris(2,3,5,6-tetrafluorobenzonitrile),
400 nm layer consisting of the organic hole transport compound
10 nm layer consisting of CNHAT,
100 nm cathode layer consisting of silver, and
wherein the electron only device has a structure in the following order
glass substrate
100 nm anode layer consisting of silver,
30 nm anode layer consisting of Mg:Ag (90:10 vol %),
1 nm layer consisting of 8-Hydroxyquinolinolato-lithium,
36 nm layer consisting of the organic electron transport compound,
1 nm layer consisting of 8-Hydroxyquinolinolato-lithium or 5 nm 3-Phenyl-3H-benzo[b]dinaphtho[2,1-d:1',2'-f]phosphepine-3-oxide:Yb (1 vol % of Yb) for non-PO containing electron transport compounds,
30 nm cathode layer consisting of Mg:Ag (90:10 vol %),
wherein the layer of the structure for measuring the voltage drop are deposited by evaporation.

CNHAT according to the present invention is Dipyrazino[2,3-f:2',3'-h]quinoxaline-2,3,6,7,10,11-hexacarbonitrile.
Common p-Type CGL
Organic Hole Transport Compound According to one embodiment of the present invention, the organic hole transport compound has a hole mobility, when measuring the voltage drop $V_{HOD}$, in the range of ≥1.5 V to ≤20 V, preferably ≥1.7 V to ≤20 V, more preferably ≥1.9 V to ≤20 V, more preferably ≥2.1 V to ≤20 V, more preferably ≥2.3 V to ≤20 V, more preferably ≥2.5 V to ≤20 V, more preferably ≥3.0 V to ≤20 V, more preferably ≥3.5 V to ≤20 V, more preferably ≥4.0 V to ≤20 V, more preferably ≥4.5 V to ≤20 V, more preferably ≥5 V to ≤20 V, more preferably ≥5.5 V to ≤20 V, and most preferably ≥6.0 V to ≤20 V.

According to one embodiment of the present invention, the organic hole transport compound has a hole mobility, when measuring the voltage drop $V_{HOD}$, in the range of ≥1.2 V to ≤15 V, preferably ≥1.2 V to ≤15 V; more preferably ≥1.5 V to ≤15 V; more preferably ≥2.5 V to ≤15 V; more preferably ≥3.0 V to ≤15 V; more preferably ≥3.5 V to ≤15 V; more preferably ≥4.0 V to ≤15 V; more preferably ≥4.5 V to ≤15 V; more preferably ≥5.0 V to ≤15 V; more preferably ≥5.5 V to ≤15 V; more preferably ≥6.0 V to ≤15 V.

According to one embodiment of the present invention, the organic hole transport compound has a hole mobility, when measuring the voltage drop $V_{HOD}$, in the range of ≥1.2 V to ≤10 V, preferably ≥1.2 V to ≤10 V; more preferably ≥1.5 V to ≤15 V; more preferably ≥2.5 V to ≤10 V; more preferably ≥3.0 V to ≤10 V; more preferably ≥3.5 V to ≤15 V; more preferably ≥4.0 V to ≤10 V; more preferably ≥4.5 V to ≤10 V; more preferably ≥5.0 V to ≤10 V; more preferably ≥5.5 V to ≤10 V; more preferably ≥6.0 V to ≤10 V.

According to one embodiment of the present invention, the organic hole transport compound has a hole mobility, determined by measuring the voltage drop $V_{HOD}$, in the range of ≥1.5 V to ≤20 V, preferably ≥1.7 V to ≤20 V, more preferably ≥1.9 V to ≤20 V, more preferably ≥2.1 V to ≤20 V, more preferably ≥2.3 V to ≤20 V, more preferably ≥2.5 V to ≤20 V, more preferably ≥3.0 V to ≤20 V, more preferably ≥3.5 V to ≤20 V, more preferably ≥4.0 V to ≤20 V, more preferably ≥4.5 V to ≤20 V, more preferably ≥5 V to ≤20 V, more preferably ≥5.5 V to ≤20 V, and most preferably ≥6.0 V to ≤20 V.

According to one embodiment of the present invention, the organic hole transport compound has a hole mobility, determined by measuring the voltage drop $V_{HOD}$, in the range of ≥1.2 V to ≤15 V, preferably ≥1.2 V to ≤15 V; more preferably ≥1.5 V to ≤15 V; more preferably ≥2.5 V to ≤15 V; more preferably ≥3.0 V to ≤15 V; more preferably ≥3.5 V to ≤15 V; more preferably ≥4.0 V to ≤15 V; more preferably ≥4.5 V to ≤15 V; more preferably ≥5.0 V to ≤15 V; more preferably ≥5.5 V to ≤15 V; more preferably ≥6.0 V to ≤15 V.

According to one embodiment of the present invention, the organic hole transport compound has a hole mobility, determined by measuring the voltage drop $V_{HOD}$, in the range of ≥1.2 V to ≤10 V, preferably ≥1.2 V to ≤10 V; more preferably ≥1.5 V to ≤15 V; more preferably ≥2.5 V to ≤10 V; more preferably ≥3.0 V to ≤10 V; more preferably ≥3.5 V to ≤15 V; more preferably ≥4.0 V to ≤10 V; more preferably ≥4.5 V to ≤10 V; more preferably ≥5.0 V to ≤10 V; more preferably ≥5.5 V to ≤10 V; more preferably ≥6.0 V to ≤10 V.

According to one embodiment of the present invention, the organic hole transport compound has a hole mobility in the range of ≥1.5 V to ≤20 V, preferably ≥1.7 V to ≤20 V, more preferably ≥1.9 V to ≤20 V, more preferably ≥2.1 V to ≤20 V, more preferably ≥2.3 V to ≤20 V, more preferably ≥2.5 V to ≤20 V, more preferably ≥3.0 V to ≤20 V, more preferably ≥3.5 V to ≤20 V, more preferably ≥4.0 V to ≤20 V, more preferably ≥4.5 V to ≤20 V, more preferably ≥5 V to ≤20 V, more preferably ≥5.5 V to ≤20 V, and most preferably ≥6.0 V to ≤20 V, whereby the hole mobility is given by the voltage drop $V_{HOD}$.

According to one embodiment of the present invention, the organic hole transport compound has a hole mobility in the range of ≥1.2 V to ≤15 V, preferably ≥1.2 V to ≤15 V; more preferably ≥1.5 V to ≤15 V; more preferably ≥2.5 V to ≤15 V; more preferably ≥3.0 V to ≤15 V; more preferably ≥3.5 V to ≤15 V; more preferably ≥4.0 V to ≤15 V; more preferably ≥4.5 V to ≤15 V; more preferably ≥5.0 V to ≤15 V; more preferably ≥5.5 V to ≤15 V; more preferably ≥6.0 V to ≤15 V, whereby the hole mobility is given by the voltage drop $V_{HOD}$.

According to one embodiment of the present invention, the organic hole transport compound has a hole mobility in the range of ≥1.2 V to ≤10 V, preferably ≥1.2 V to ≤10 V; more preferably ≥1.5 V to ≤15 V; more preferably ≥2.5 V to ≤10 V; more preferably ≥3.0 V to ≤10 V; more preferably ≥3.5 V to ≤15 V; more preferably ≥4.0 V to ≤10 V; more preferably ≥4.5 V to ≤10 V; more preferably ≥5.0 V to ≤10 V; more preferably ≥5.5 V to ≤10 V; more preferably ≥6.0 V to ≤10 V, whereby the hole mobility is given by the voltage drop $V_{HOD}$.

According to one embodiment of the present invention, the organic hole transport compound has an energy level of the HOMO, expressed in the absolute scale referring to vacuum energy level being zero, measured by cyclic voltammetry, in the range of ≥−6 eV to ≤−4.90 eV; preferably ≥−6 eV to ≤−5.00 eV; more preferably ≥−6 eV to ≤−5.10 eV, more preferably ≥−6 eV to ≤−5.12 eV, more preferably ≥−6 eV to ≤−5.15 eV, most preferably ≥−6 eV to ≤−5.18 eV.

According to one embodiment of the present invention, the organic hole transport compound has an energy level of the HOMO, expressed in the absolute scale referring to vacuum energy level being zero, measured by cyclic voltammetry, in the range of ≥−6.00 eV to ≤−4.90; preferably ≥−5.75 eV to ≤−4.90 eV; more preferably ≥−5.50 eV to ≤−4.90 eV; more preferably ≥−5.40 eV to ≤−4.90 eV; more preferably ≥−5.35 eV to ≤−4.90 eV; more preferably ≥−5.30 eV to ≤−4.90 eV.

According to one embodiment of the present invention, the organic hole transport compound has an energy level of the HOMO, expressed in the absolute scale referring to vacuum energy level being zero, measured by cyclic voltammetry, in the range of ≥−6.00 eV to ≤−5.00 eV; preferably ≥−5.75 eV to ≤−5.00 eV; preferably ≥−5.50 eV to ≤−5.00 eV; more preferably ≥−5.40 eV to ≤−5.00 eV; more preferably ≥−5.35 eV to ≤−5.00 eV; more preferably ≥−5.30 eV to ≤−5.00 eV.

According to one embodiment of the present invention, the organic hole transport compound has an energy level of the HOMO, expressed in the absolute scale referring to vacuum energy level being zero, calculated using the hybrid functional B3LYP with a Gaussian 6-31G* basis set as implemented in the program package TURBOMOLE V6.5, in the range of ≥−6 eV to ≤−4.68 eV, preferably ≥−6 eV to ≤−4.71 eV, more preferably ≥−6 eV to ≤−4.75 eV, most preferably ≥−6 eV to ≤−4.79 eV.

According to one embodiment of the present invention, the organic hole transport compound has an energy level of the HOMO, expressed in the absolute scale referring to vacuum energy level being zero, calculated using the hybrid functional B3LYP with a Gaussian 6-31G* basis set as implemented in the program package TURBOMOLE V6.5, in the range of in the range of ≥−6.0 eV to ≤−4.68 eV; ≥−5.5 eV to ≤−4.68 eV, preferably ≥−5.1 eV to ≤−4.68 eV, and more preferably ≥−5.0 eV to ≤−4.68 eV.

According to one embodiment of the present invention, the organic hole transport compound is present in the p-type charge generation layer in an amount of ≥65 wt %, based on the total weight of the p-type charge generation layer, preferably ≥70 wt %, more preferably ≥80 wt %, most preferably ≥90 wt %.

According to one embodiment of the present invention, the organic hole transport compound is a substantially covalent organic hole transport compound.

The organic hole transport compound may be a substantially covalent matrix compound.

The substantially covalent matrix compound may consists substantially from covalently bound C, H, O, N, S, which optionally comprise in addition covalently bound B, P, As and/or Se.

According to one embodiment the substantially covalent matrix compound may be selected from organic compounds consisting substantially from covalently bound C, H, O, N, S, which optionally comprise in addition covalently bound B, P, As and/or Se.

In one embodiment, the substantially covalent matrix compound lacks metal atoms and majority of its skeletal atoms may be selected from C, O, S, N. Alternatively, the substantially covalent matrix compound lacks metal atoms and majority of its skeletal atoms may be selected from C and N.

According to one embodiment of the present invention, the organic hole transport compound comprises at least 15 covalently bound atoms, preferably at least 20 covalently bound atoms, more preferably at least 25 covalently bound atoms, more preferably at least 30 covalently bound atoms, more preferably at least 35 covalently bound atoms, more preferably 40 covalently bound atoms, and more preferably 45 covalently bound atoms.

According to one embodiment, the substantially covalent matrix compound may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

Preferably, the substantially covalent matrix compound comprises at least one arylamine moiety, alternatively a diarylamine moiety, alternatively a triarylamine moiety.

According to one embodiment of the present invention, the organic hole transport compound is free of a metal complex or metal cation.

According to one embodiment of the present invention, the organic hole transport compound is not a metal complex, metal cation and/or metal-organic compound.

According to one embodiment of the present invention, the organic hole transport compound does not comprise any metal atom.

Preferably, the substantially covalent matrix compound is free of metals and/or ionic bonds.

According to one embodiment of the present invention, the organic hole transport compound, which may also be referred to as "substantially covalent matrix compound", may comprise at least one arylamine compound, diarylamine compound, triarylamine compound, a compound or formula (VII) or a compound of formula (VIII):

(VII)

(VIII)

wherein:
T¹, T², T³, T⁴ and T⁵ are independently selected from a single bond, phenylene, biphenylene, terphenylene or naphthenylene, preferably a single bond or phenylene;
T⁶ is phenylene, biphenylene, terphenylene or naphthenylene;
Ar¹, Ar², Ar³, Ar⁴ and Ar⁵ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenyl-carbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, C(=O)$R^2$, CN, Si($R^2$)$_3$, P(=O)($R^2$)$_2$, O$R^2$, S(=O)$R^2$, S(=O)$_2R^2$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R^2$ may be selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl.

According to an embodiment, $T^1$, $T^2$, $T^3$, $T^4$ and $T^5$ may be independently selected from a single bond, phenylene, biphenylene or terphenylene. According to an embodiment wherein $T^1$, $T^2$, $T^3$, $T^4$ and $T^5$ may be independently selected from phenylene, biphenylene or terphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and two of $T^1$, $T^2$, $T^3$, $T^4$ and $T^5$ are a single bond.

According to an embodiment, $T^1$, $T^2$ and $T^3$ may be independently selected from phenylene and one of $T^1$, $T^2$ and $T^3$ are a single bond. According to an embodiment wherein $T^1$, $T^2$ and $T^3$ may be independently selected from phenylene and two of $T^1$, $T^2$ and $T^3$ are a single bond.

According to an embodiment, $T^6$ may be phenylene, biphenylene, terphenylene. According to an embodiment wherein $T^6$ may be phenylene. According to an embodiment wherein $T^6$ may be biphenylene. According to an embodiment wherein $T^6$ may be terphenylene.

According to an embodiment of the invention, the matrix compound of formula (VII) or formula (VIII) are selected from the following compounds F1 to F14:

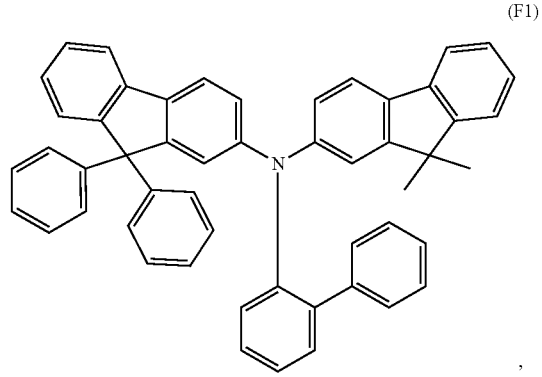

(F1)

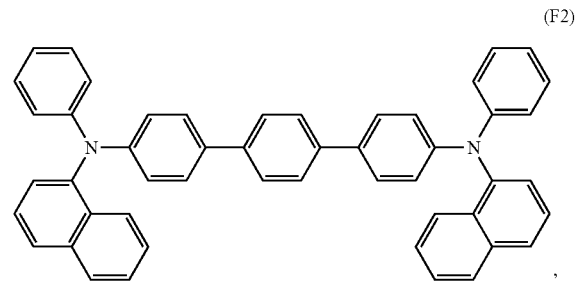

(F2)

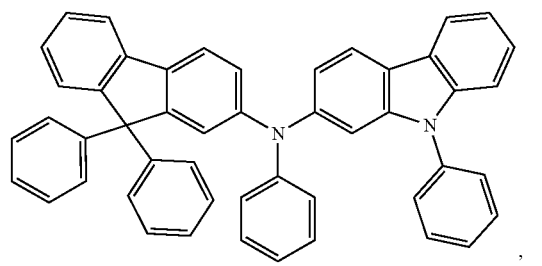

(F3)

(F4)
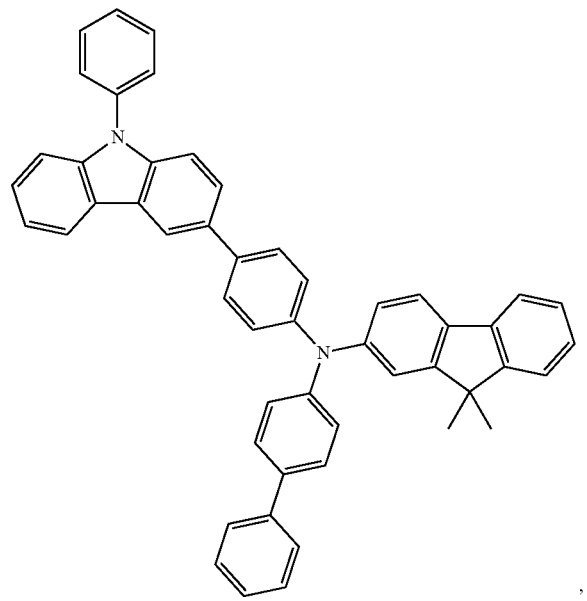
(F5)
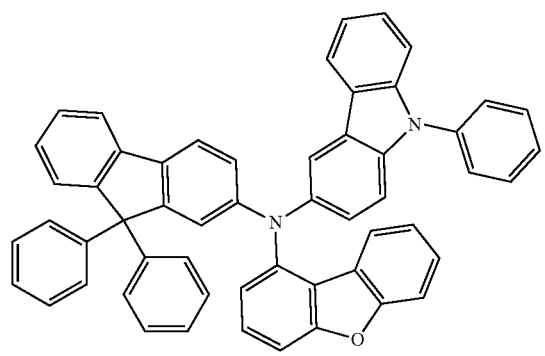
(F6)
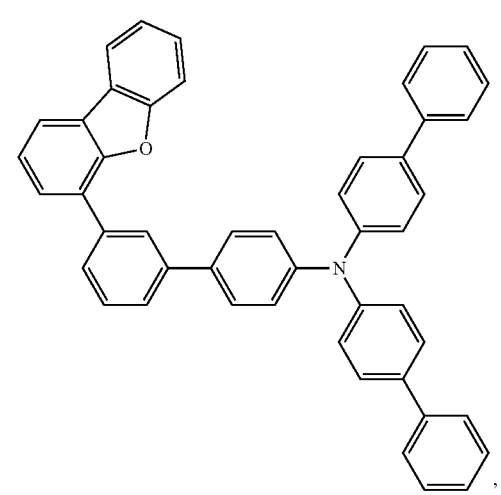
(F7)
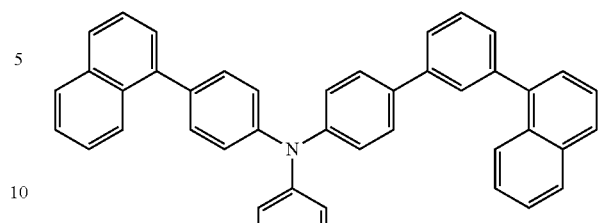
(F8)
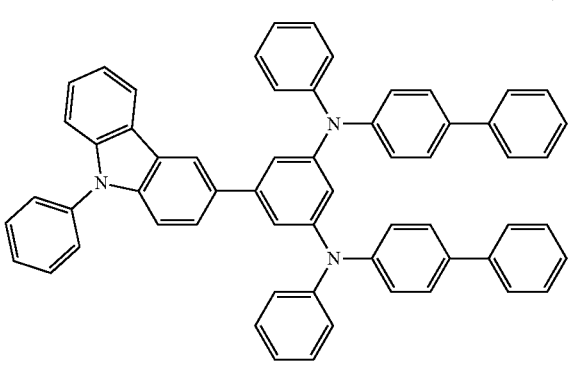
(F9)
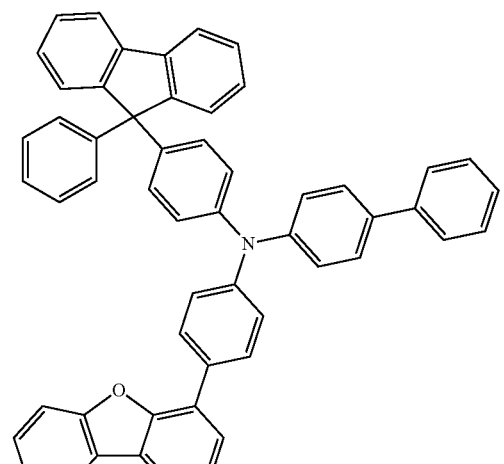
(F10)

(F11)
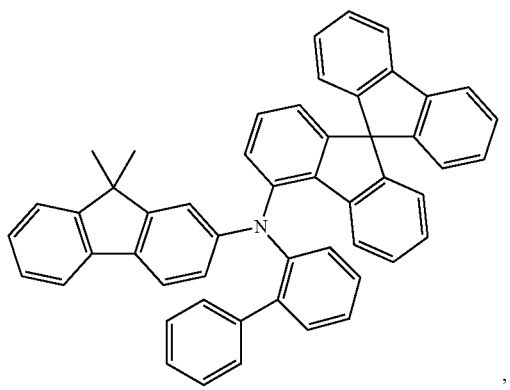
, (F12)
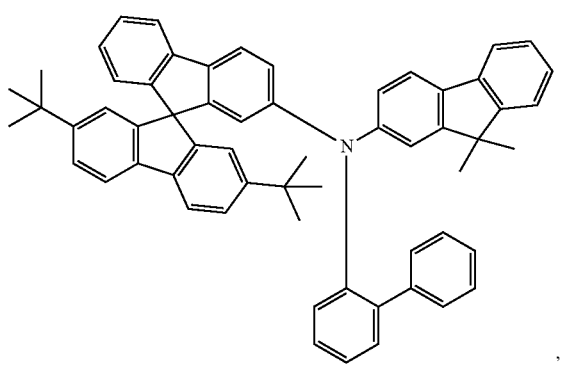
, (F13)
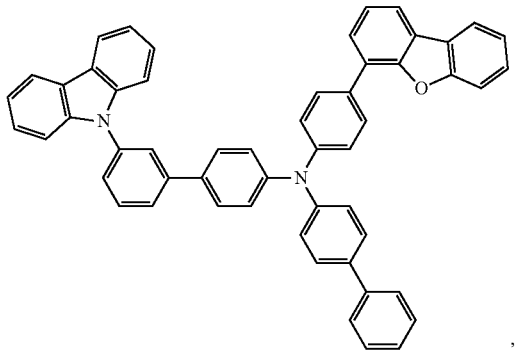
, and (F14)
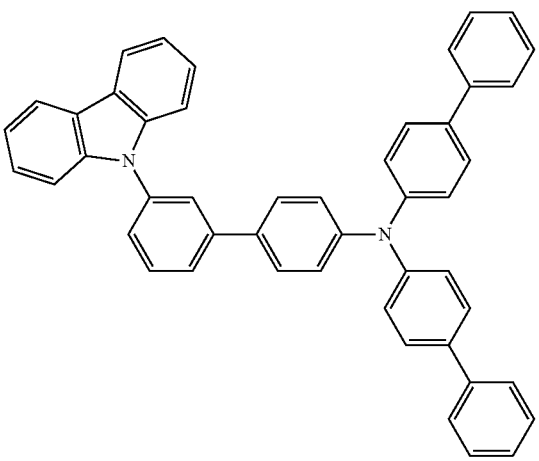
.

Organic p-Dopant

According to one embodiment of the present invention, the organic p-dopant has an energy level of the LUMO, expressed in the absolute scale referring to vacuum energy level being zero, calculated using the hybrid functional B3LYP with a Gaussian 6-31G* basis set as implemented in the program package TURBOMOLE V6.5, in the range from ≥−5.7 eV to ≤−4.7 eV, preferably ≥−5.55 eV to ≤−4.7 eV, more preferably ≥−5.50 eV to ≤−4.7 eV, more preferably ≥−5.45 eV to ≤−4.7 eV, more preferably ≥−5.40 eV to ≤−4.7 eV, more preferably ≥−5.35 eV to ≤−4.7 eV, more preferably ≥−5.30 eV to ≤−4.7 eV, and most preferably ≥−5.25 eV to ≤−4.7 eV According to one embodiment of the present invention the organic p-dopant is selected from a compound according to formula (I)

(I)
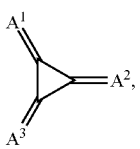

wherein in formula (I)
$A^1$ is independently selected from a group according to formula (II)

(II)
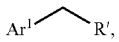

wherein $Ar^1$ is independently selected from substituted or unsubstituted $C_6$ to $C_{36}$ aryl and substituted or unsubstituted $C_2$ to $C_{36}$ heteroaryl;
wherein for the case that $Ar^1$ is substituted, one or more of the substituents are independently selected from the group consisting of an electron-withdrawing group, F, CN, partially fluorinated or perfluorinated alkyl, and —NO$_2$;
$A^2$ and $A^3$ are independently selected from a group of formula (III)

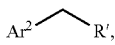
(III)

wherein Ar² is independently selected from substituted or unsubstituted $C_6$ to $C_{36}$ aryl and substituted or unsubstituted $C_2$ to $C_{36}$ heteroaryl;

wherein for the case that Ar² is substituted, one or more of the substituents are independently selected from an electron-withdrawing group, F, CN, partially fluorinated or perfluorinated alkyl, and —NO₂;

and wherein each R' is independently selected from substituted or unsubstituted $C_6$ to $C_{18}$ aryl, $C_3$ to $C_{18}$ heteroaryl, electron-withdrawing group, partially fluorinated or perfluorinated $C_1$ to $C_8$ alkyl, halogen, F or CN.

According to one embodiment of the present invention, Ar¹ is selected from $C_6$ to $C_{30}$ aryl and substituted or unsubstituted $C_2$ to $C_{30}$ heteroaryl.

According to one embodiment of the present invention, Ar¹ is selected from $C_6$ to $C_{24}$ aryl and substituted or unsubstituted $C_2$ to $C_{24}$ heteroaryl.

According to one embodiment of the present invention, Ar¹ is selected from $C_6$ to $C_{18}$ aryl and substituted or unsubstituted $C_3$ to $C_{18}$ heteroaryl.

According to one embodiment of the present invention, Ar¹ is selected from $C_6$ to $C_{12}$ aryl and substituted or unsubstituted $C_3$ to $C_{12}$ heteroaryl.

According to one embodiment of the present invention, wherein for the case that Ar¹ is substituted, one or more of the substituents are independently selected from the group consisting of F, CN, partially fluorinated alkyl or perfluorinated $C_1$ to $C_8$ alkyl in particular CF₃, and —NO₂.

According to one embodiment of the present invention, wherein for the case that Ar¹ is substituted, one or more of the substituents are independently selected from the group consisting of F, CN, partially fluorinated alkyl or perfluorinated $C_1$ to $C_8$ alkyl, in particular CF₃.

According to one embodiment of the present invention, Ar² is selected from $C_6$ to $C_{30}$ aryl and substituted or unsubstituted $C_2$ to $C_{30}$ heteroaryl.

According to one embodiment of the present invention, Ar² is selected from $C_6$ to $C_{24}$ aryl and substituted or unsubstituted $C_2$ to $C_{24}$ heteroaryl.

According to one embodiment of the present invention, Ar² is selected from $C_6$ to $C_{18}$ aryl and substituted or unsubstituted $C_3$ to $C_{18}$ heteroaryl.

According to one embodiment of the present invention, Ar² is selected from $C_6$ to $C_{12}$ aryl and substituted or unsubstituted $C_3$ to $C_{12}$ heteroaryl.

According to one embodiment of the present invention, wherein for the case that Ar² is substituted, one or more of the substituents are independently selected from the group consisting of F, CN, partially fluorinated alkyl or perfluorinated $C_1$ to $C_8$ alkyl in particular CF₃, —NO₂.

According to one embodiment of the present invention, wherein for the case that Ar² is substituted, one or more of the substituents are independently selected from the group consisting of F, CN, partially fluorinated alkyl or perfluorinated $C_1$ to $C_8$ alkyl in particular CF₃.

According to one embodiment of the present invention, R' is independently selected from the group consisting of electron-withdrawing group, CN, halogen, F, partially fluorinated $C_1$ to $C_8$ alkyl, perfluorinated $C_1$ to $C_8$ alkyl, in particular CF₃.

According to one embodiment of the present invention, R' is selected from CN, F, partially fluorinated or perfluorinated $C_1$ to $C_8$ alkyl, in particular CF₃.

According to one embodiment of the present invention, R' is selected from CN.

According to one embodiment of the present invention, the group according to formula (II) is selected from formula (IV)

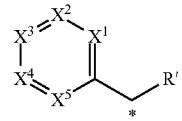
(IV)

wherein
X¹ is selected from CR¹ or N;
X² is selected from CR² or N;
X³ is selected from CR³ or N;
X⁴ is selected from CR⁴ or N;
X⁵ is selected from CR⁵ or N;
R¹, R², R³, R⁴ and R⁵ (if present) are independently selected from CN, partially fluorinated or perfluorinated $C_1$ to $C_8$ alkyl, halogen, Cl, F, D or H, whereby when any of R¹, R², R³, R⁴, and R⁵ is present, then the corresponding X¹, X², X³, X⁴, and X⁵ is not N.

According to one embodiment of the present invention, X¹ is CR¹ and R¹ is selected from partially fluorinated or perfluorinated $C_1$ to $C_8$ alkyl, CN, —NO₂, halogen, Cl, or F.

According to one embodiment of the present invention, X¹ is CR¹ and R¹ is selected from partially fluorinated or perfluorinated $C_1$ to $C_8$ alkyl, CN, or F.

According to one embodiment of the present invention, X¹ is CR¹ and R¹ is selected from partially fluorinated or perfluorinated $C_1$ to $C_8$ alkyl, or CN.

According to one embodiment of the present invention, X¹ is CR¹ and R¹ is selected from partially fluorinated or perfluorinated $C_1$ to $C_8$ alkyl.

According to one embodiment of the present invention, X¹ is CR¹ and R¹ is selected from CF₃.

According to one embodiment of the present invention, X¹ is CR¹ and X⁵ is CR⁵ and R¹ and R⁵ are independently selected from partially fluorinated or perfluorinated $C_1$ to $C_8$ alkyl, CN halogen, Cl, or F.

According to one embodiment of the present invention, X¹ is CR¹ and X⁵ is CR⁵ and R¹ and R⁵ are independently selected from partially fluorinated or perfluorinated $C_1$ to $C_8$ alkyl, CN, or F.

According to one embodiment of the present invention, X¹ is CR¹ and X⁵ is CR⁵ and R¹ and R⁵ are independently selected from partially fluorinated or perfluorinated $C_1$ to $C_8$ alkyl, or CN.

According to one embodiment of the present invention, X¹ is CR¹ and X⁵ is CR⁵ and R¹ and R⁵ are independently selected from partially fluorinated or perfluorinated $C_1$ to $C_8$ alkyl.

According to one embodiment of the present invention, X¹ is CR¹ and X⁵ is CR⁵ and R¹ and R⁵ are independently selected from CF₃.

According to one embodiment of the present invention, the compound of formula (I) is selected from formula (V)

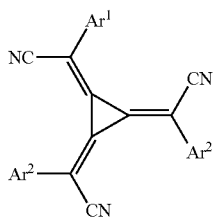

(V)

Ar¹ is independently selected from substituted or unsubstituted $C_6$ to $C_{36}$ aryl and substituted or unsubstituted $C_2$ to $C_{36}$ heteroaryl;
wherein for the case that Ar¹ is substituted, the one or more substituents are independently selected from an electron-withdrawing group, F, CN, partially perfluorinated or perfluorinated alkyl, and —NO₂; and
Ar² is independently selected from substituted or unsubstituted $C_6$ to $C_{36}$ aryl and substituted or unsubstituted $C_2$ to $C_{36}$ heteroaryl;
wherein for the case that Ar² is substituted, the one or more substituents are independently selected from an electron-withdrawing group, F, CN, partially perfluorinated or perfluorinated alkyl, and —NO₂.

According to one embodiment of the present invention, the compound of formula (I) is selected from formula (VI)

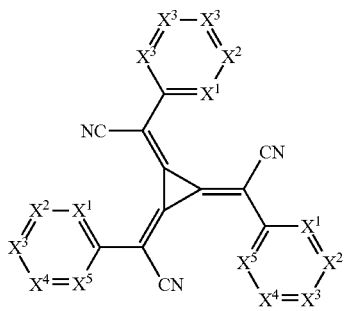

(VI)

wherein
each $X^1$ is selected from $CR^1$ or N;
each $X^2$ is selected from $CR^2$ or N;
each $X^3$ is selected from $CR^3$ or N;
each $X^4$ is selected from $CR^4$ or N;
each $X^5$ is selected from $CR^5$ or N;
wherein each $R^1$, $R^2$, $R^3$, $R^4$ and $R^5$ (if present) are independently selected from CN, partially fluorinated or perfluorinated $C_1$ to $C_8$ alkyl, halogen, Cl, F, D or H, whereby when any of $R^1$, $R^2$, $R^3$, $R^4$ and $R^5$ is present, then the corresponding $X^1$, $X^2$, $X^3$, $X^4$ and $X^5$ is not N.

According to one embodiment of the present invention, $X^1$ is $CR^1$ and $R^1$ is selected from partially fluorinated or perfluorinated $C_1$ to $C_8$ alkyl, CN, —NO₂, halogen, Cl, or F.

According to one embodiment of the present invention, $X^1$ is $CR^1$ and $R^1$ is selected from partially fluorinated or perfluorinated $C_1$ to $C_8$ alkyl, CN, or F.

According to one embodiment of the present invention, $X^1$ is $CR^1$ and $R^1$ is selected from partially fluorinated or perfluorinated $C_1$ to $C_8$ alkyl or CN.

According to one embodiment of the present invention, $X^1$ is $CR^1$ and $R^1$ is selected from partially fluorinated or perfluorinated $C_1$ to $C_8$ alkyl.

According to one embodiment, $X^1$ is $CR^1$ and $R^1$ is selected from CF₃.

According to one embodiment of the present invention, $X^1$ is $CR^1$ and $X^5$ is $CR^5$ and $R^1$ and $R^5$ are independently selected from partially fluorinated or perfluorinated $C_1$ to $C_8$ alkyl, CN, halogen, Cl, or F.

According to one embodiment of the present invention, $X^1$ is $CR^1$ and $X^5$ is $CR^5$ and $R^1$ and $R^5$ are independently selected from partially fluorinated or perfluorinated $C_1$ to $C_8$ alkyl, CN, or F.

According to one embodiment of the present invention, $X^1$ is $CR^1$ and $X^5$ is $CR^5$ and $R^1$ and $R^5$ are independently selected from partially fluorinated or perfluorinated $C_1$ to $C_8$ alkyl, or CN.

According to one embodiment of the present invention, $X^1$ is $CR^1$ and $X^5$ is $CR^5$ and $R^1$ and $R^5$ are independently selected from partially fluorinated or perfluorinated $C_1$ to $C_8$ alkyl.

According to one embodiment of the present invention, $X^1$ is $CR^1$ and $X^5$ is $CR^5$ and $R^1$ and $R^5$ are independently selected from CF₃.

According to one embodiment of the present invention, the group of formula (II) is selected from one of the following formulae:

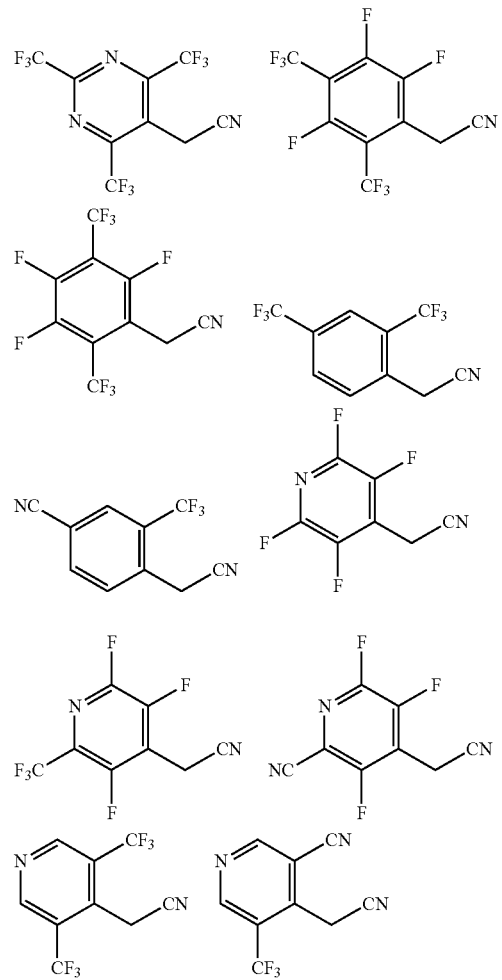

-continued
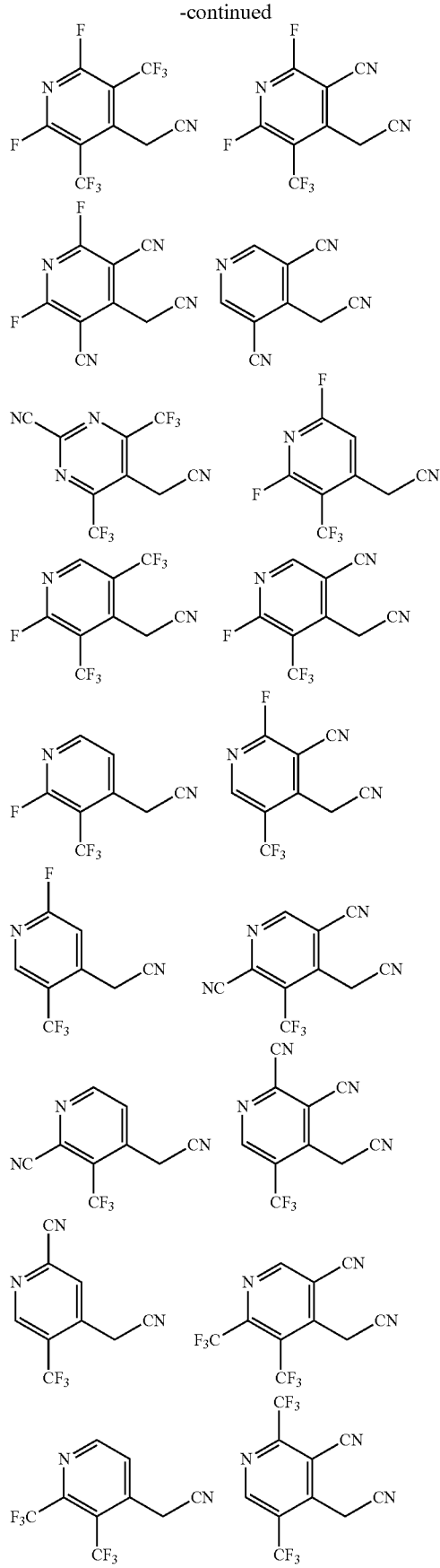
-continued
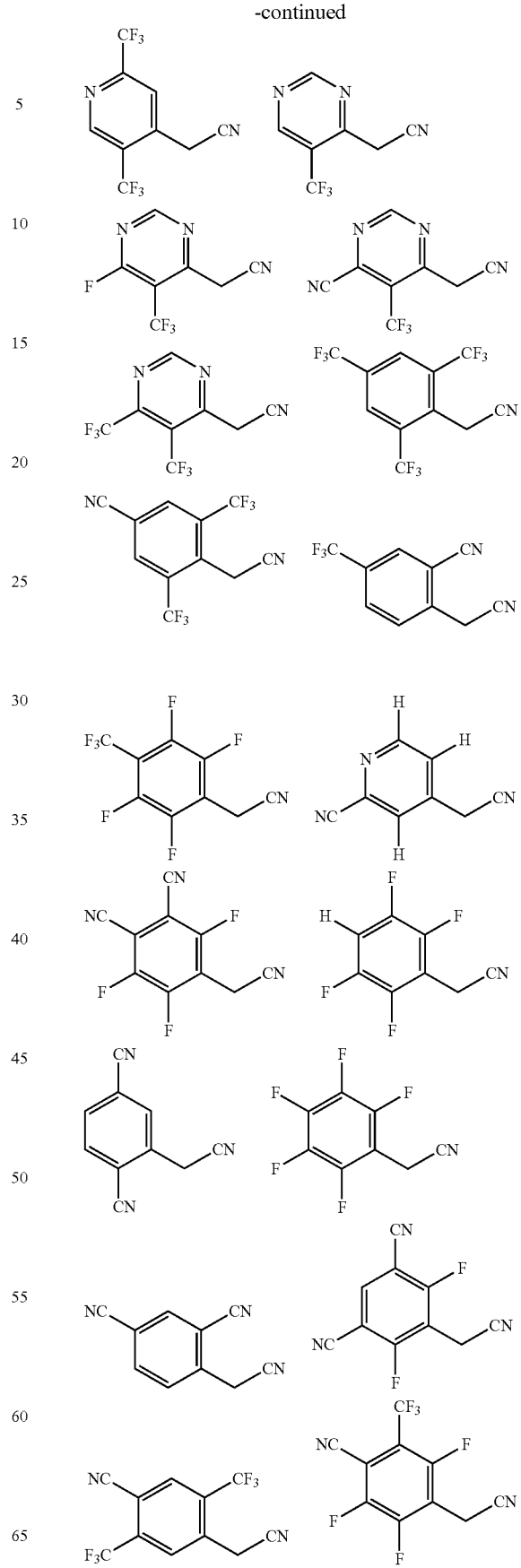

-continued
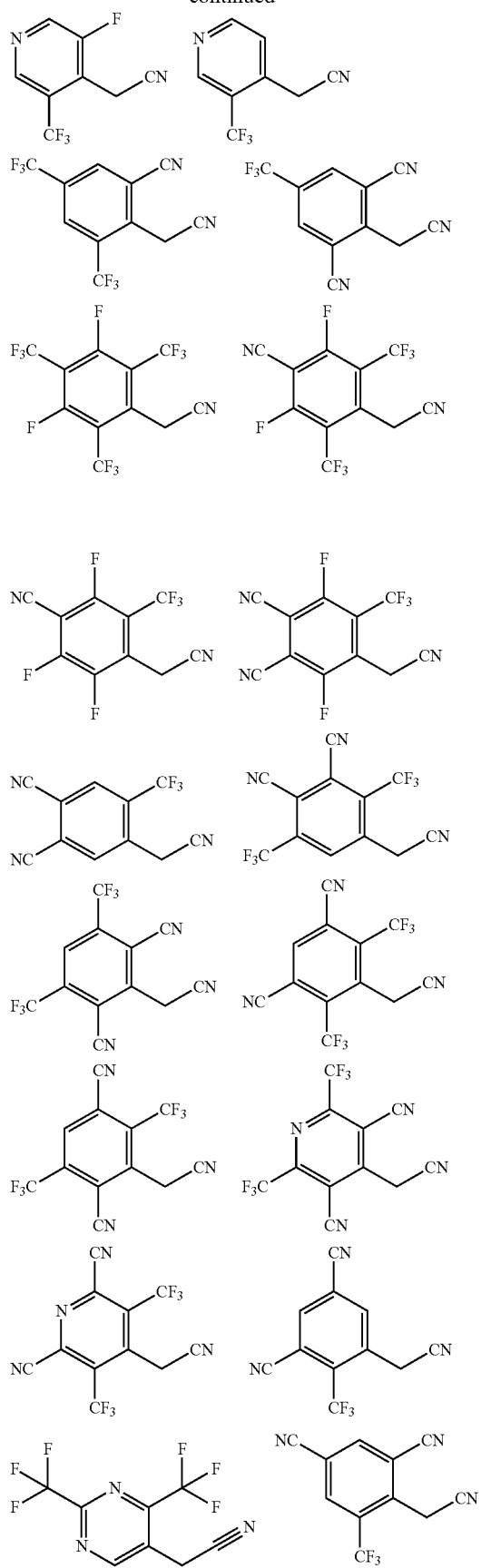
-continued
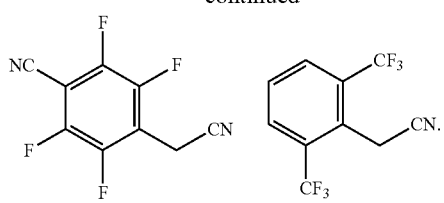
According to one embodiment of the present invention, the group of formula (II) is selected from one of the following formulae:
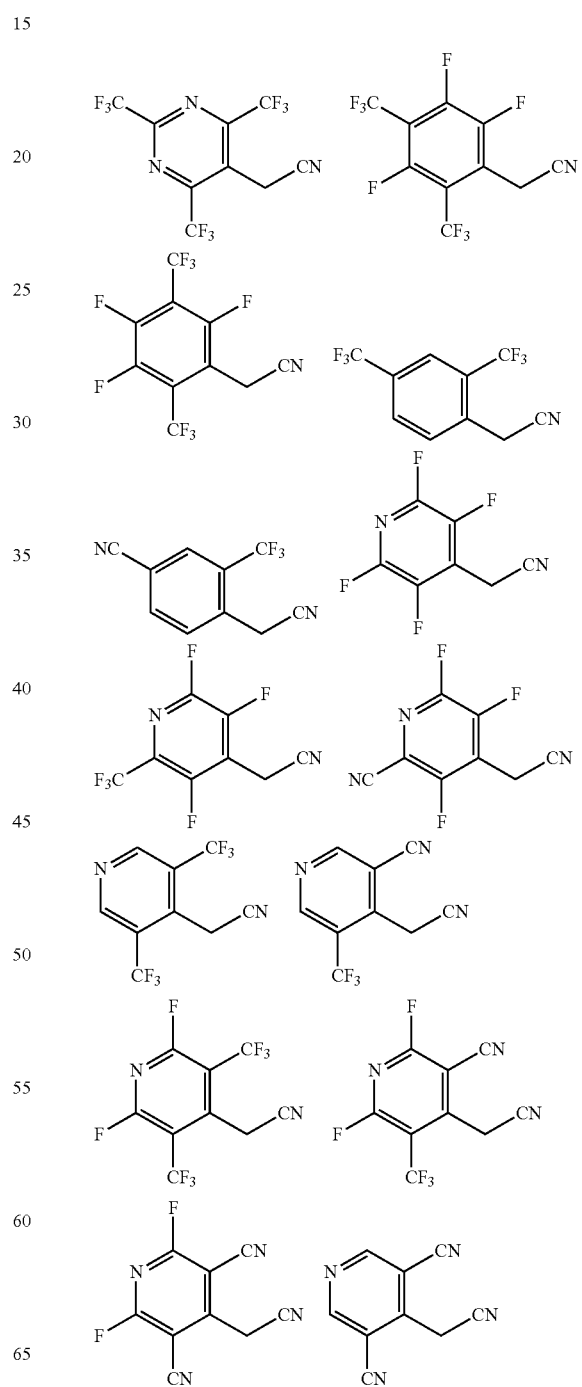

-continued
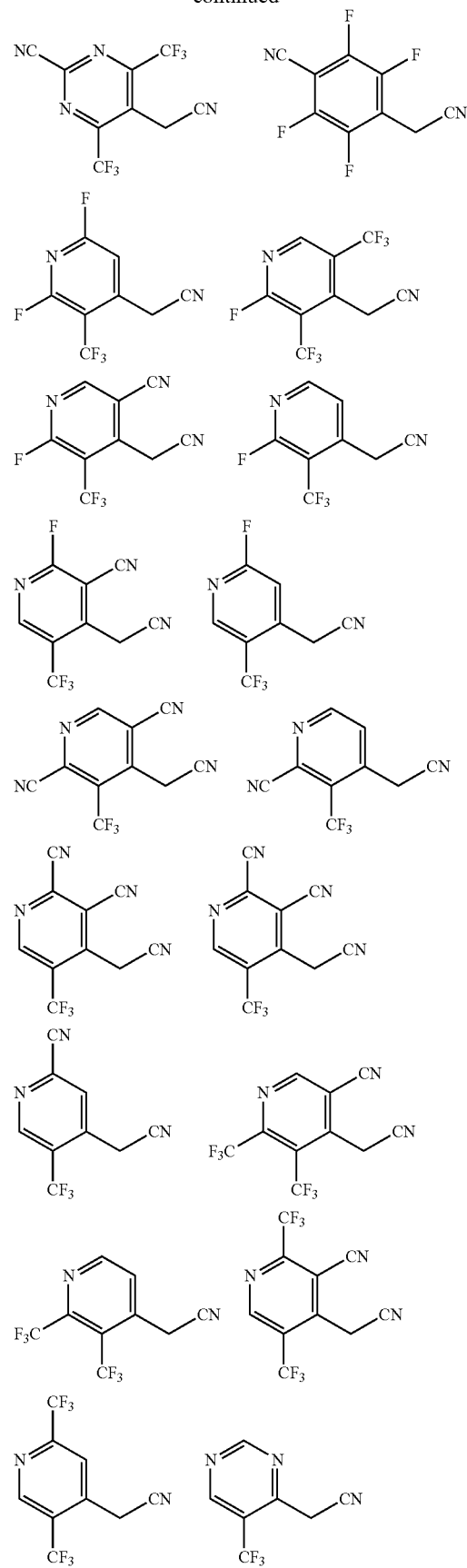
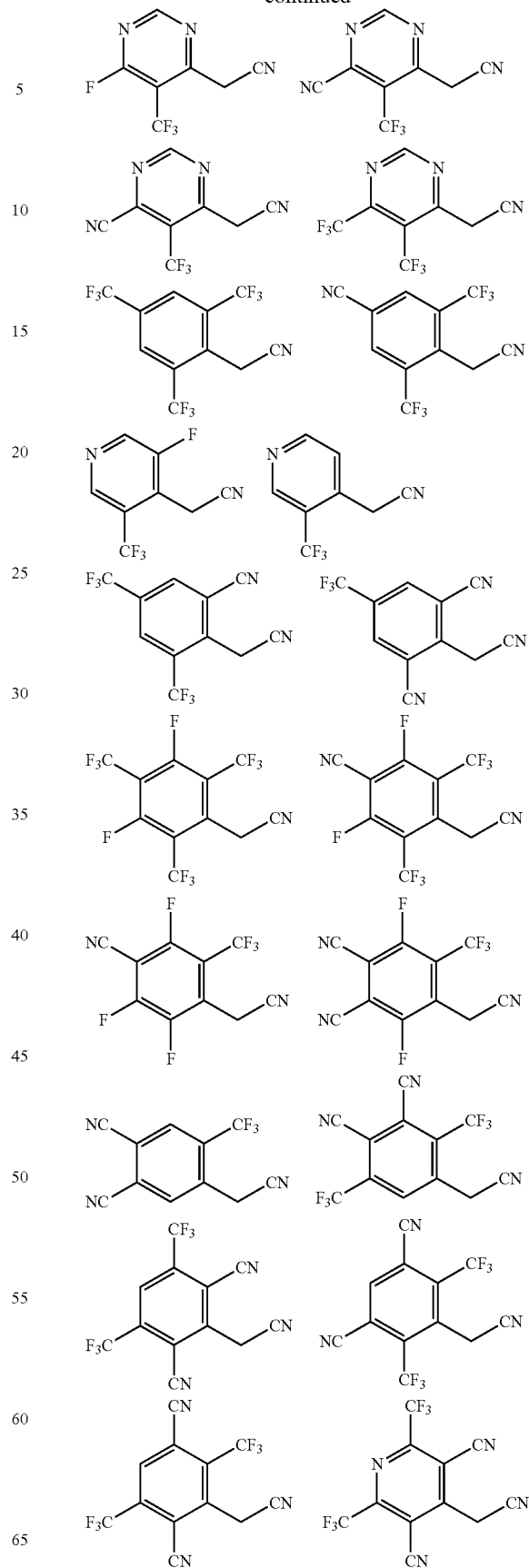

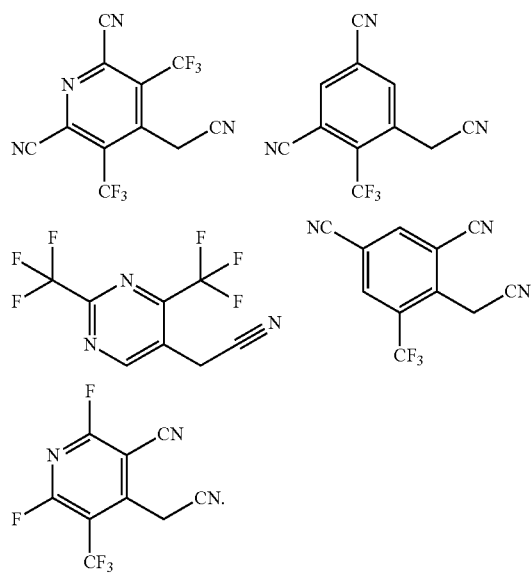
According to one embodiment of the present invention, the group of formula (II) is selected from one of the following formulae:
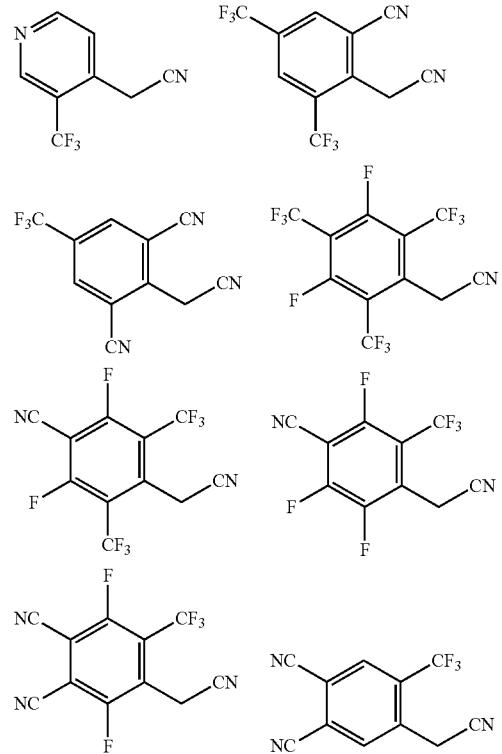
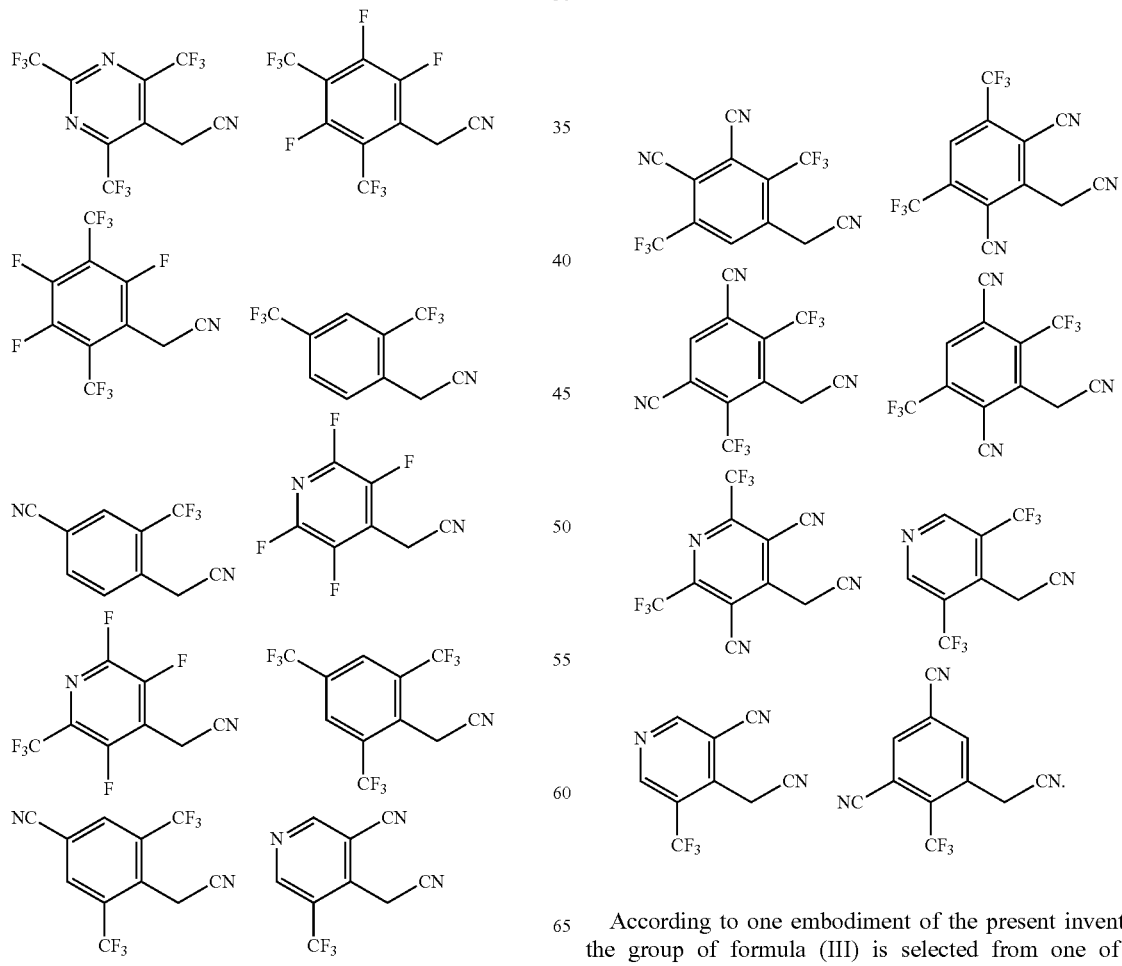
According to one embodiment of the present invention, the group of formula (III) is selected from one of the following formulae:

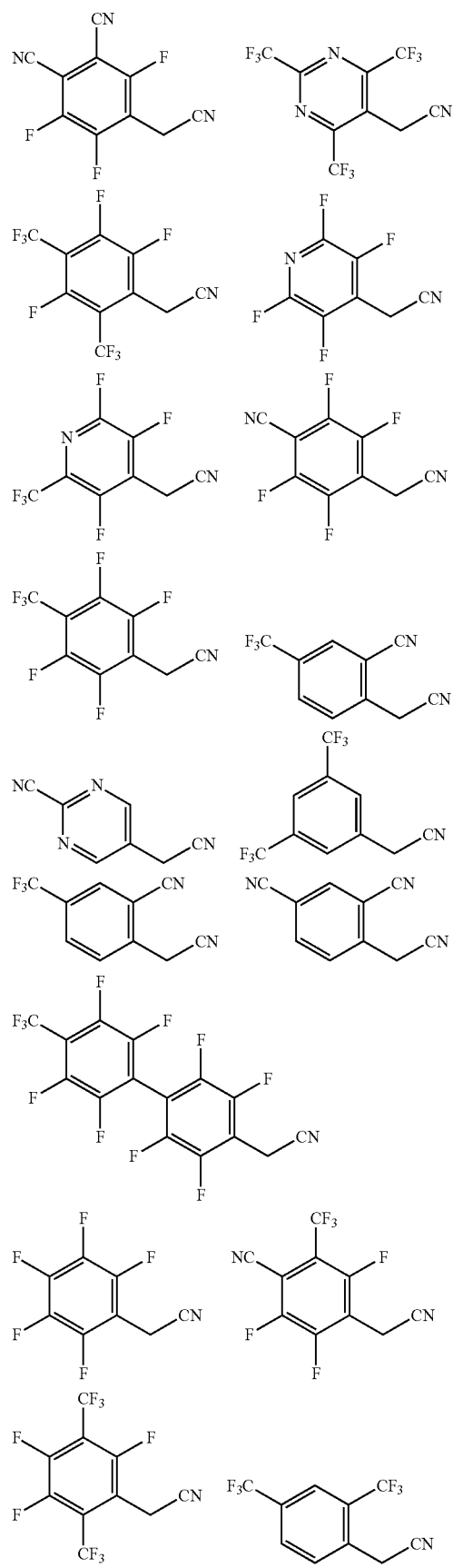
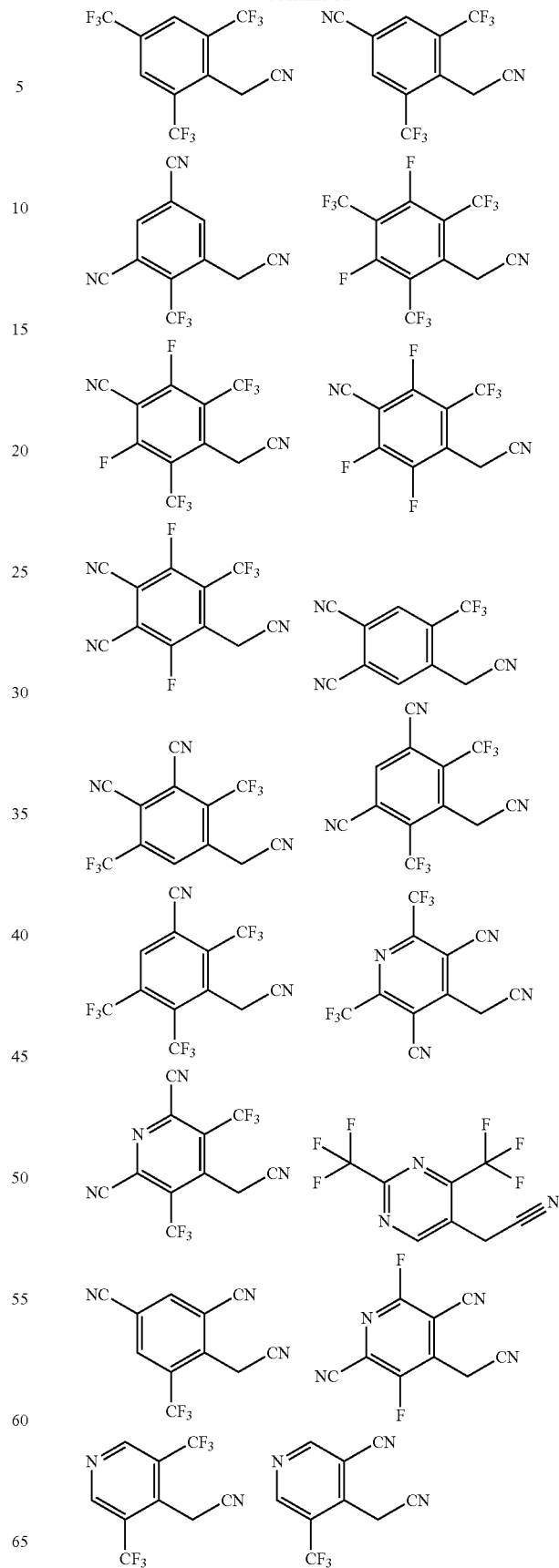

-continued
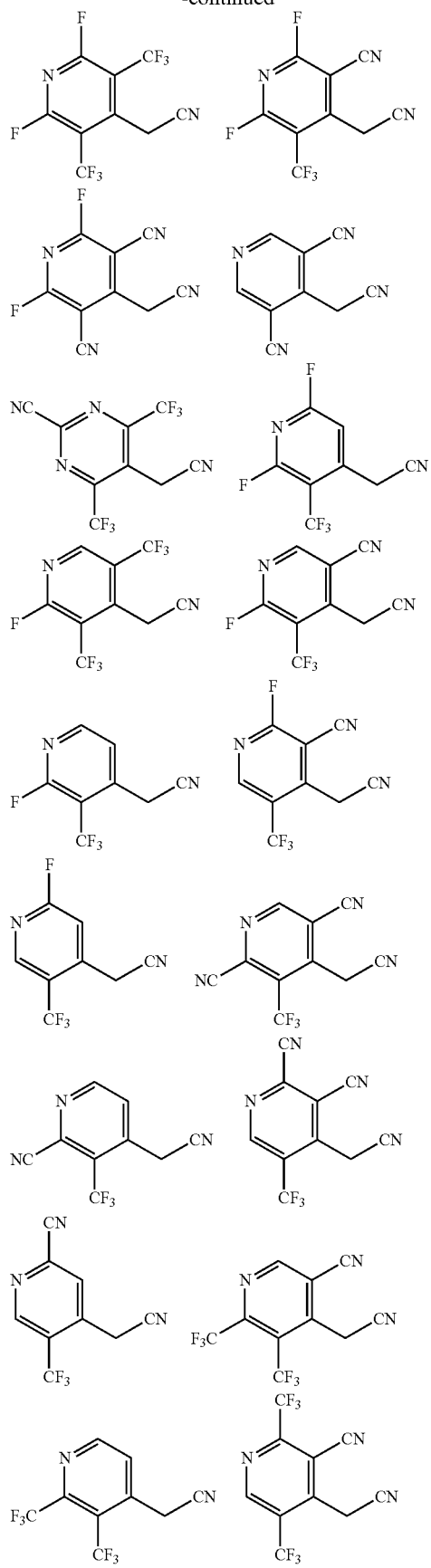
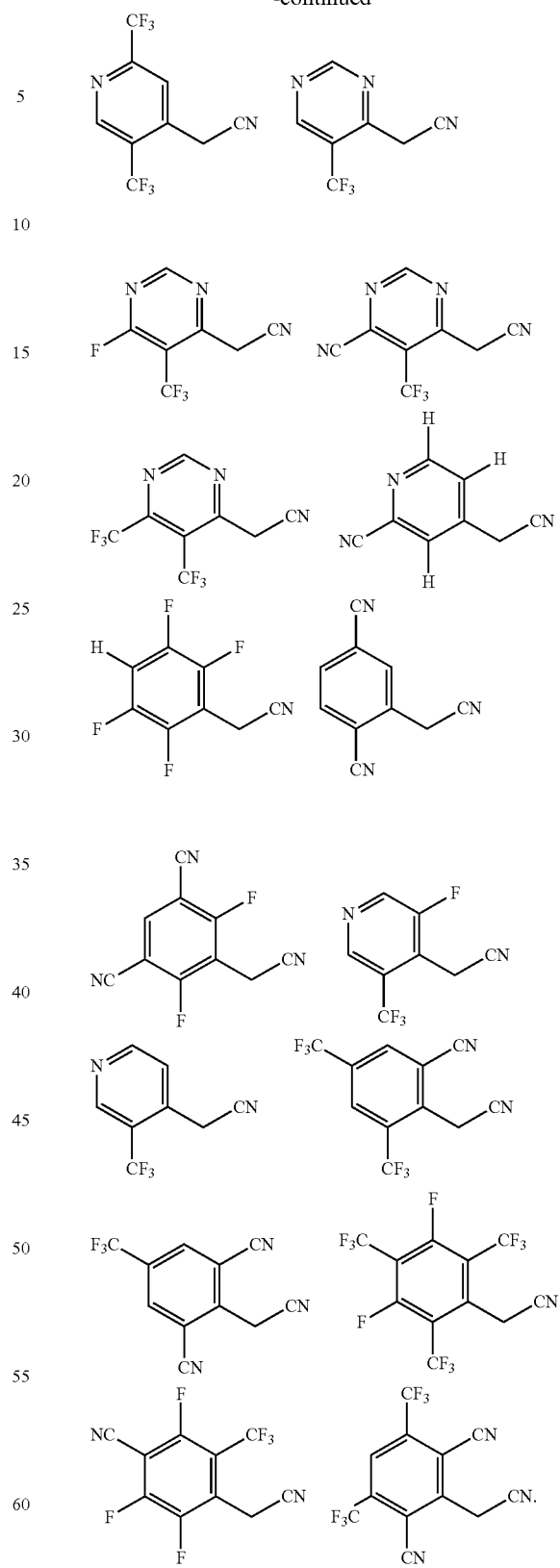
According to one embodiment of the present invention, the group of formula (III) is selected from one of the following formulae:

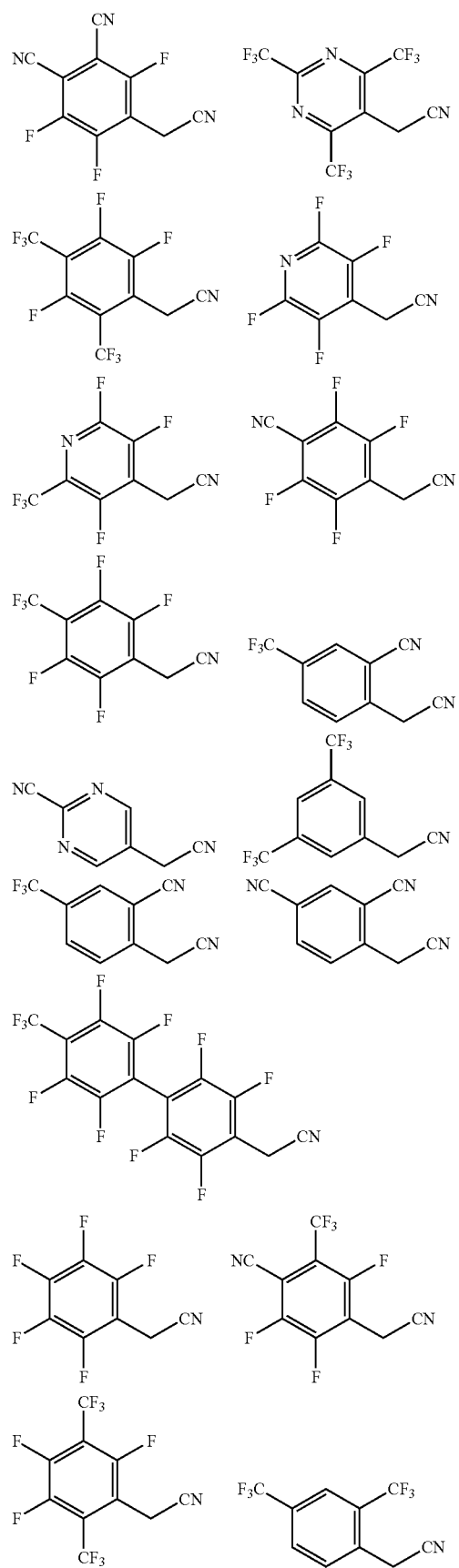
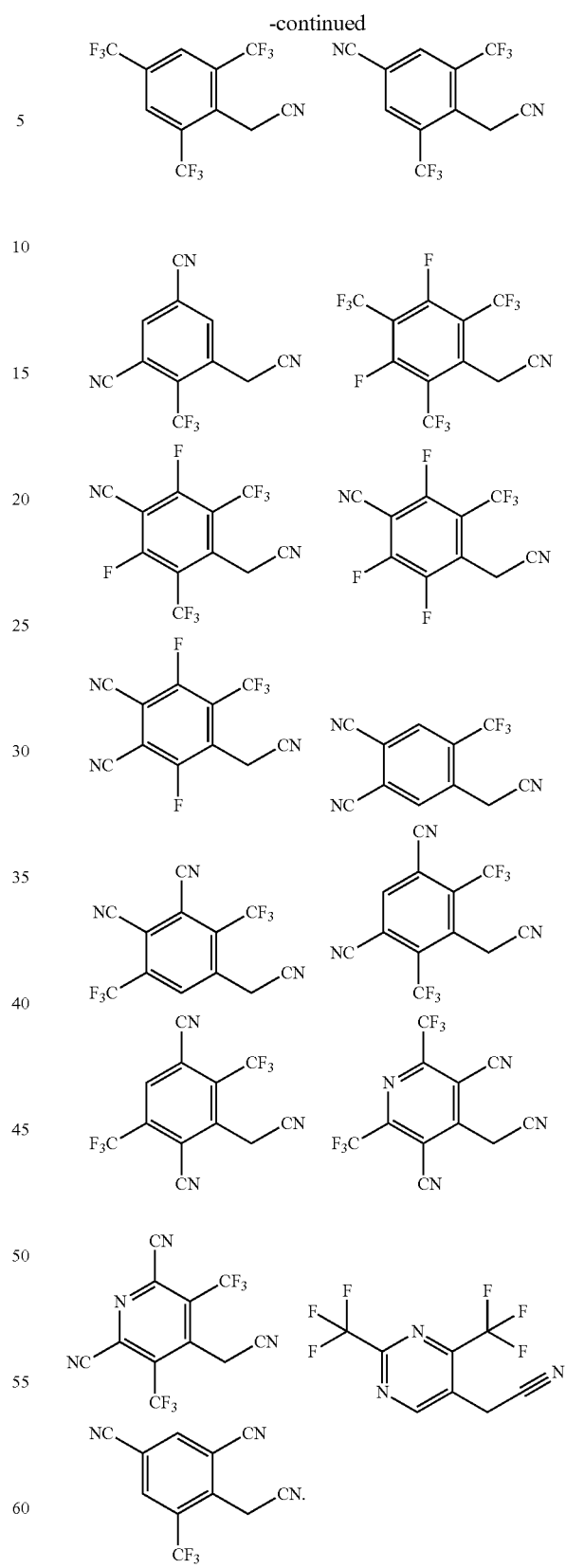
According to one embodiment of the present invention, the group of formula (III) is selected from one of the following formulae:

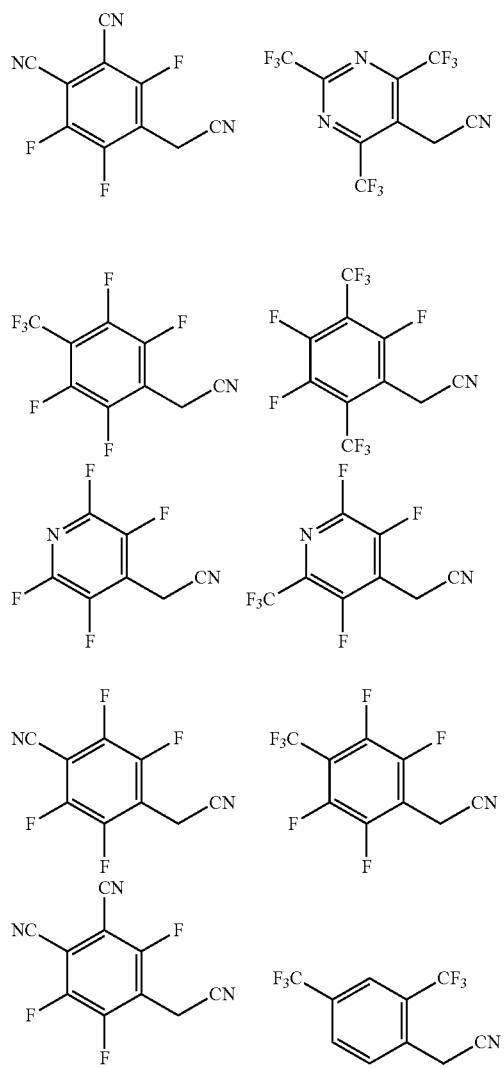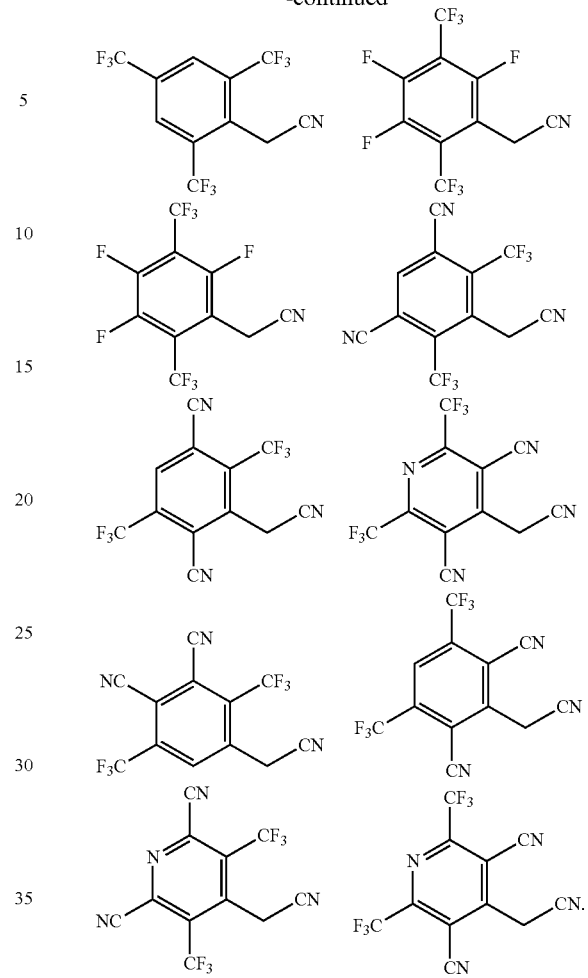
According to one embodiment of the present invention, the compound of formula (I) is selected from the compounds A1 to A80, wherein $A^1$, $A^2$ and $A^3$ of the compound of formula (I) are selected according to the following formulae:
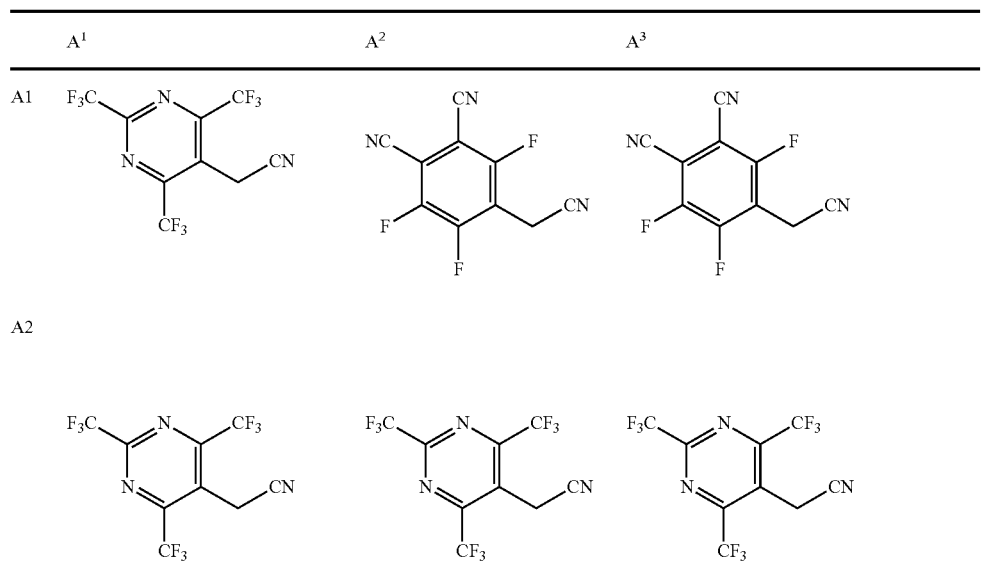

| | A[1] | A[2] | A[3] |
|---|---|---|---|
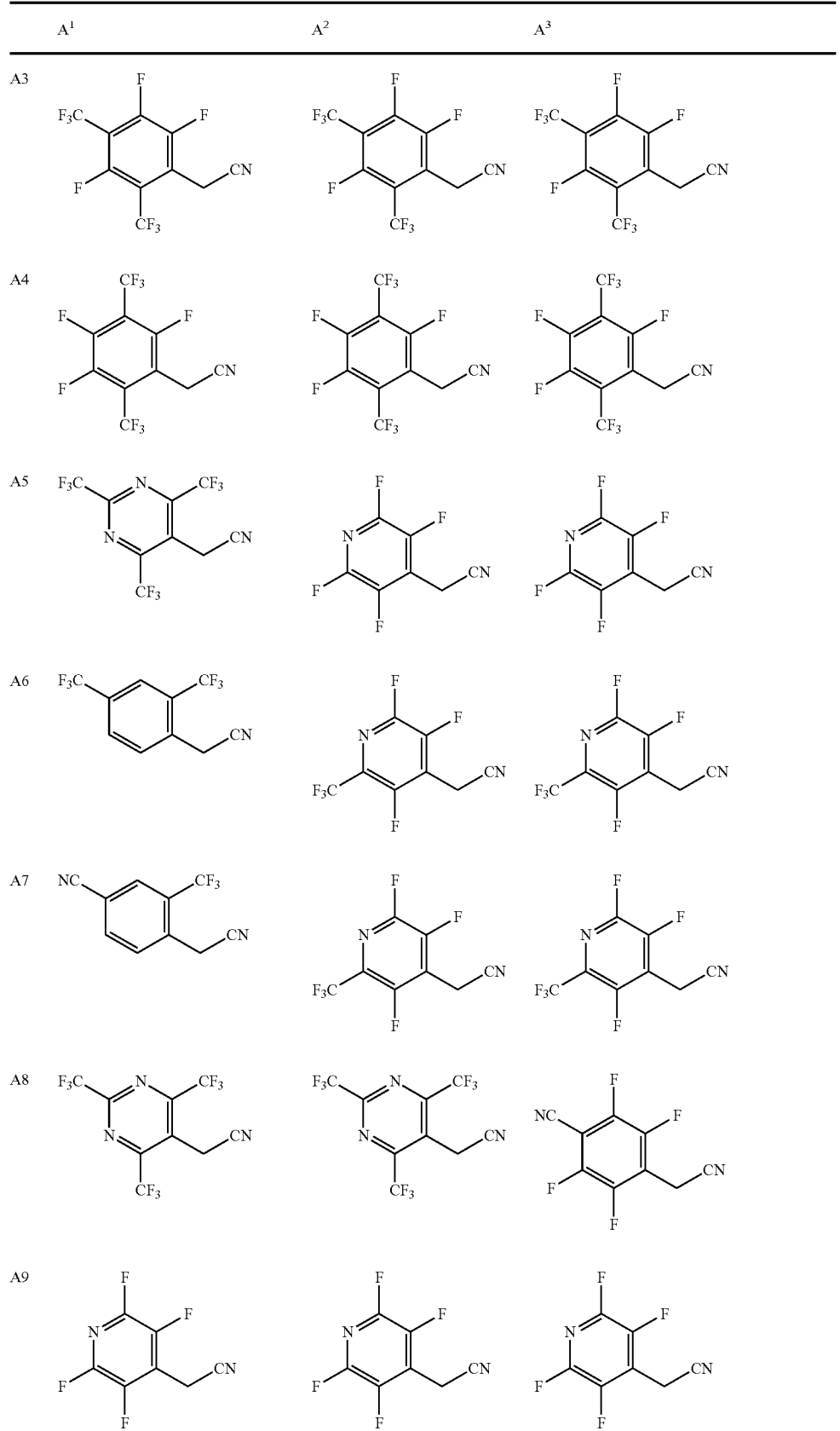

-continued

| | A¹ | A² | A³ |
|---|---|---|---|
| A10 | | | |
| A11 | | | |
| A12 | | | |
| A13 | | | |
| A14 | | | |
| A15 | | | |
| A16 | | | |
| A17 | | | |

-continued

| | A¹ | A² | A³ |
|---|---|---|---|
| A18 | | | |
| A19 | | | |
| A20 | | | |
| A21 | | | |
| A22 | | | |
| A23 | | | |
| A24 | | | |

-continued

| | A¹ | A² | A³ |
|---|---|---|---|
| A25 | 2,4,6-tris(CF₃)phenyl-CH₂CN | 2,3-dicyano-5,6-difluoro-4-(CH₂CN)benzene | 2-cyano-3,5,6-trifluoro-4-(CH₂CN)benzene |
| A26 | 3,5-bis(CF₃)-4-(CH₂CN)benzonitrile | 2,3-dicyano-5,6-difluoro-4-(CH₂CN)benzene | 2-cyano-3,5,6-trifluoro-4-(CH₂CN)benzene |
| A27 | tetrafluoropyridin-4-yl-CH₂CN | tetrafluoropyridin-4-yl-CH₂CN | 2,3-dicyano-5,6-difluoro-4-(CH₂CN)benzene |
| A28 | 2-CF₃-3,5,6-trifluoropyridin-4-yl-CH₂CN | 2-CF₃-3,5,6-trifluoropyridin-4-yl-CH₂CN | 2-CF₃-3,5,6-trifluoro-4-(CH₂CN)benzene |
| A29 | tetrafluoropyridin-4-yl-CH₂CN | 2-CF₃-3,5,6-trifluoro-4-(CH₂CN)benzene | 2-CF₃-3,5,6-trifluoro-4-(CH₂CN)benzene |
| A30 | 3,5-bis(CF₃)pyridin-4-yl-CH₂CN | 2-cyano-3,5,6-trifluoro-4-(CH₂CN)benzene | 2-cyano-3,5,6-trifluoro-4-(CH₂CN)benzene |
| A31 | 4-CF₃-2,6-dicyano-3-(CH₂CN)benzene | 4-CF₃-2,6-dicyano-3-(CH₂CN)benzene | 4-CF₃-2,6-dicyano-3-(CH₂CN)benzene |
| A32 | 2,4,6-tris(CF₃)pyrimidin-5-yl-CH₂CN | 2-cyano-3,5,6-trifluoro-4-(CH₂CN)benzene | 2-cyano-3,5,6-trifluoro-4-(CH₂CN)benzene |

-continued

| | A¹ | A² | A³ |
|---|---|---|---|
| A33 | | | |
| A34 | | | |
| A35 | | | |
| A36 | | | |
| A37 | | | |
| A38 | | | |
| A39 | | | |

-continued
| | A¹ | A² | A³ |
|---|---|---|---|
| A40 | 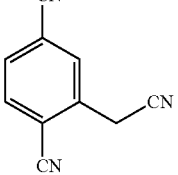 | 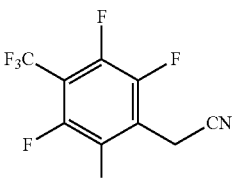 | 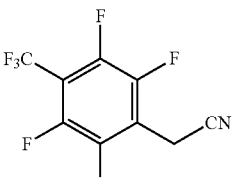 |
| A41 | 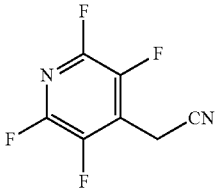 | 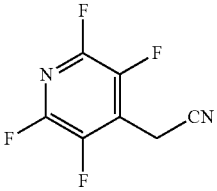 | 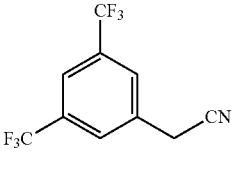 |
| A42 | 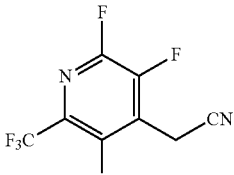 | 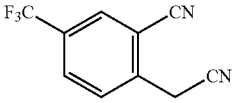 | 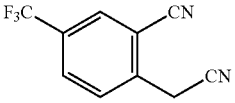 |
| A43 | 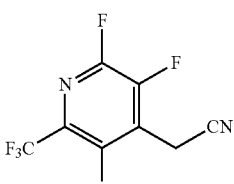 | 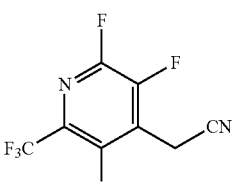 | 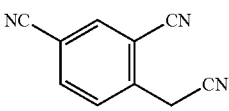 |
| A44 | 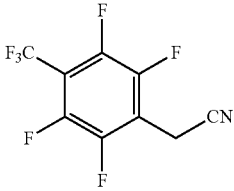 | 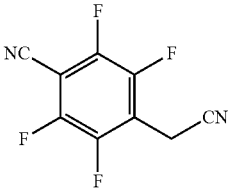 | 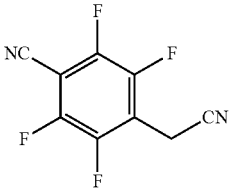 |
| A45 | 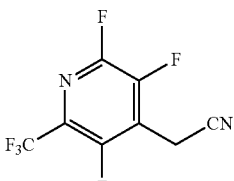 | 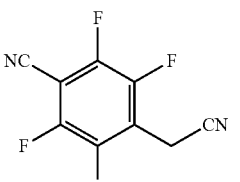 | 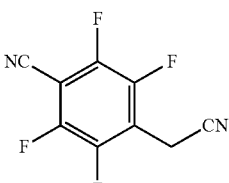 |
| A46 | 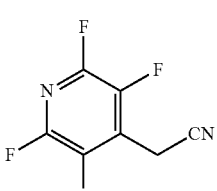 | 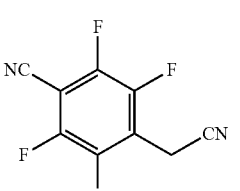 | 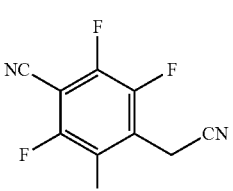 |

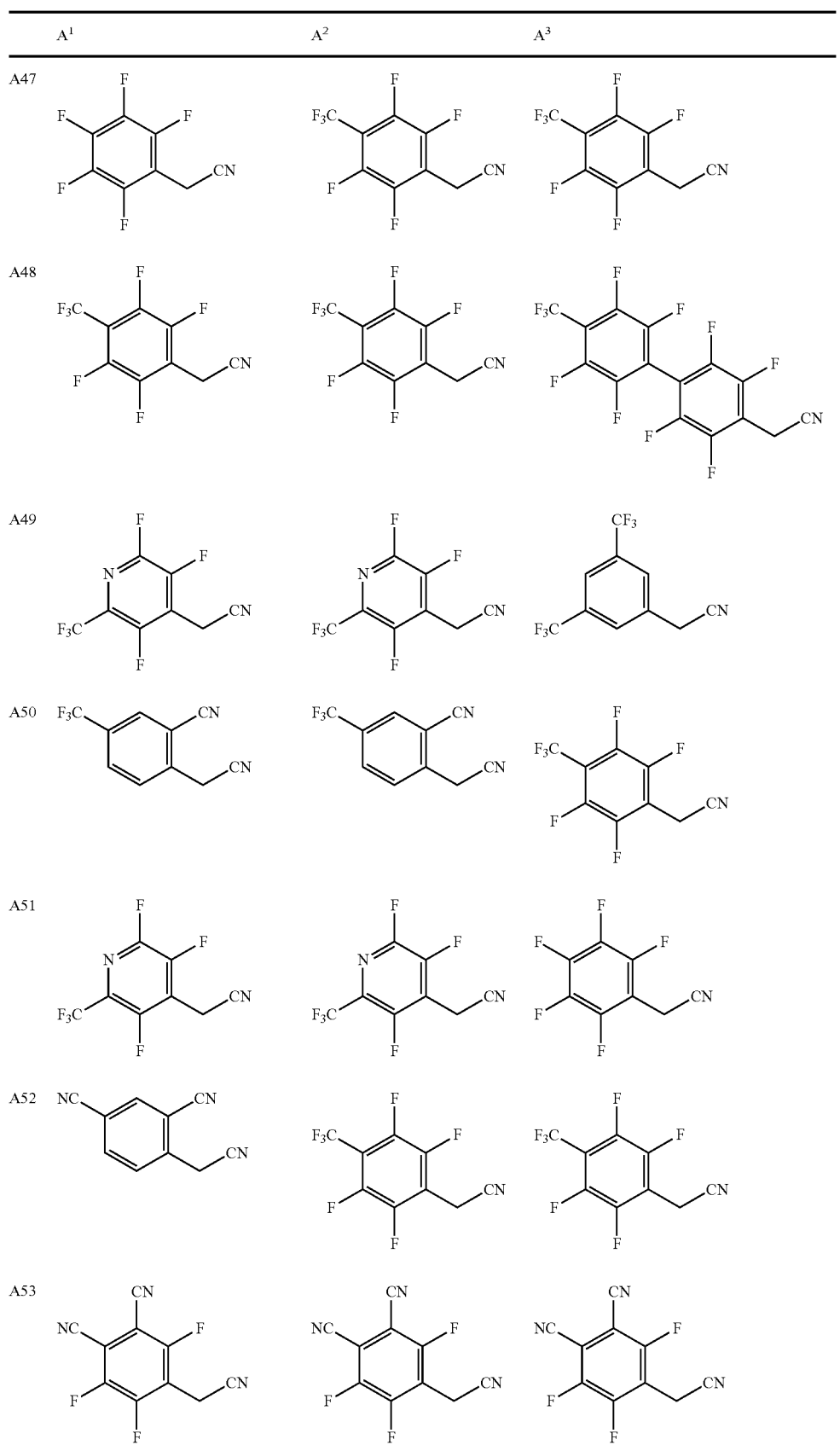

-continued
| | $A^1$ | $A^2$ | $A^3$ |
|---|---|---|---|
| A54 | 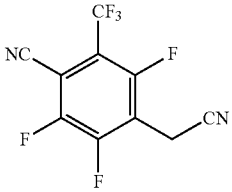 | 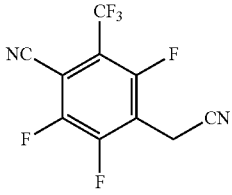 | 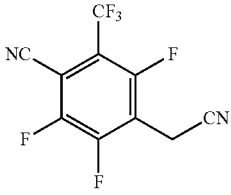 |
| A55 | 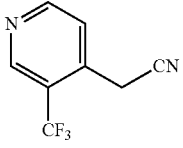 | 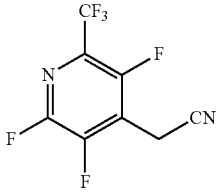 | 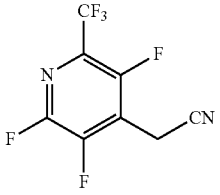 |
| A56 | 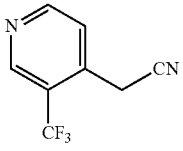 | 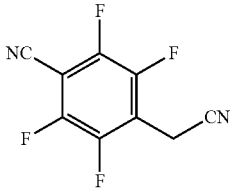 | 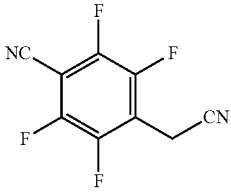 |
| A57 | 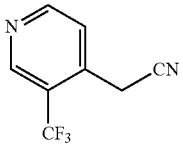 | 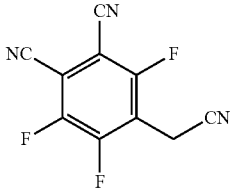 | 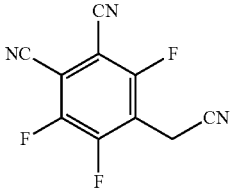 |
| A58 | 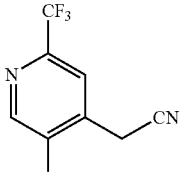 | 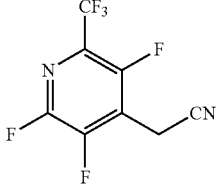 | 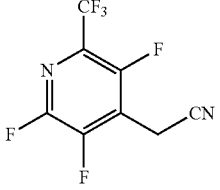 |
| A59 | 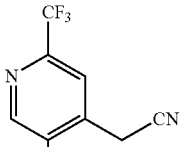 | 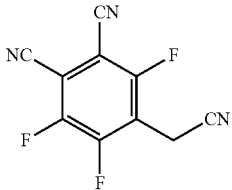 | 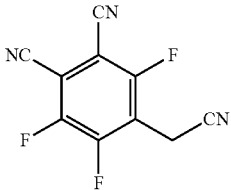 |
| A60 | 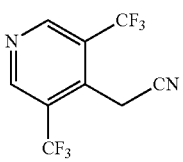 | 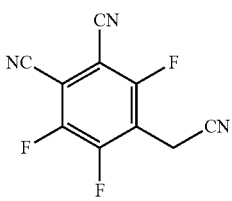 | 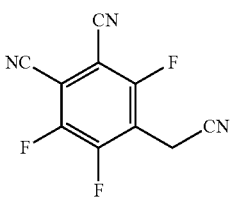 |

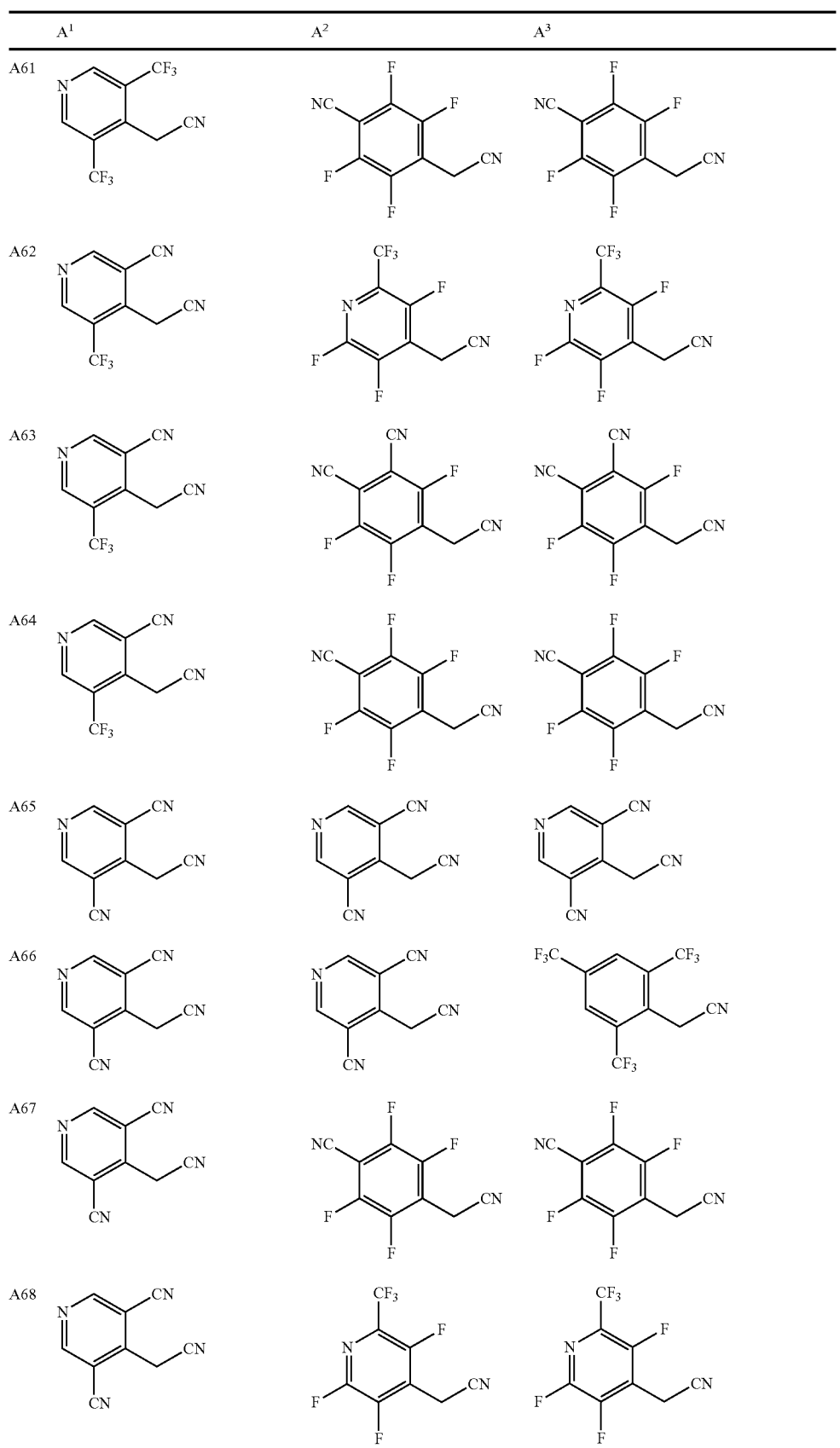

-continued
| | $A^1$ | $A^2$ | $A^3$ |
|---|---|---|---|
| A69 | 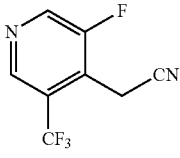 | 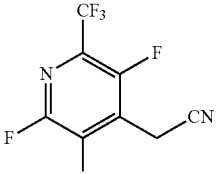 | 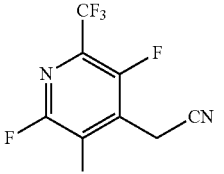 |
| A70 | 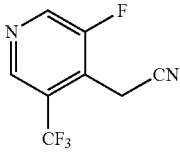 | 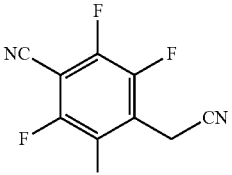 | 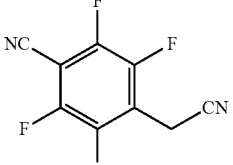 |
| A71 | 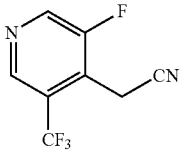 | 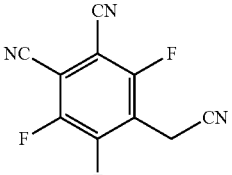 | 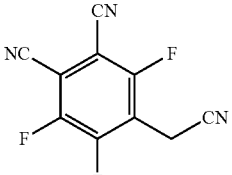 |
| A72 | 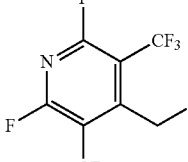 | 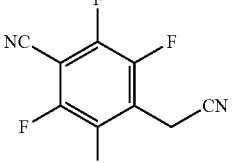 | 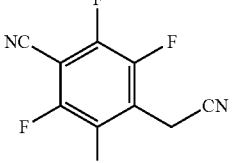 |
| A73 | 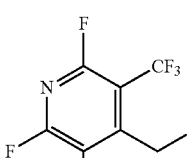 | 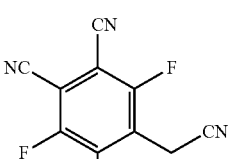 | 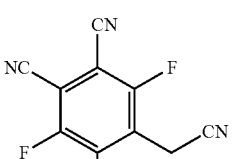 |
| A74 | 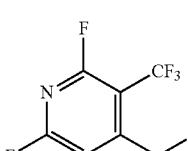 |  | 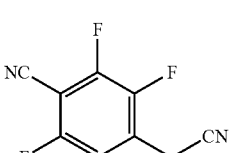 |
| A75 | 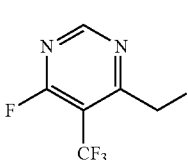 | 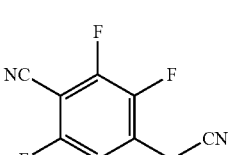 | 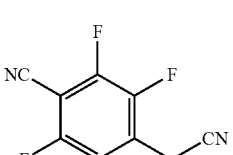 |

-continued
| | A¹ | A² | A³ |
|---|---|---|---|
| A76 | 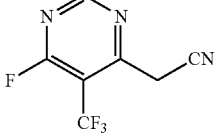 |  | 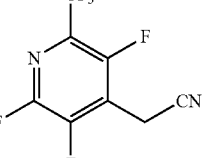 |
| A77 | 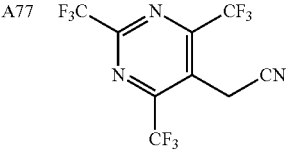 | 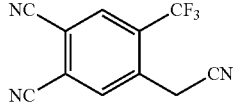 | 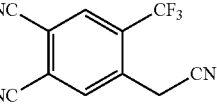 |
| A78 | 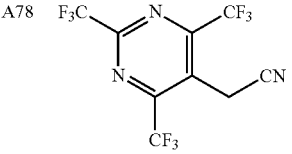 | 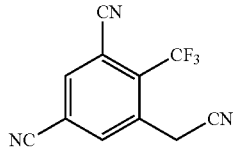 | 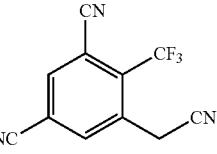 |
| A79 | 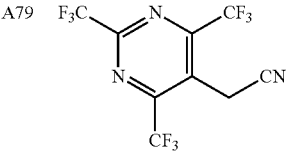 | 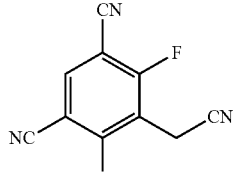 | 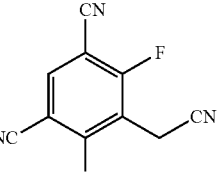 |
| A80 | 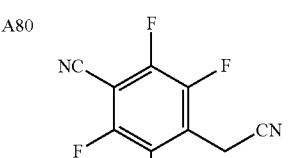 | 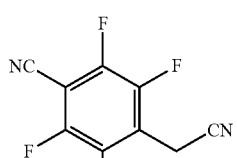 | 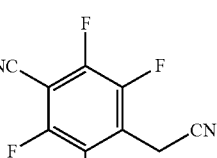 |
According to one embodiment of the present invention, the compound of formula (I) is selected from the compounds A1 to A29, A57, A59, A60, A61, A64, A70 to A72, A77, A78, and A80, wherein A¹, A² and A³ of the compound of formula (I) are selected according to the following formulae:
| | A¹ | A² | A³ |
|---|---|---|---|
| A1 | 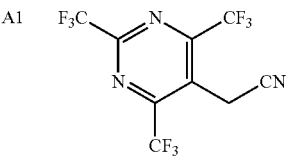 | 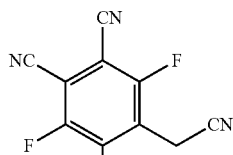 | 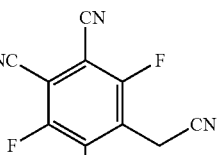 |
| A2 | 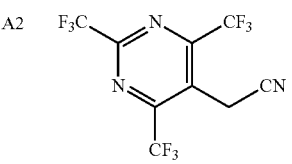 | 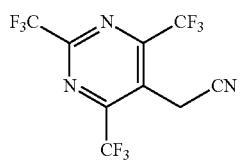 | 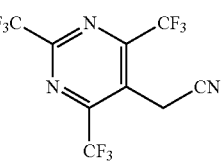 |

-continued
| | A¹ | A² | A³ |
|---|---|---|---|
| A3 | | | |
| A4 | | | |
| A5 | | | |
| A6 | | | |
| A7 | | | |
| A8 | | | |
| A9 | | | |
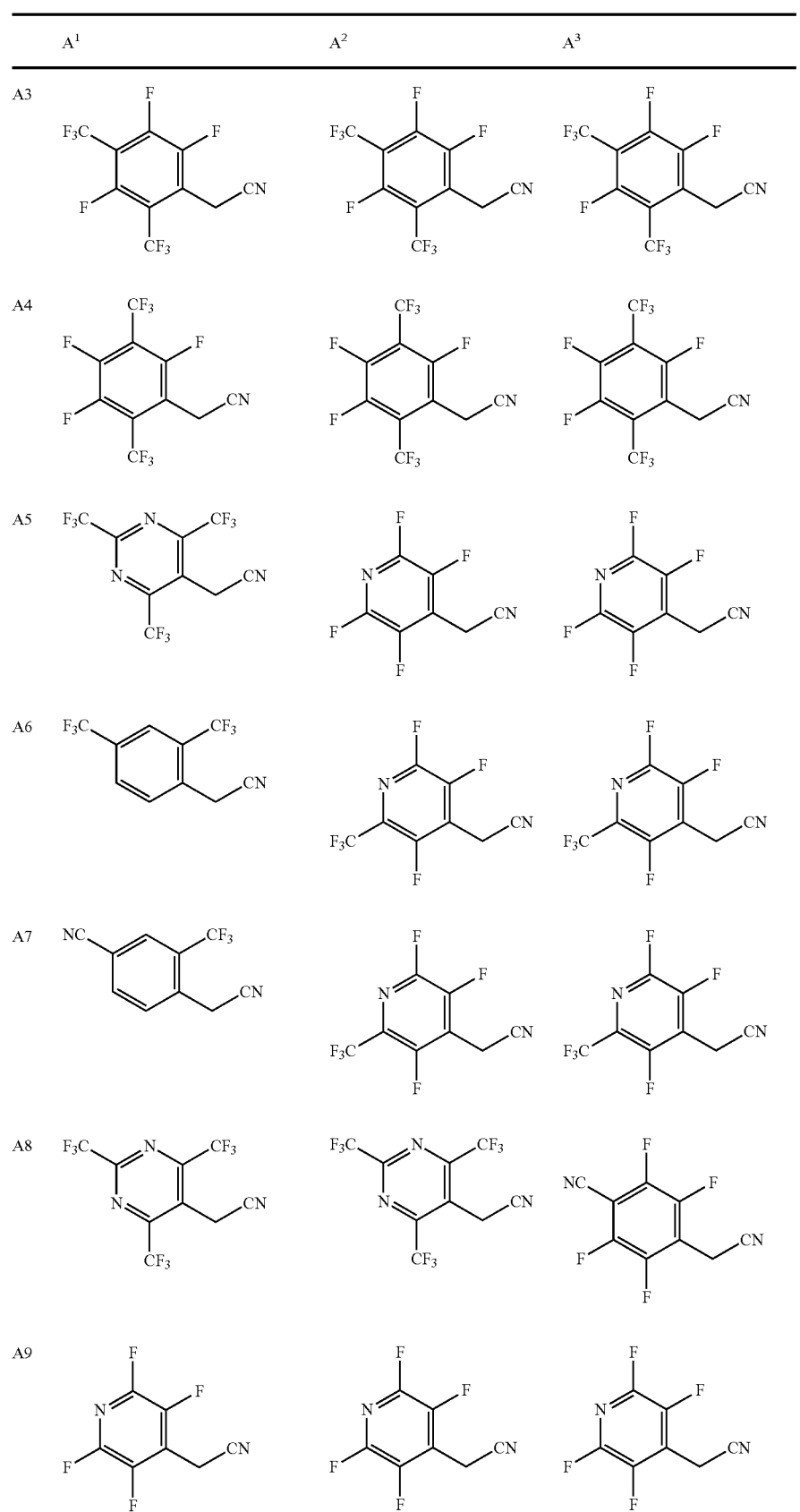

-continued

| | A¹ | A² | A³ |
|---|---|---|---|
| A10 | | | |
| A11 | | | |
| A12 | | | |
| A13 | | | |
| A14 | | | |
| A15 | | | |
| A16 | | | |
| A17 | | | |

-continued
| $A^1$ | $A^2$ | $A^3$ |
| --- | --- | --- |
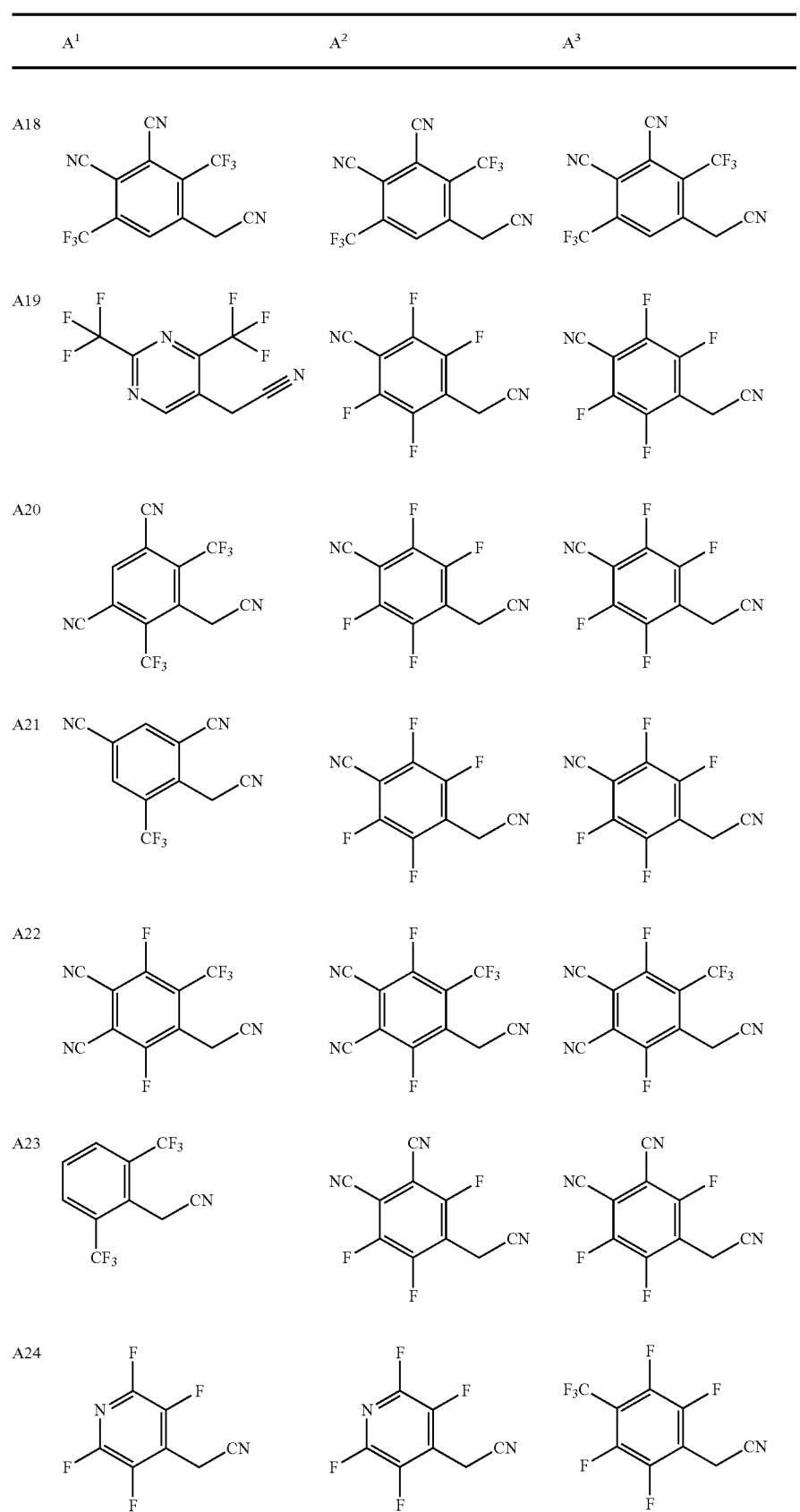

-continued
| | A¹ | A² | A³ |
|---|---|---|---|
| A25 | 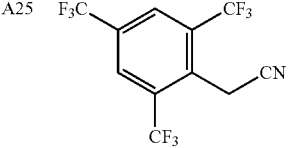 | 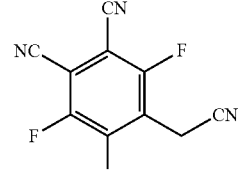 | 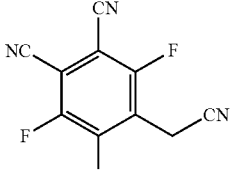 |
| A26 | 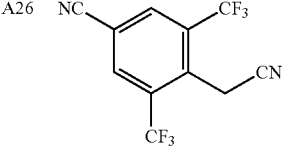 | 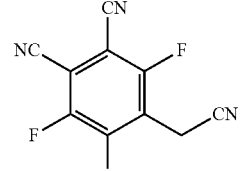 | 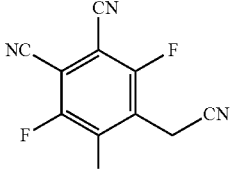 |
| A27 | 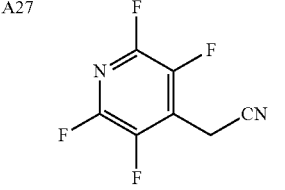 | 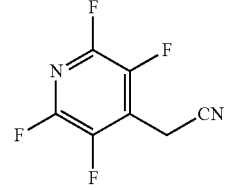 | 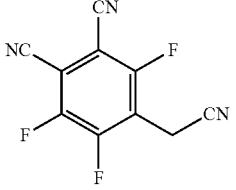 |
| A28 | 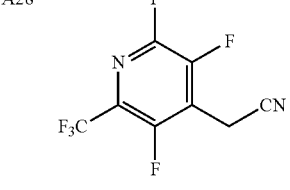 | 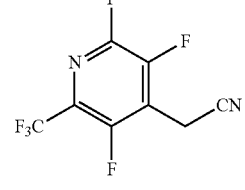 | 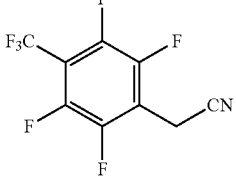 |
| A29 | 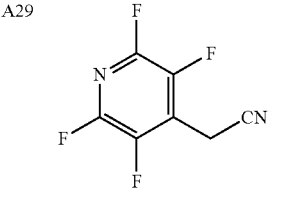 | 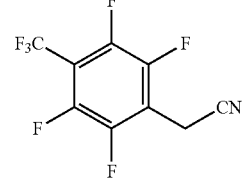 | 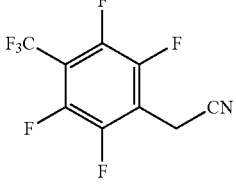 |
| A57 | 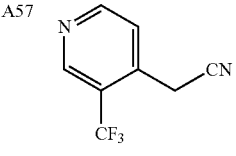 | 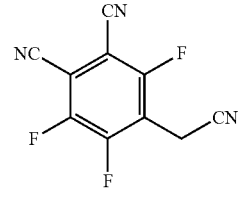 | 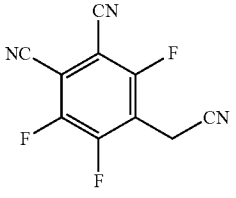 |
| A59 | 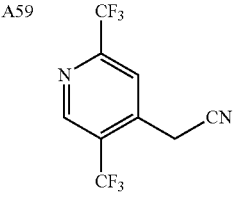 | 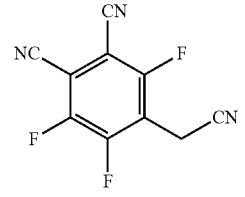 | 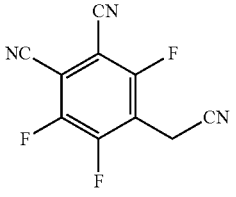 |

-continued
| A¹ | A² | A³ |
|---|---|---|
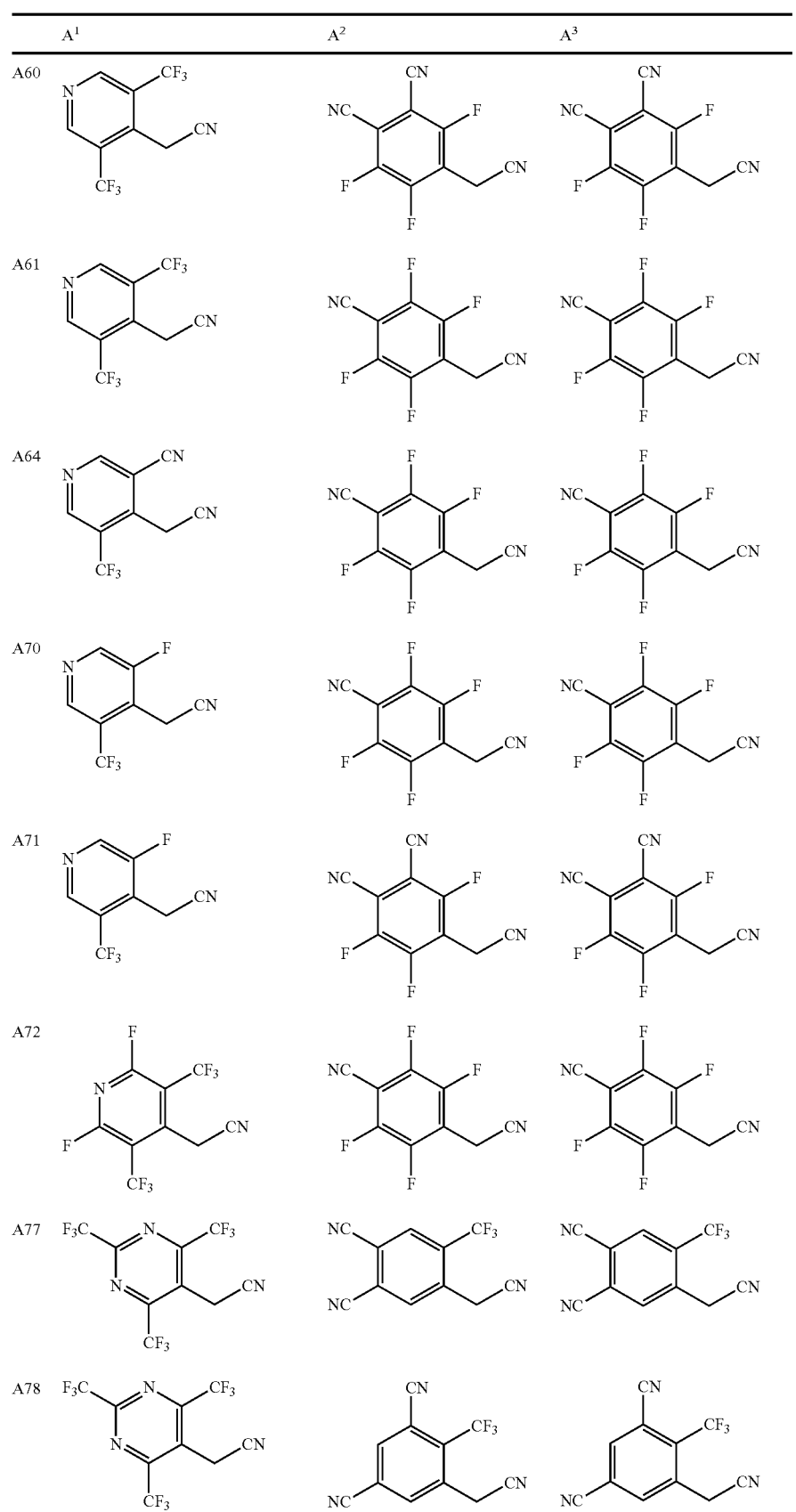

| A¹ | A² | A³ |
|---|---|---|
| A80 | 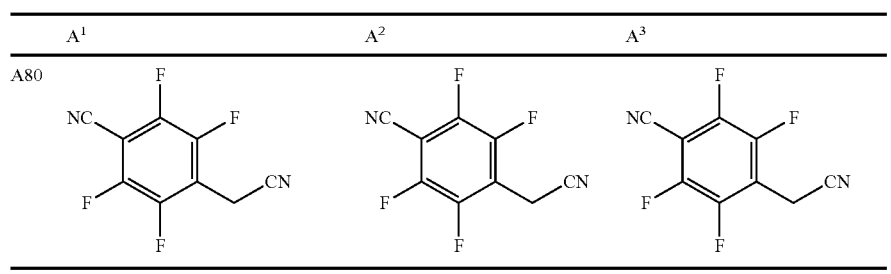 | | |
According to one embodiment of the present invention, the compound of formula (I) is selected from the compounds A1 to A18, A57, A59, A60, A61, A64, A77, A78, and A80, wherein A¹, A² and A³ of the compound of formula (I) are selected according to the following formulae:
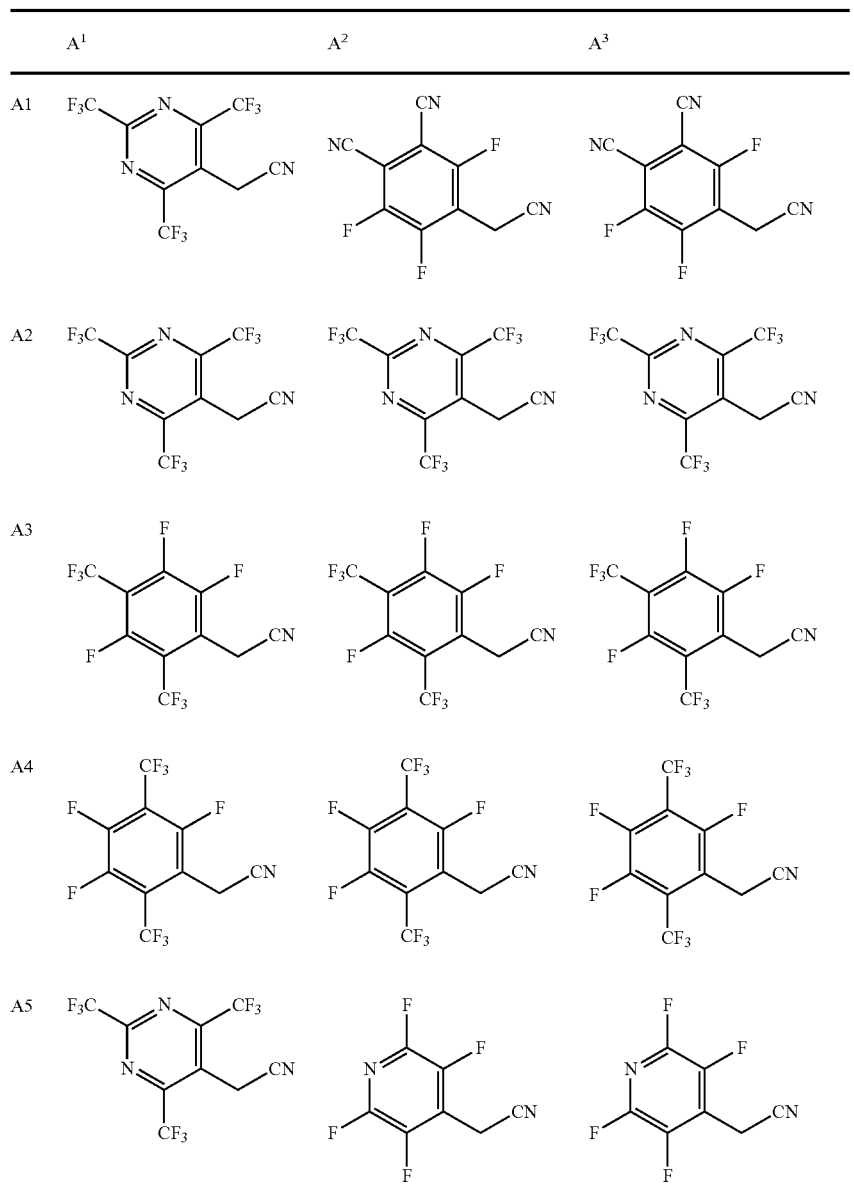

|     | A¹ | A² | A³ |
| --- | --- | --- | --- |
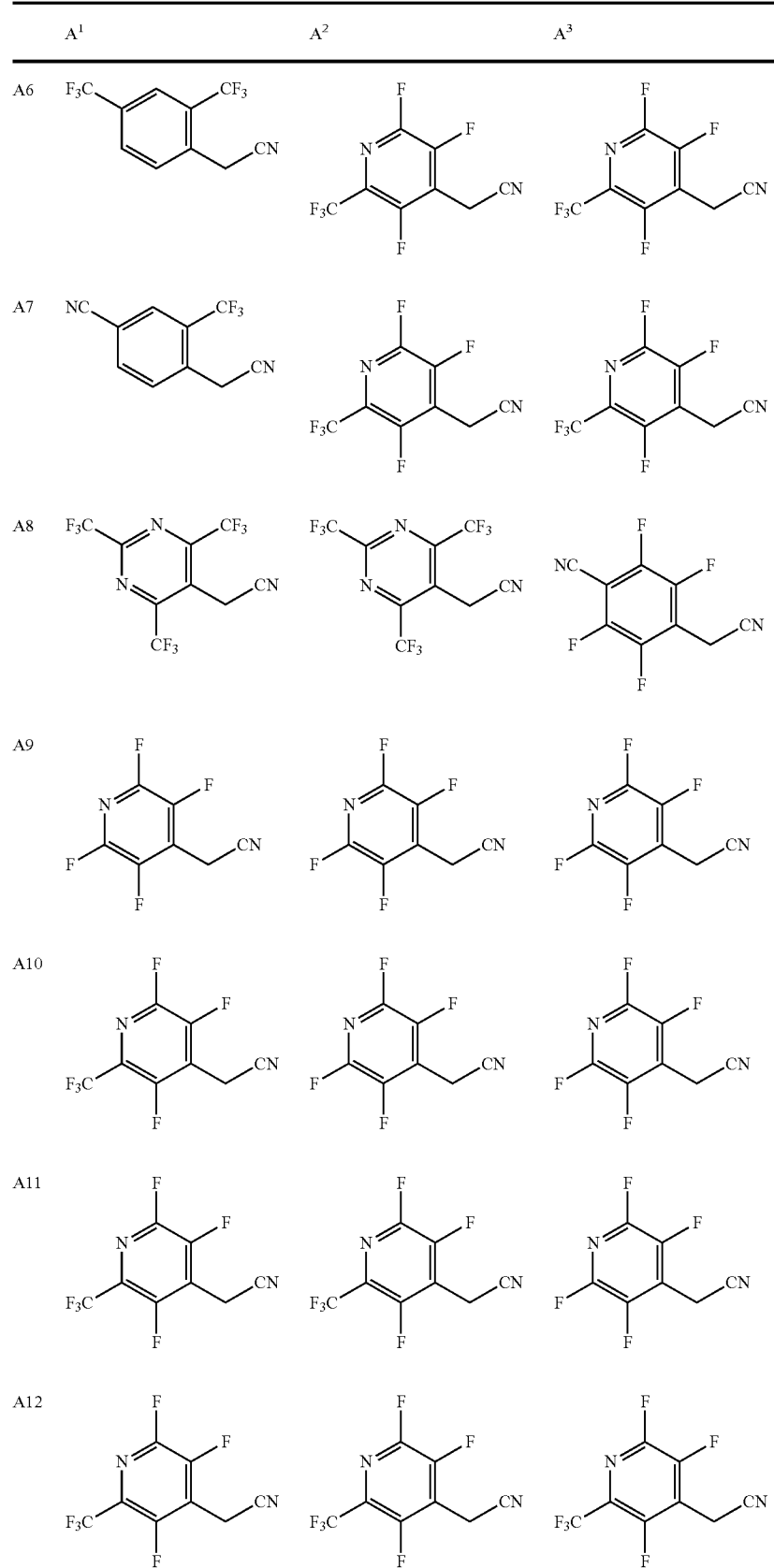

| | A¹ | A² | A³ |
|---|---|---|---|
| A13 | 2-CN, 3-F, 5-F, 6-F pyridine-4-CH₂CN | 2-CF₃, 3-F, 5-F, 6-F pyridine-4-CH₂CN | 2-CF₃, 3-F, 5-F, 6-F pyridine-4-CH₂CN |
| A14 | 4-CN, 2-CF₃-phenyl-CH₂CN | pentafluoro(CF₃)phenyl-CH₂CN | pentafluoro(CF₃)phenyl-CH₂CN |
| A15 | di-CN, di-CF₃ phenyl-CH₂CN | di-CN, di-CF₃ phenyl-CH₂CN | di-CN, di-CF₃ phenyl-CH₂CN |
| A16 | di-CN, CF₃ phenyl-CH₂CN | di-CN, CF₃ phenyl-CH₂CN | di-CN, CF₃ phenyl-CH₂CN |
| A17 | di-CN, CF₃ phenyl-CH₂CN | di-CN, CF₃ phenyl-CH₂CN | di-CN, CF₃ phenyl-CH₂CN |
| A18 | di-CN, di-CF₃ phenyl-CH₂CN | di-CN, di-CF₃ phenyl-CH₂CN | di-CN, di-CF₃ phenyl-CH₂CN |
| A57 | 3-CF₃ pyridine-4-CH₂CN | di-CN, tri-F phenyl-CH₂CN | di-CN, tri-F phenyl-CH₂CN |
| A59 | 2,5-di(CF₃) pyridine-4-CH₂CN | di-CN, tri-F phenyl-CH₂CN | di-CN, tri-F phenyl-CH₂CN |

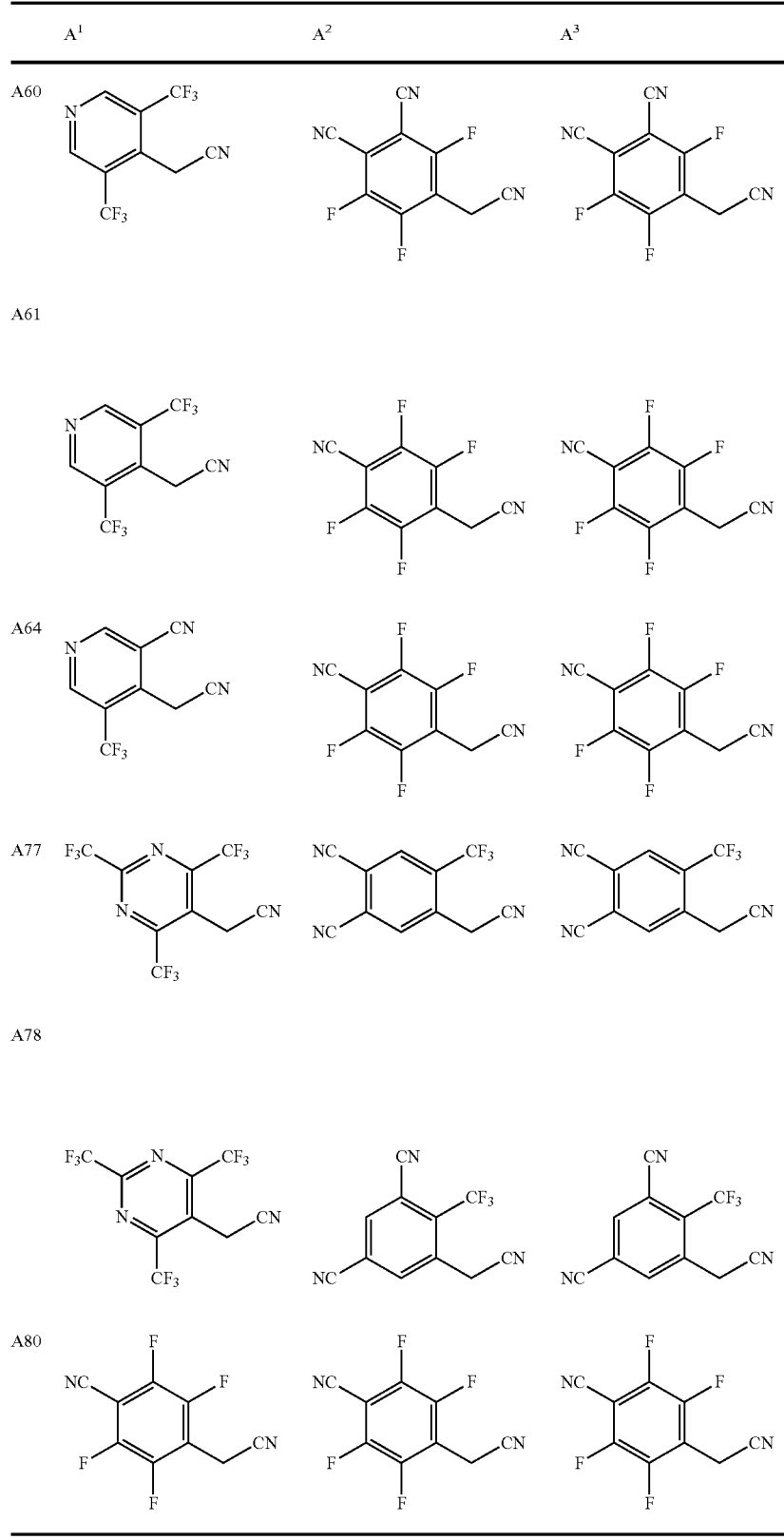

According to one embodiment of the present invention, the compound of formula (I) is selected from the compounds B1 to B80:
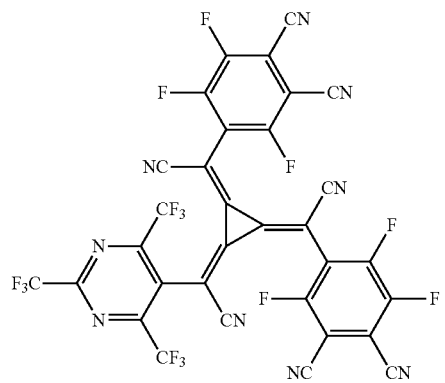
B1
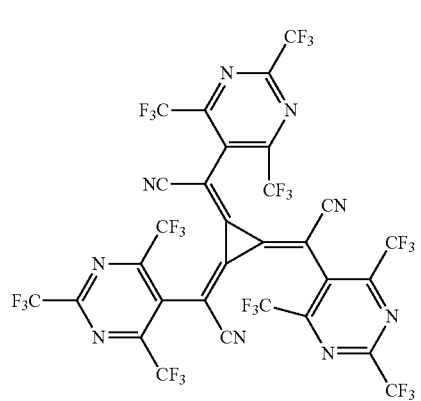
B2
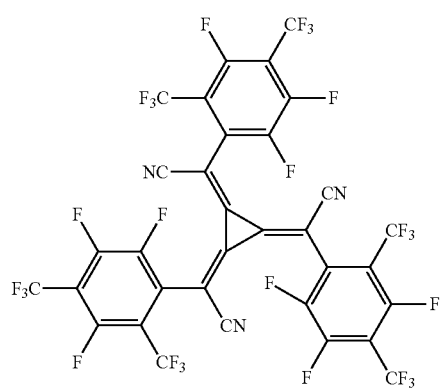
B3
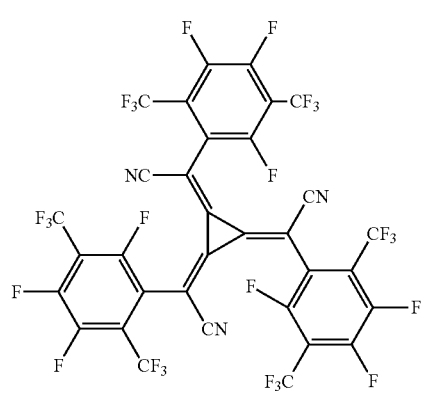
B4
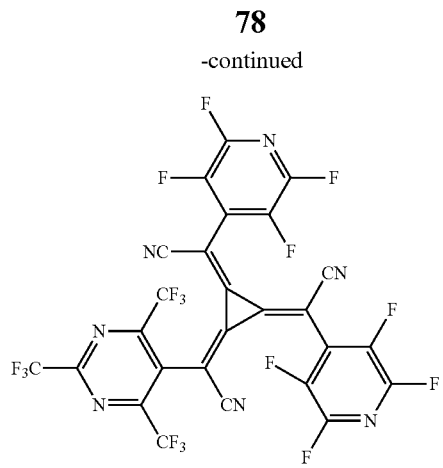
B5
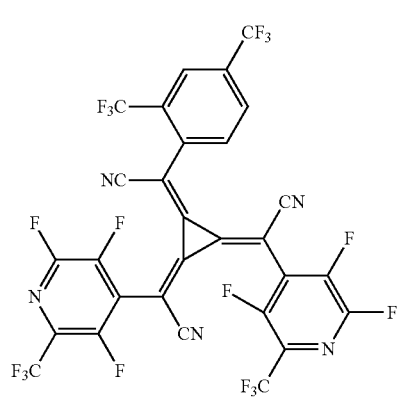
B6
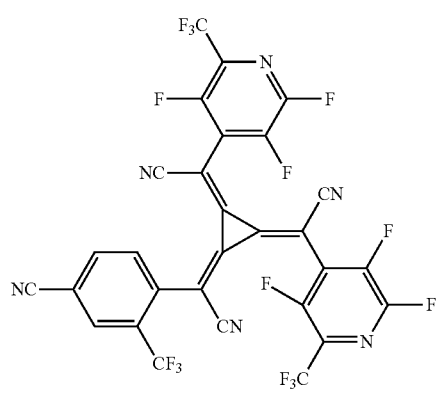
B7
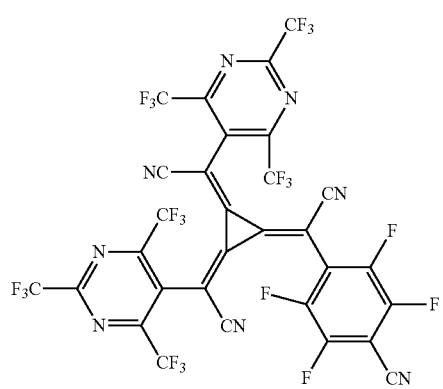
B8

-continued
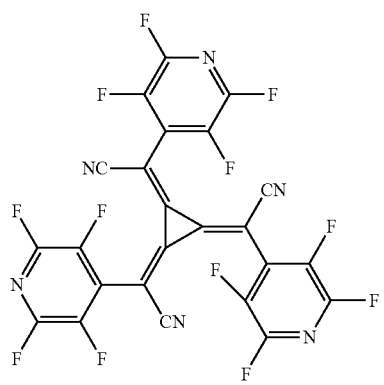
B9
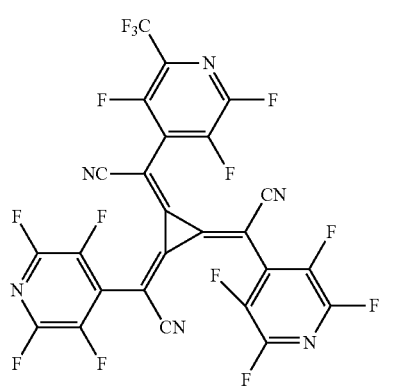
B10
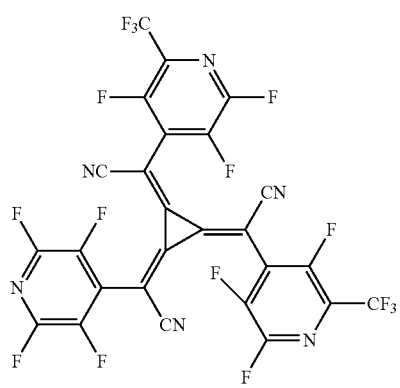
B11
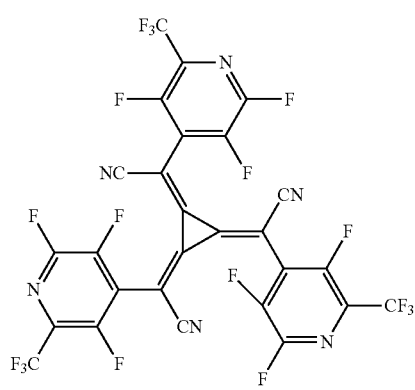
B12
-continued
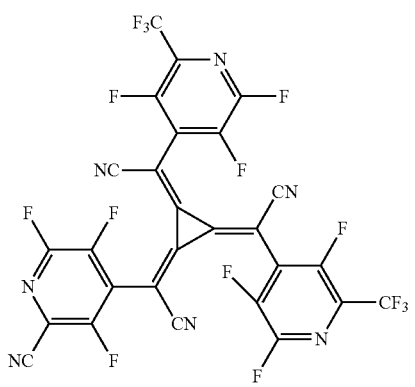
B13
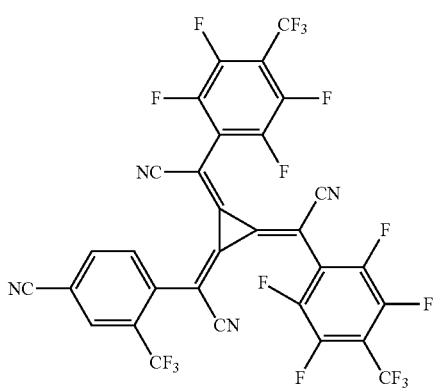
B14
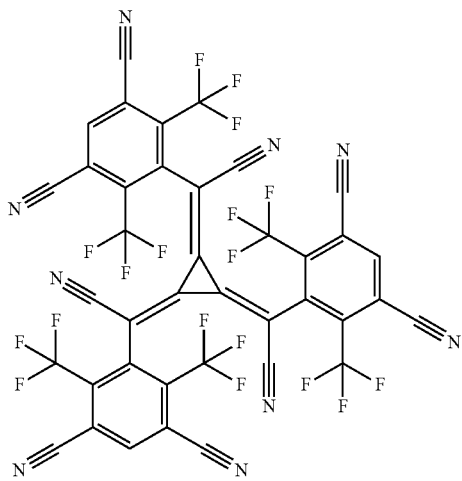
B15

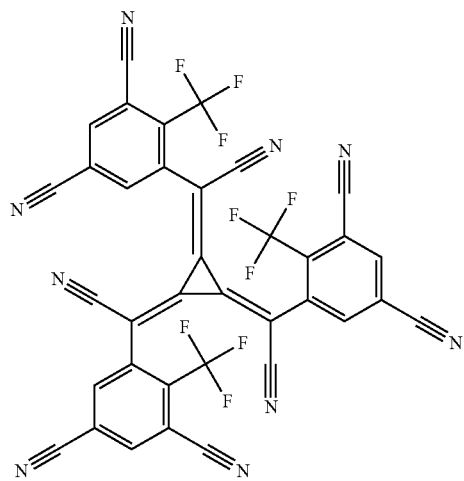
B16
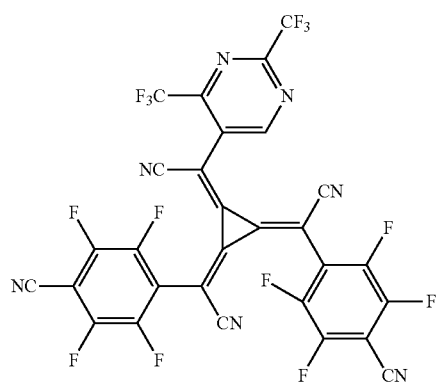
B19
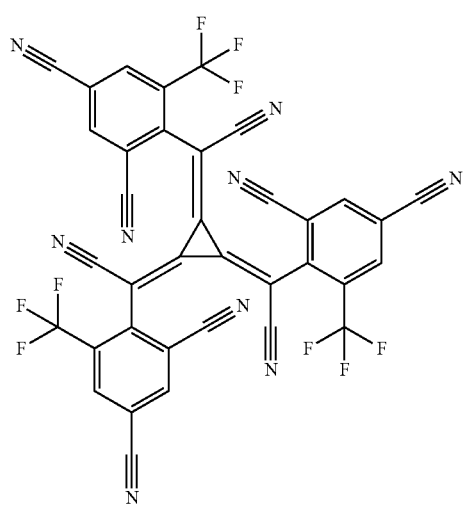
B17
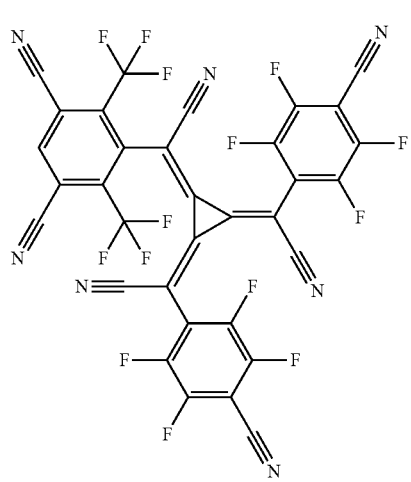
B20
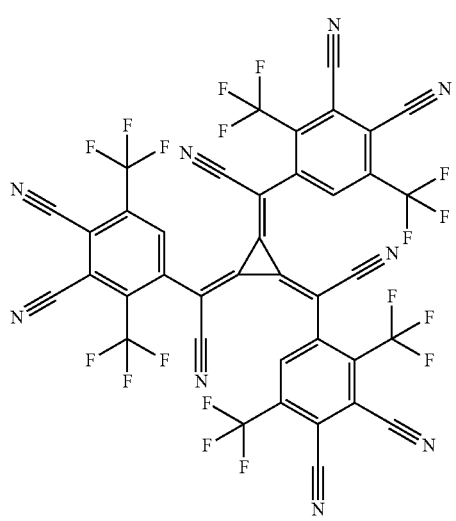
B18
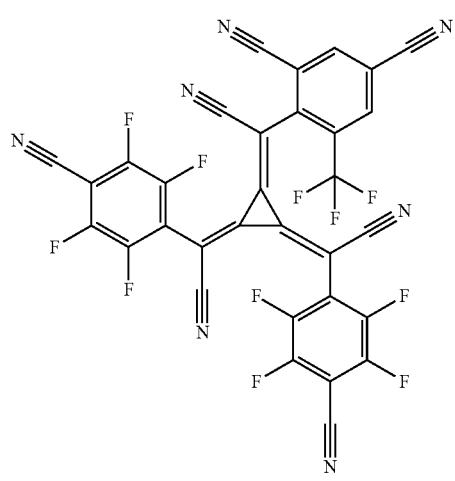
B21

B22
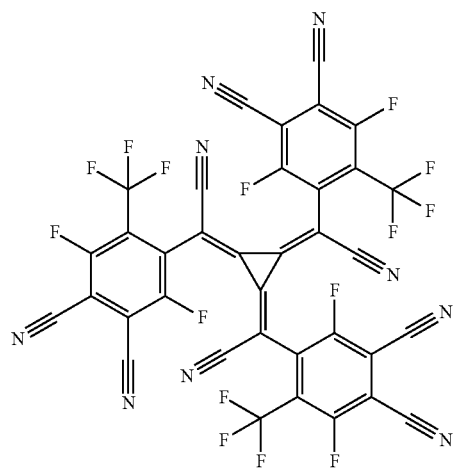
B23
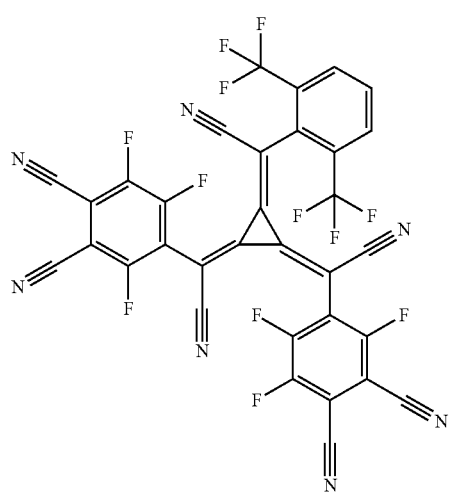
B24
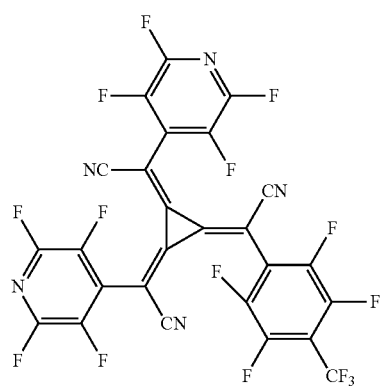
B25
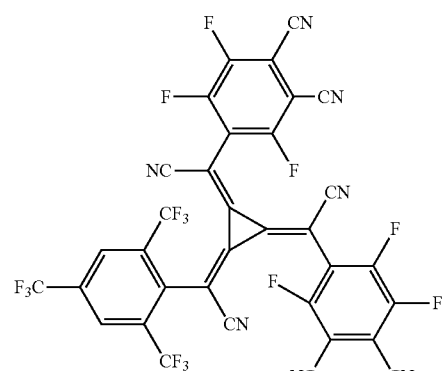
B26
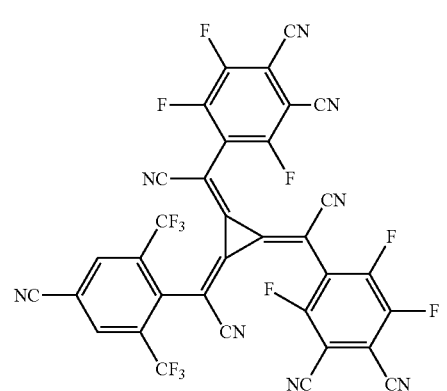
B27
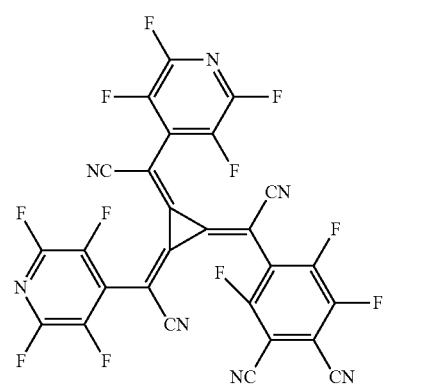
B28
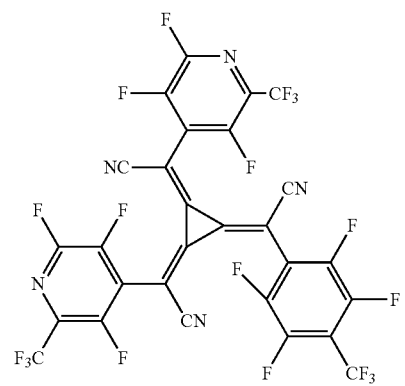

-continued
B29
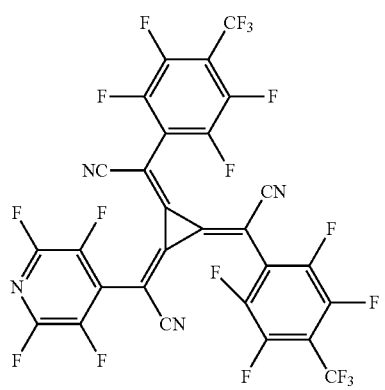
B30
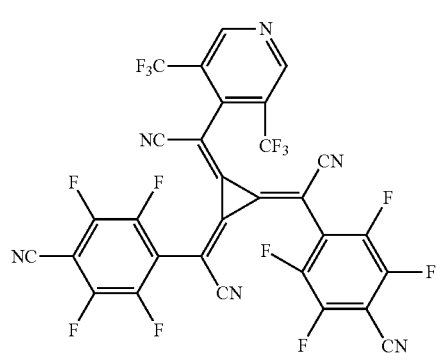
B31
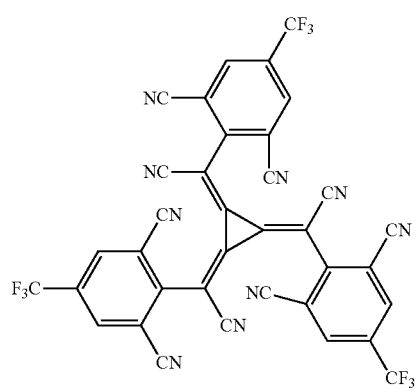
B32
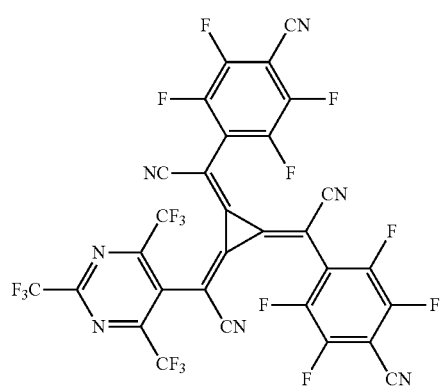
-continued
B33
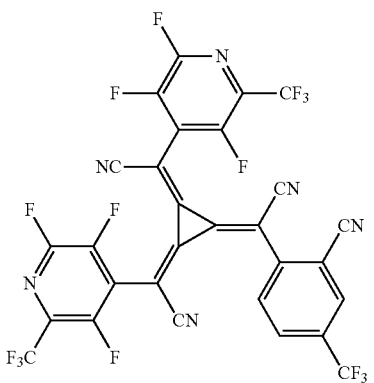
B34
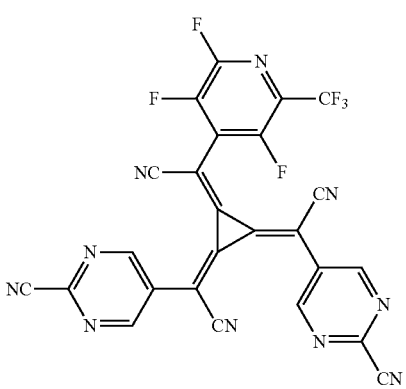
B35
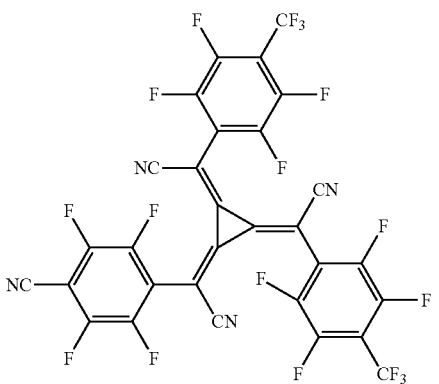
B36

-continued
B37 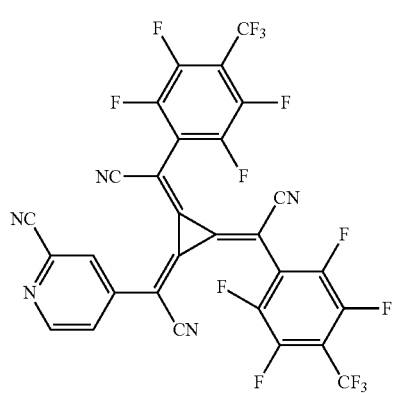
B38 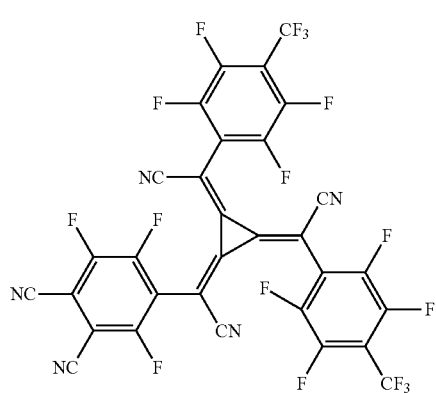
B39 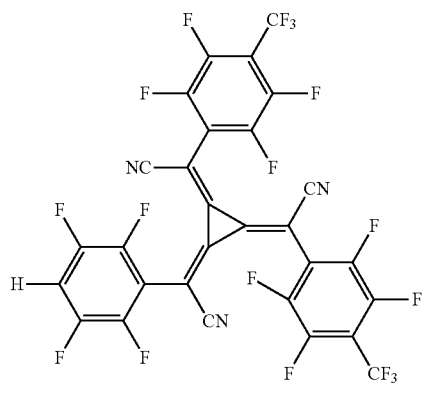
B40 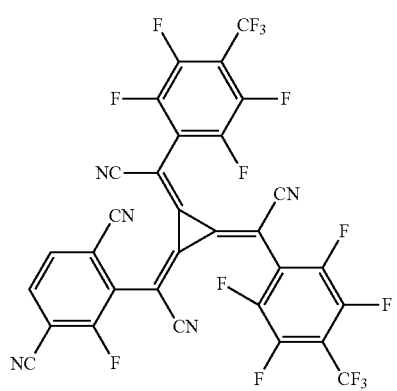
-continued
B41 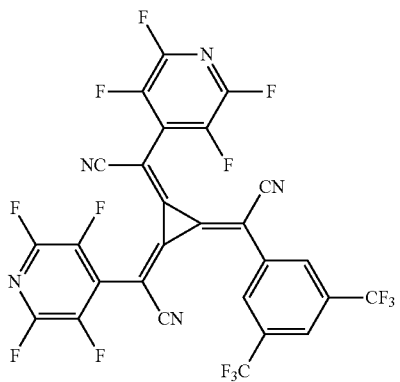
B42 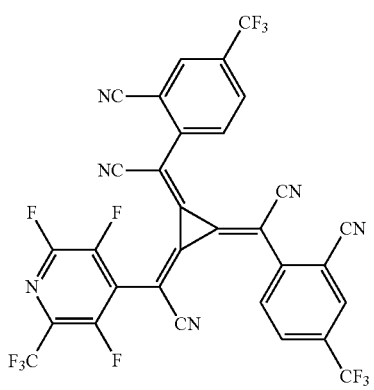
B43 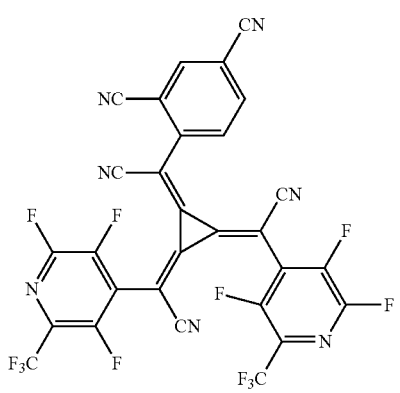
B44 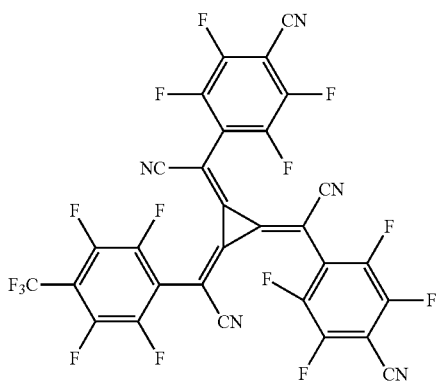

-continued
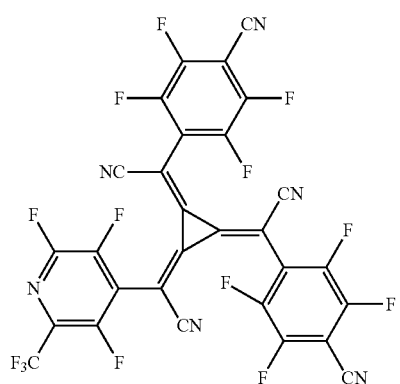
B45
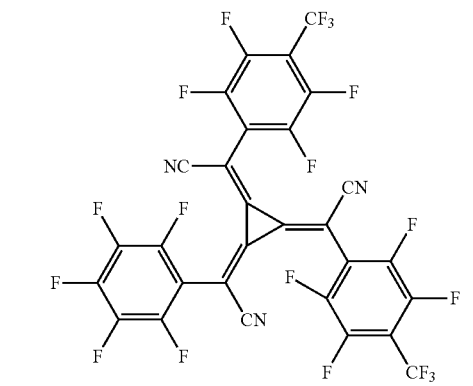
B46
B47
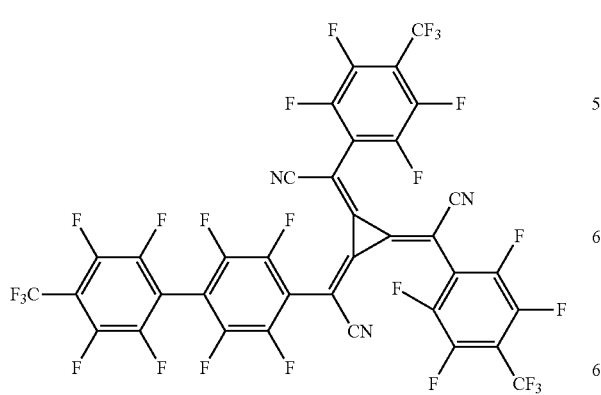
B48
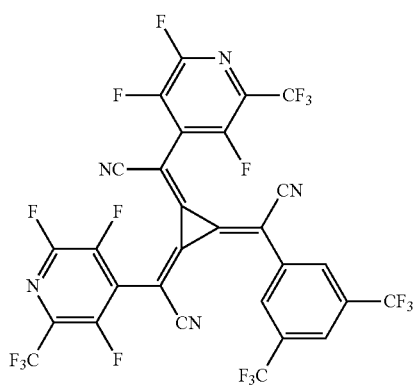
B49
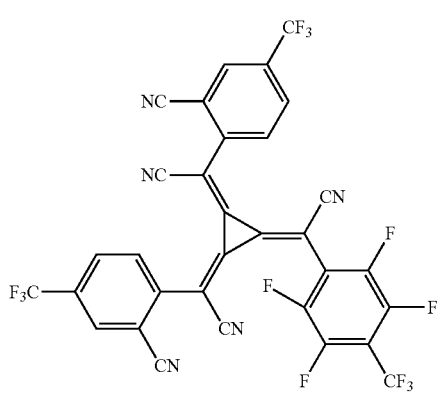
B50
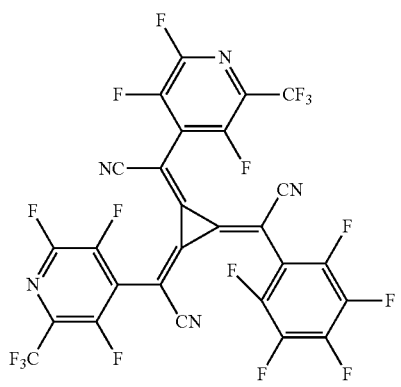
B51
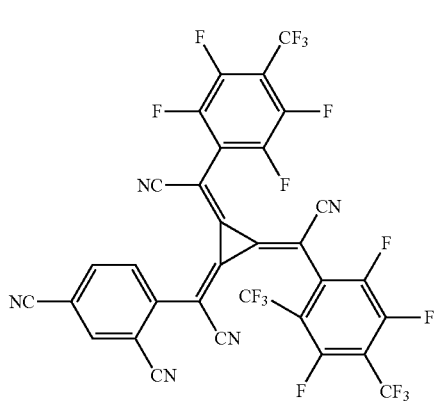
B52

B53
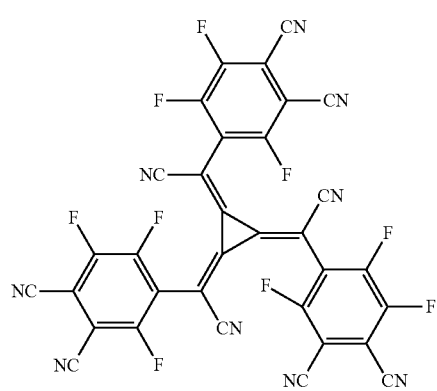
B54
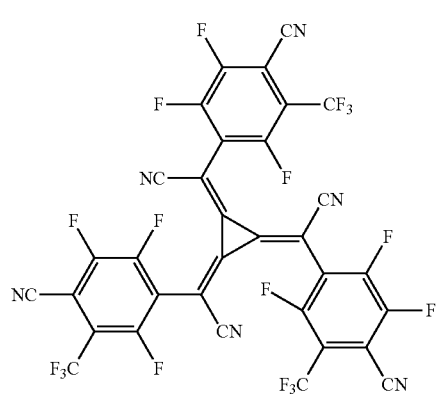
B55
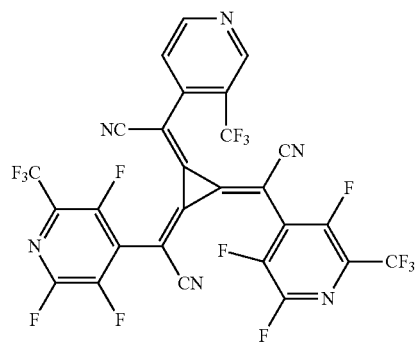
B56
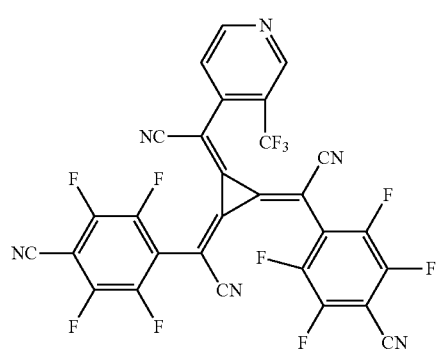
B57
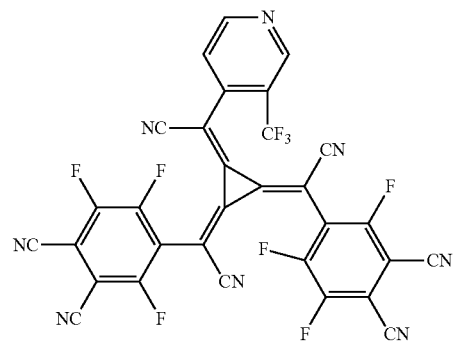
B58
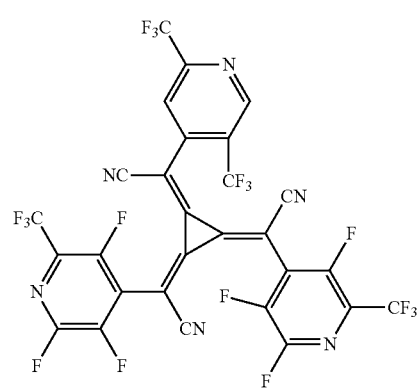
B59
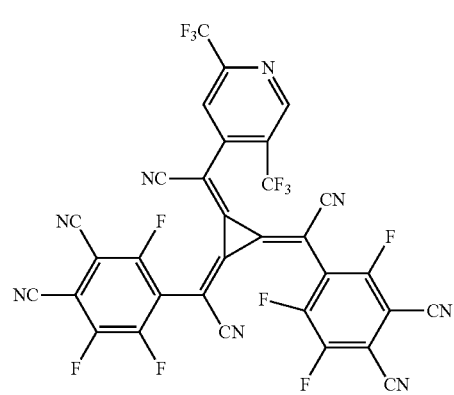
B60
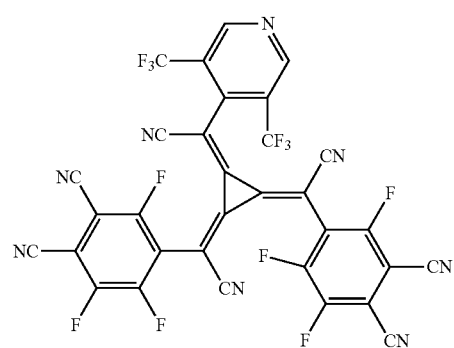

B61
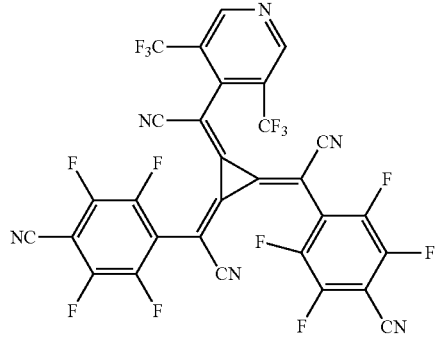
B62
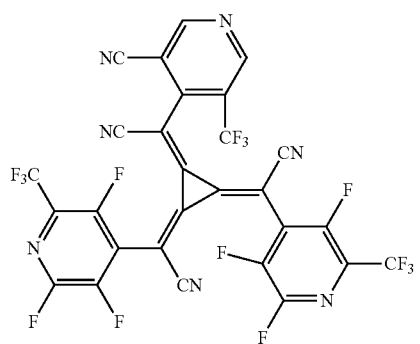
B63
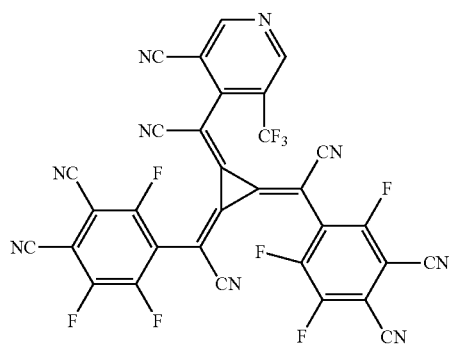
B64
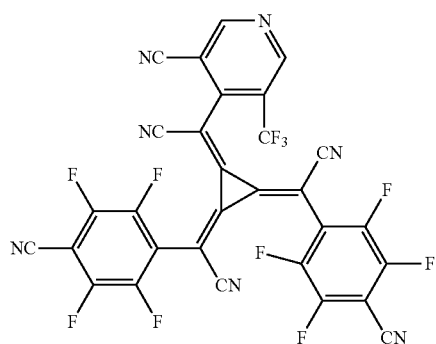
B65
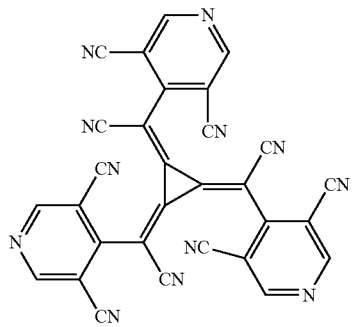
B66
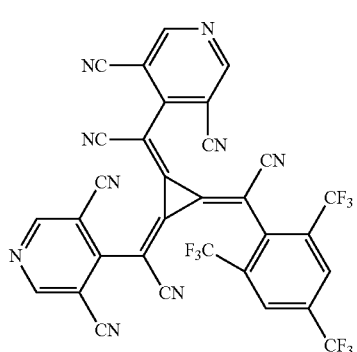
B67
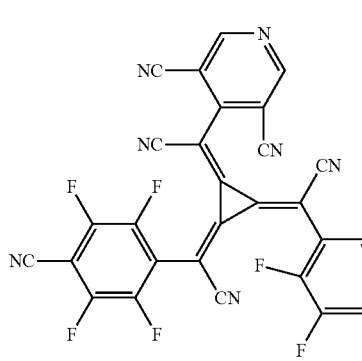
B68
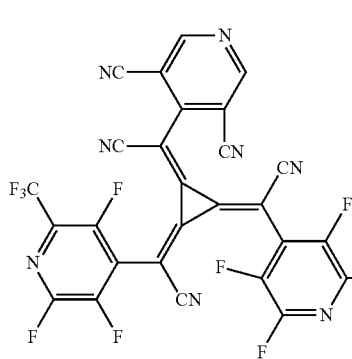

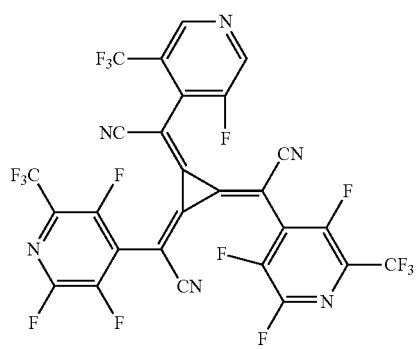
B69
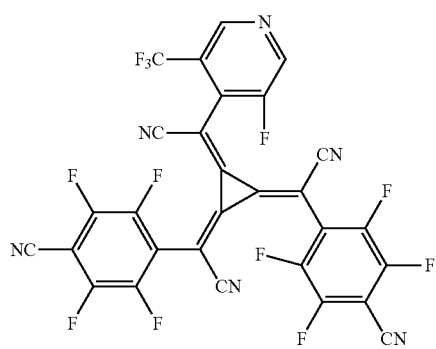
B70
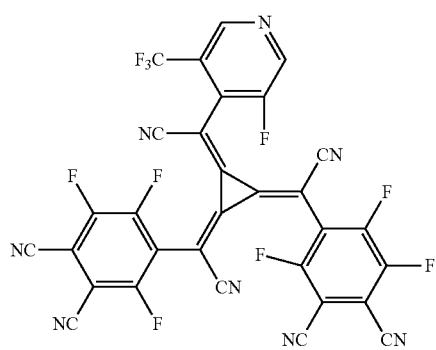
B71
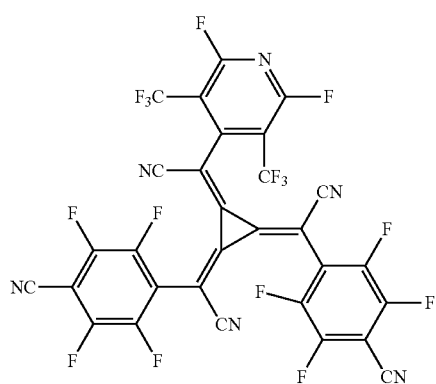
B72
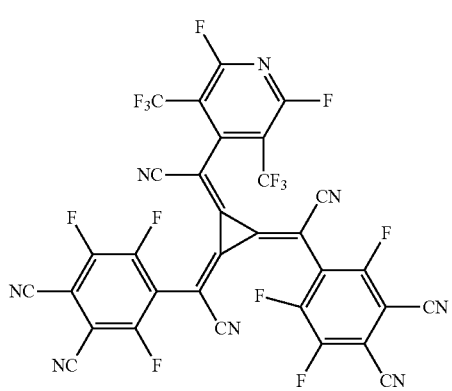
B73
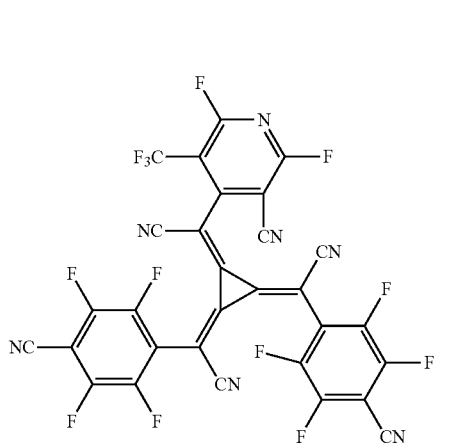
B74
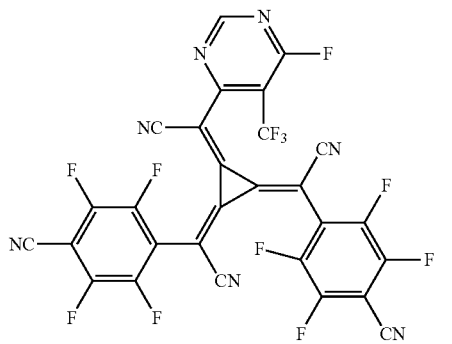
B75
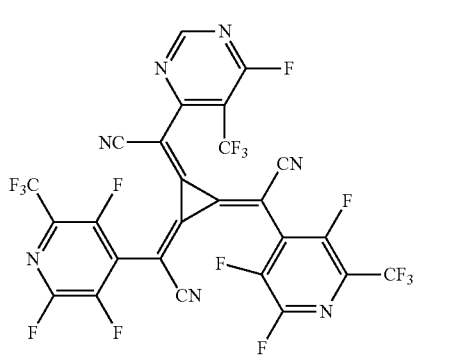
B76

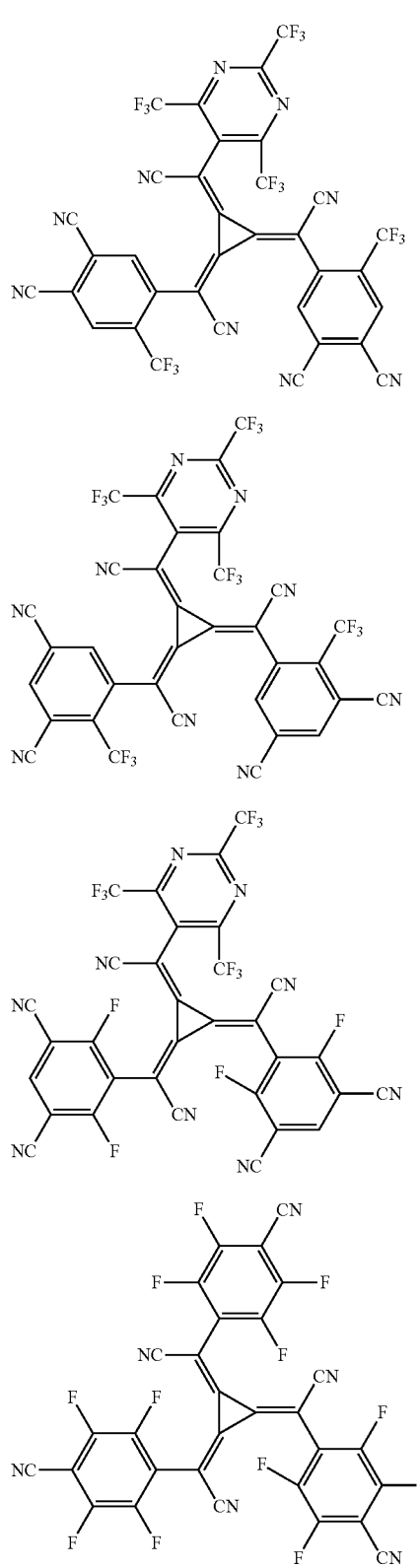
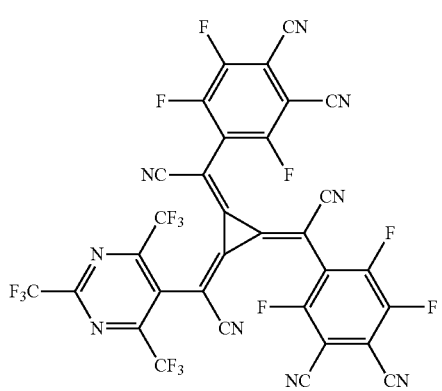
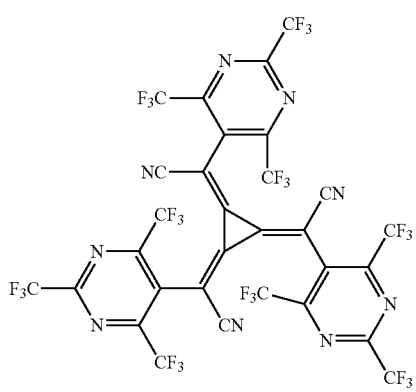
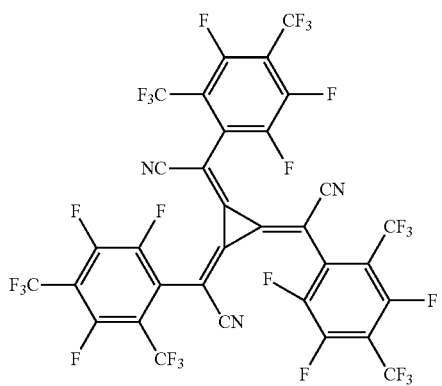
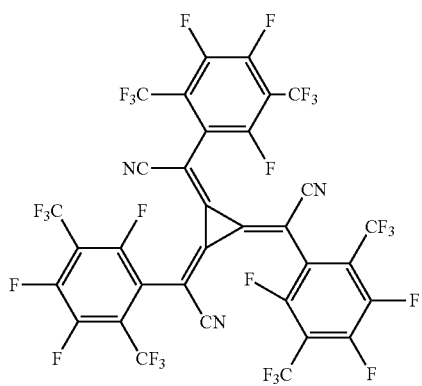
According to one embodiment of the present invention, the compound of formula (I) is selected from the compounds B1 to B29, B56, B57, B59, B60, B61, B64, B67, B70 to B73, B77.

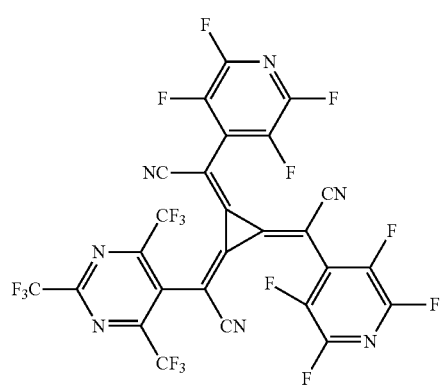
B5
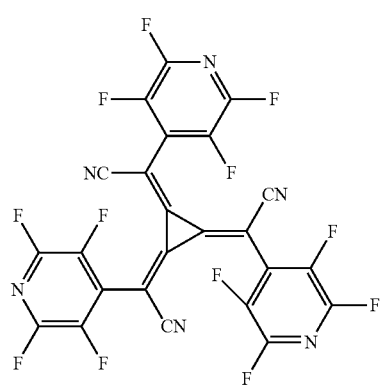
B9
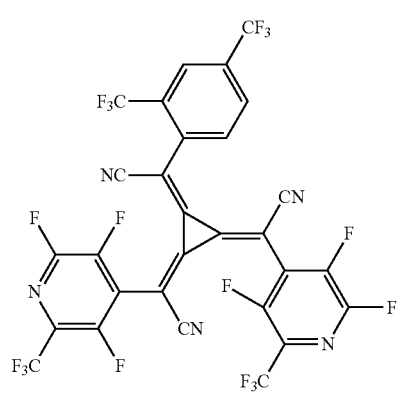
B6
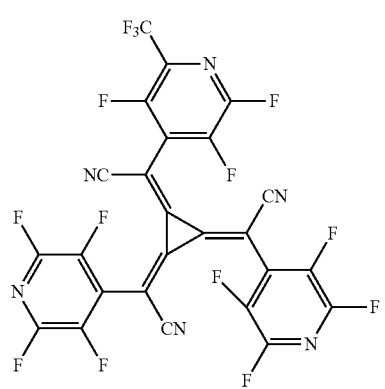
B10
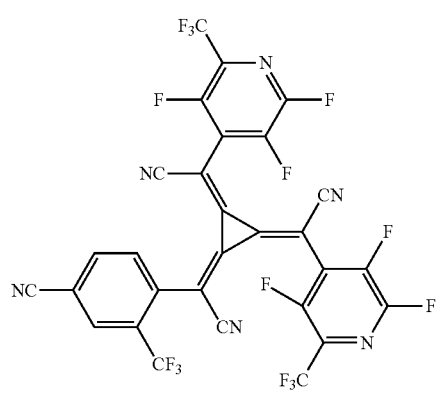
B7
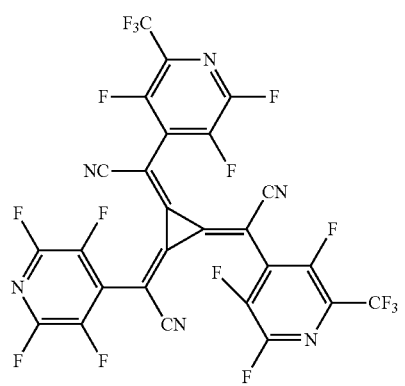
B11
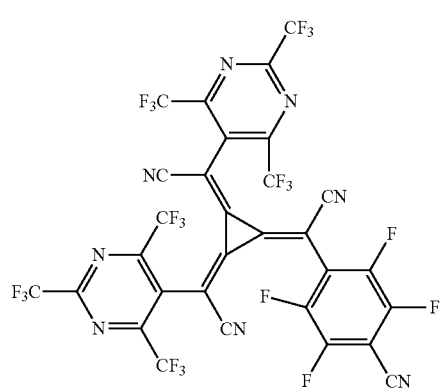
B8
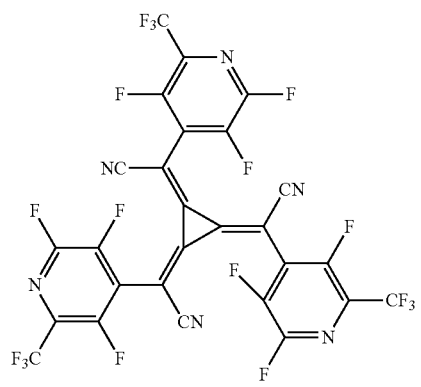
B12

-continued
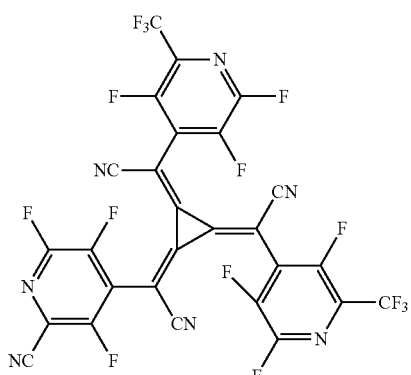
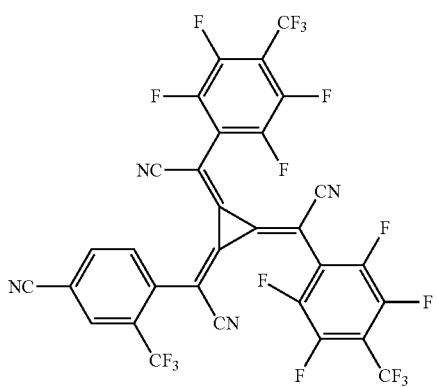
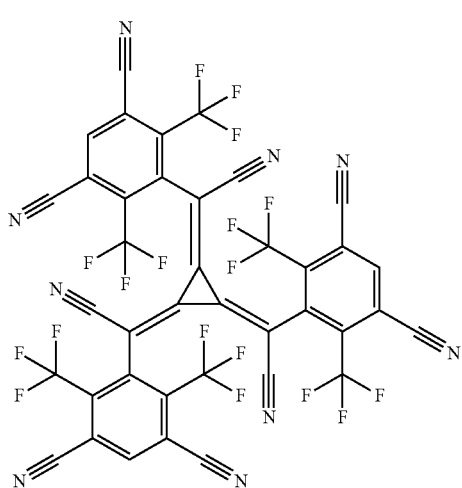
-continued
B13
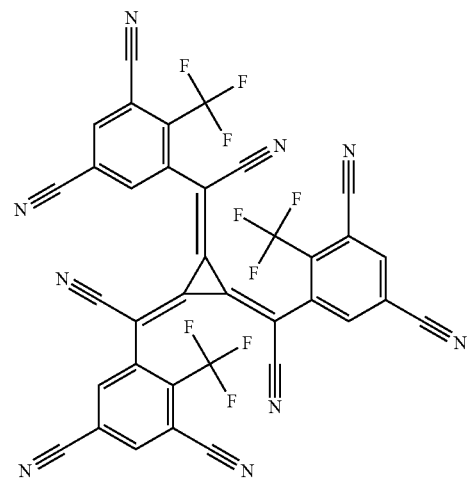
B14
B17
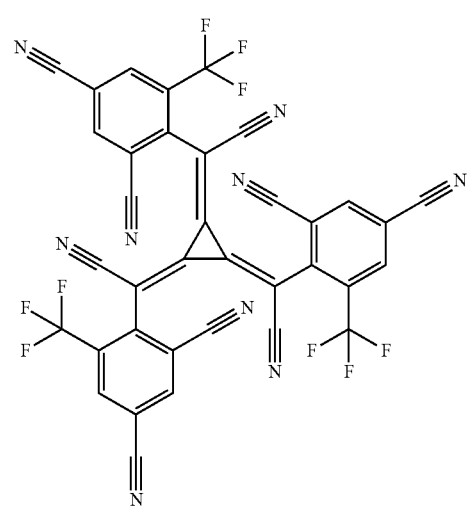
B15
B18
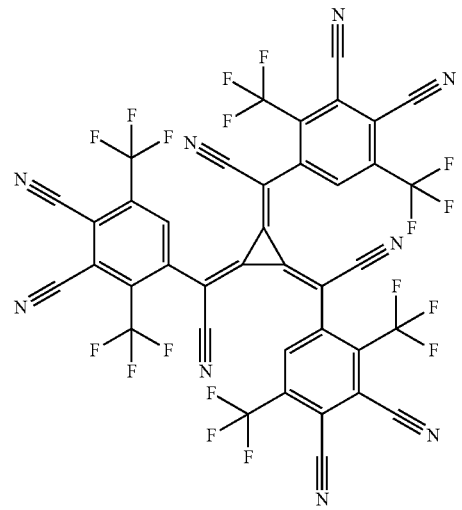

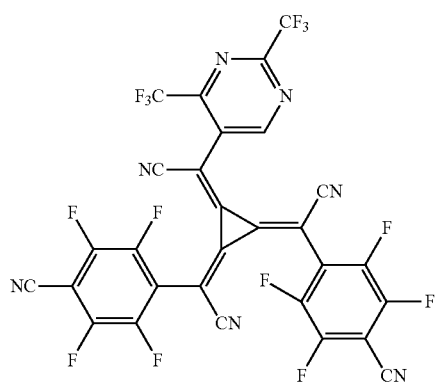
B19
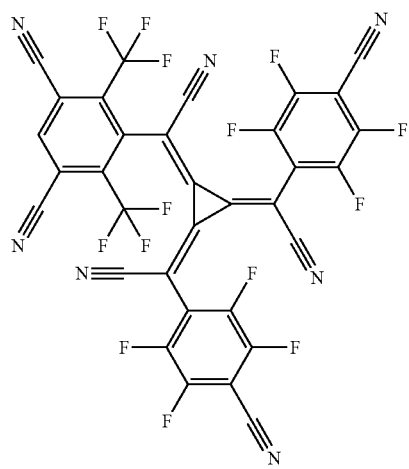
B20
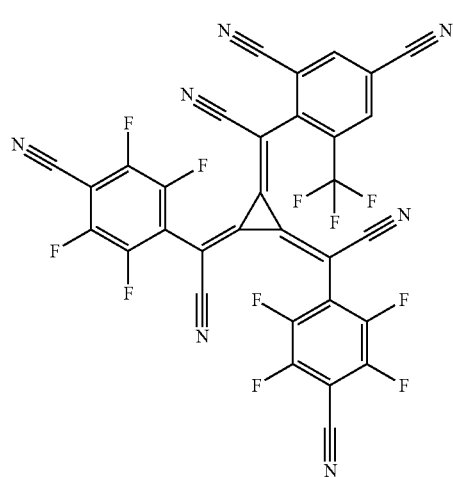
B21
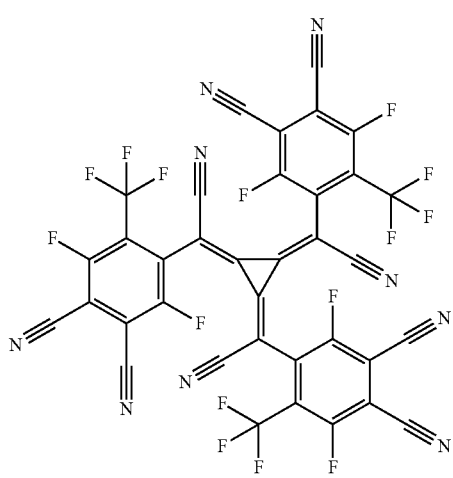
B22
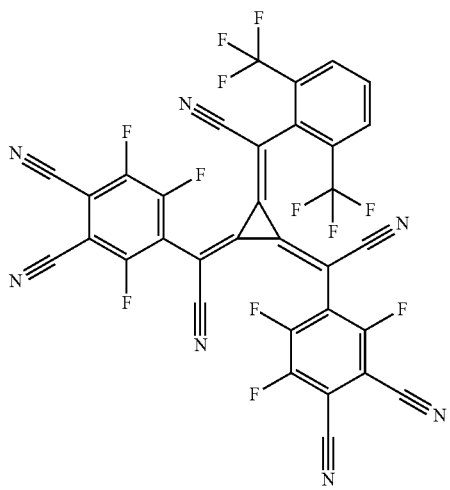
B23
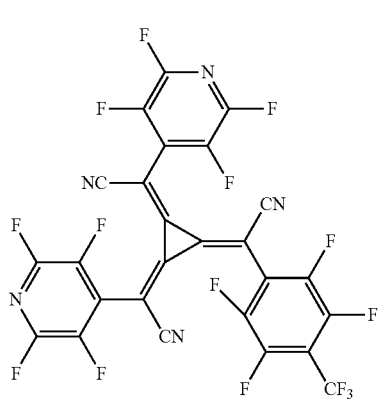
B24

-continued
B25
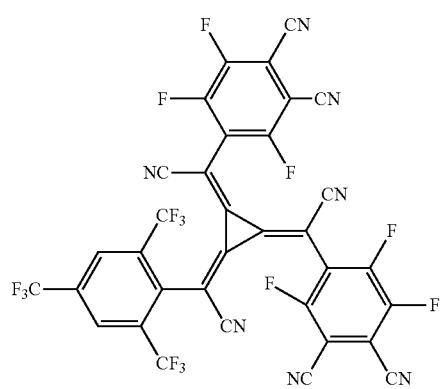
B26
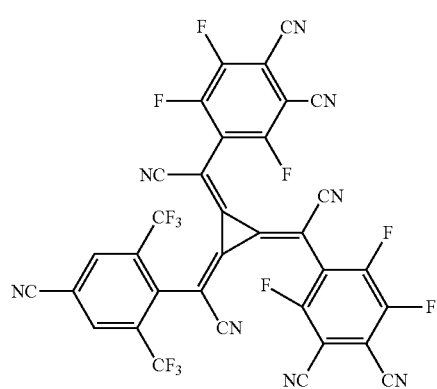
B27
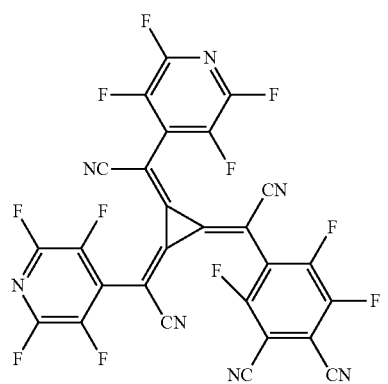
B28
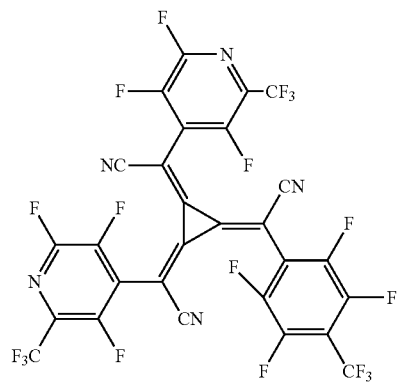
-continued
B29
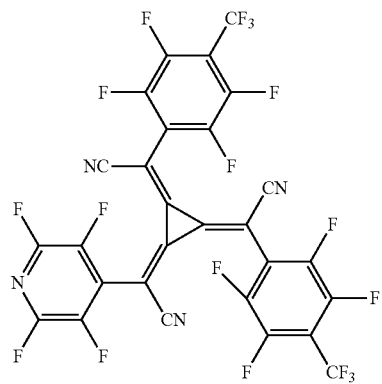
B56
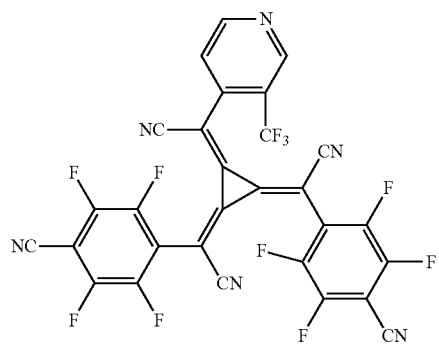
B57
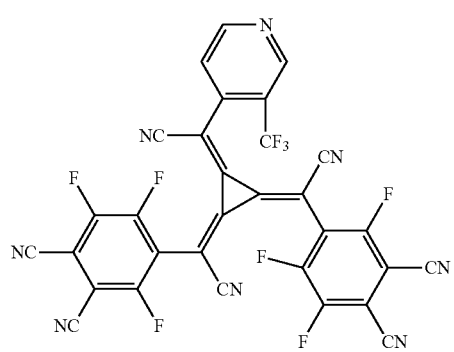
B59
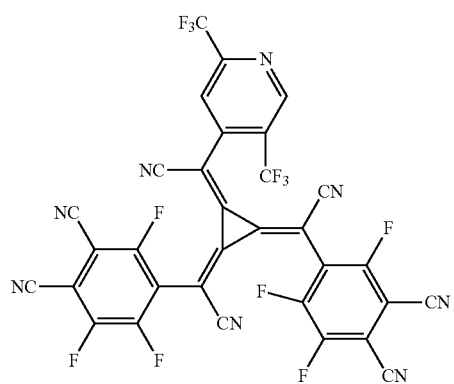

-continued
B60
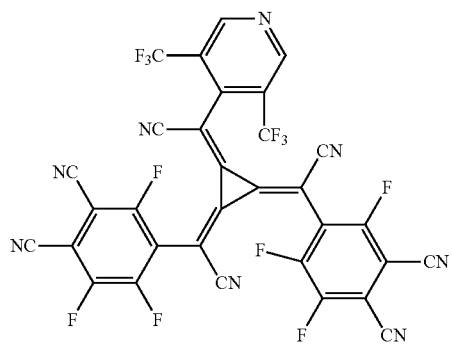
B61
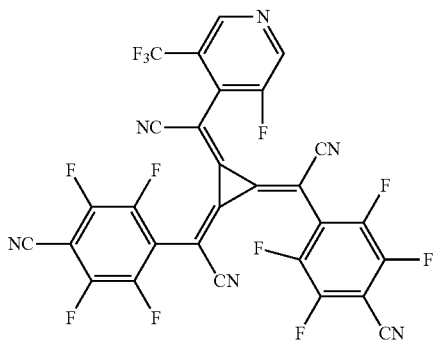
B64
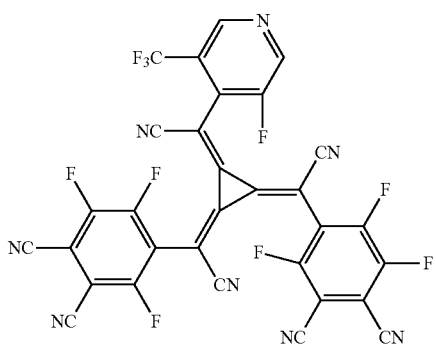
B67
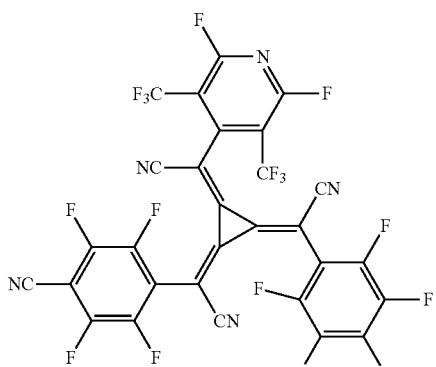
-continued
B70
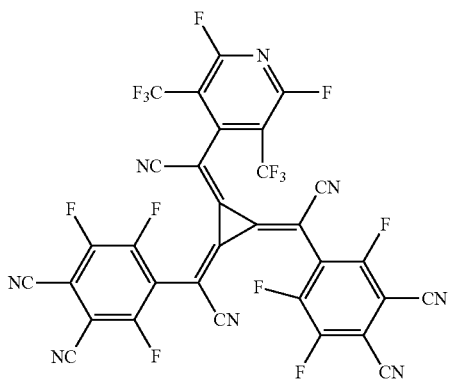
B71
B72
B73

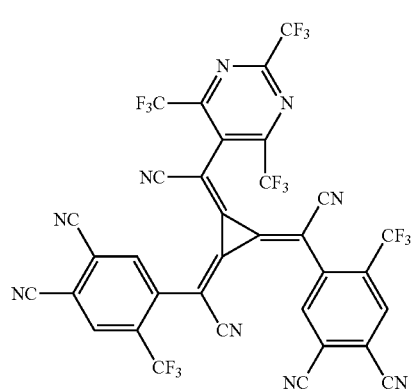
B77
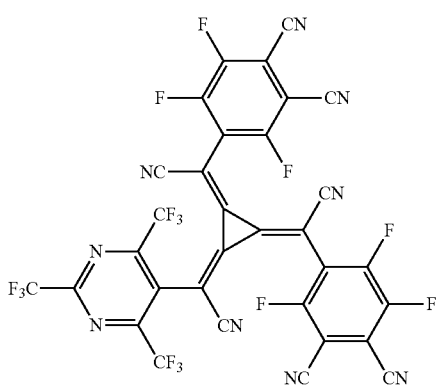
B1
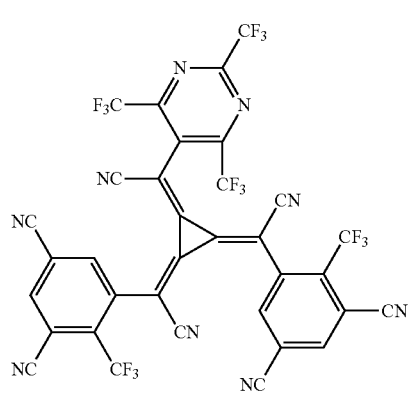
B78
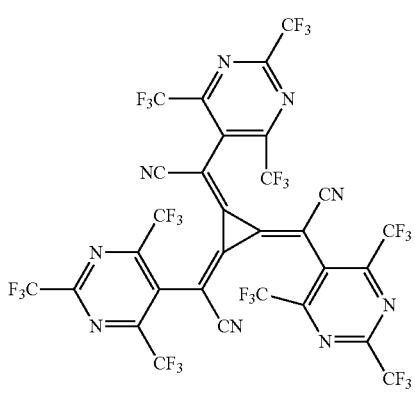
B2
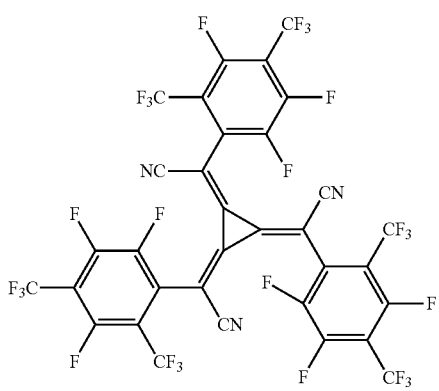
B3
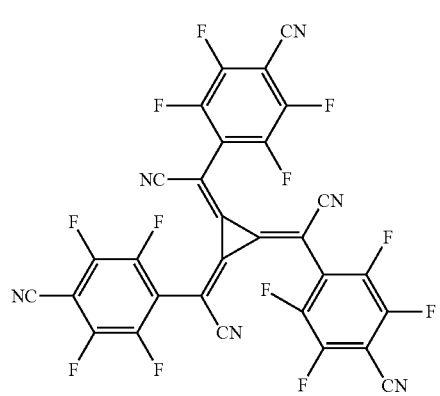
B80
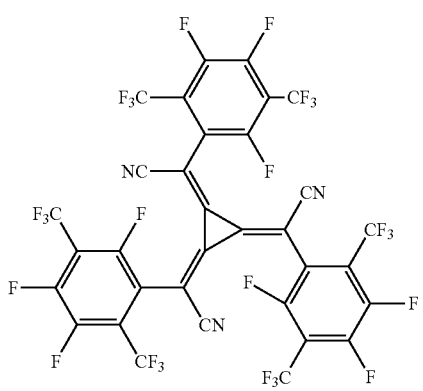
B4
According to one embodiment of the present invention, the compound of formula (I) is selected from the compounds B1 to B18, B56, B57, B59, B60, B61, B64, B67, B70 to B73, B77 and B78, and B80:

-continued
B5 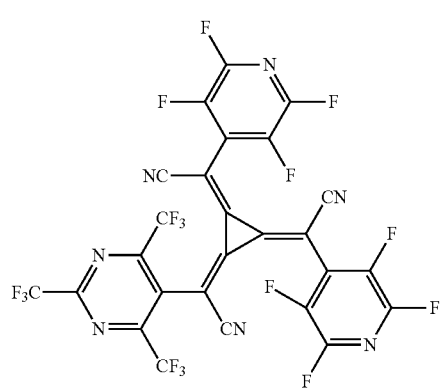
B6 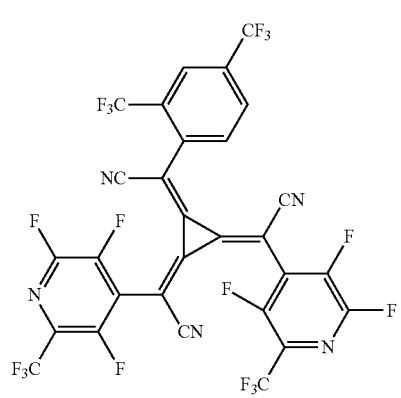
B7 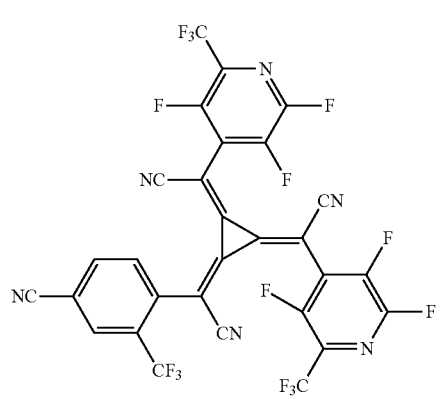
B8 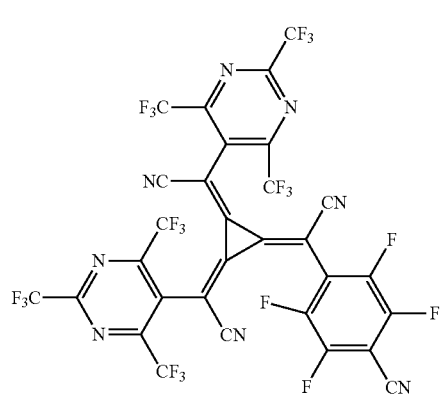
-continued
B9 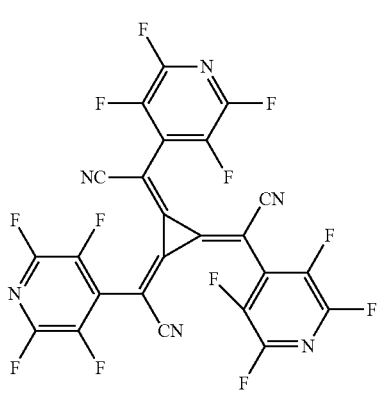
B10 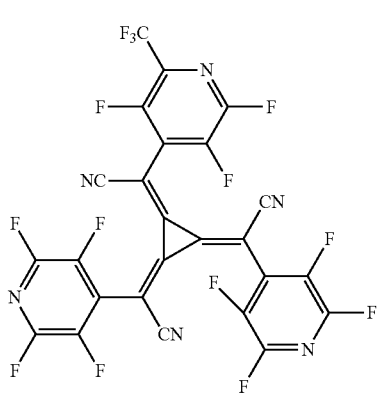
B11 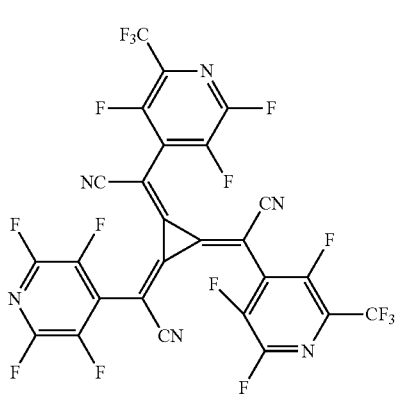
B12 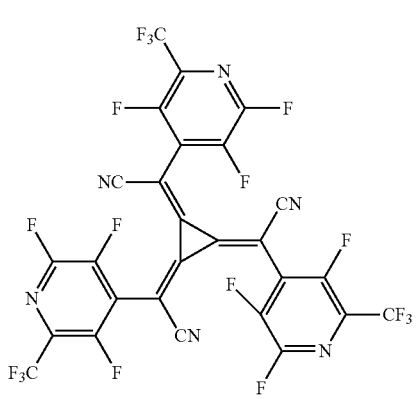

-continued
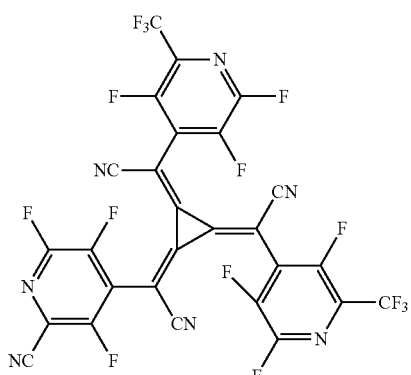
B13
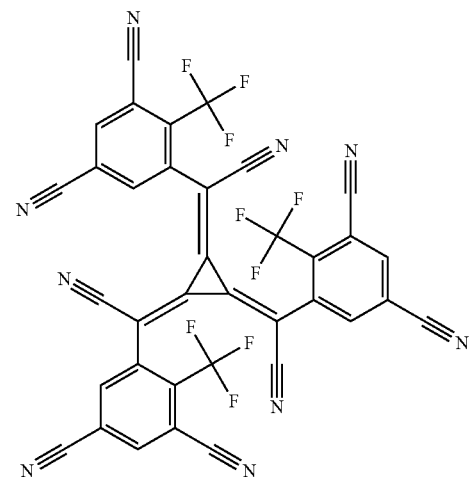
B16
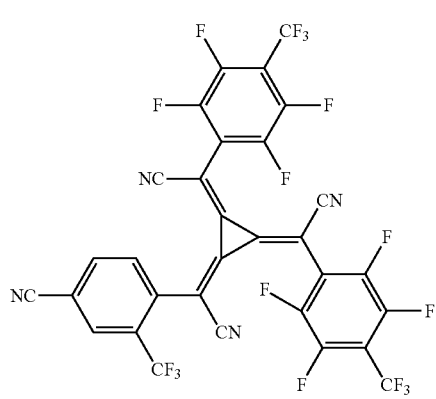
B14
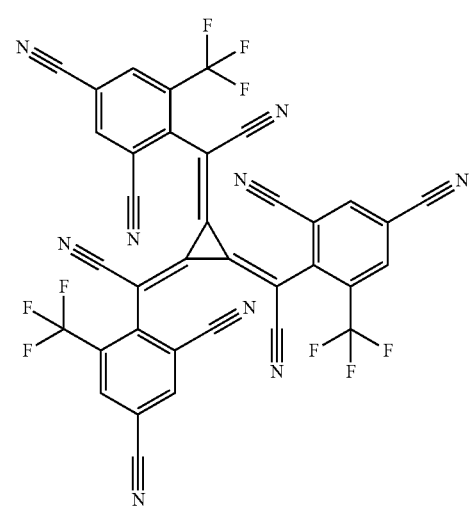
B17
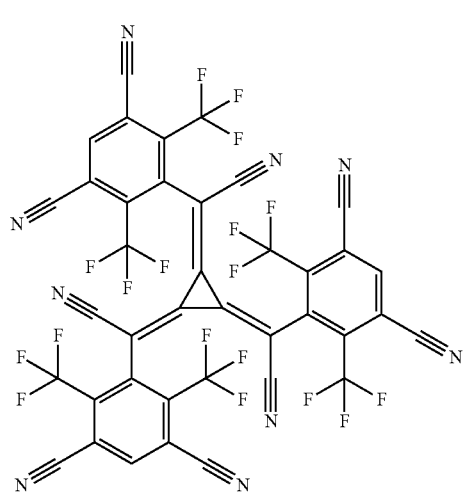
B15
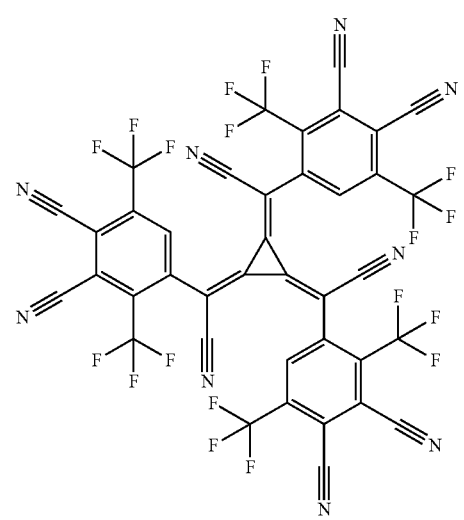
B18

-continued
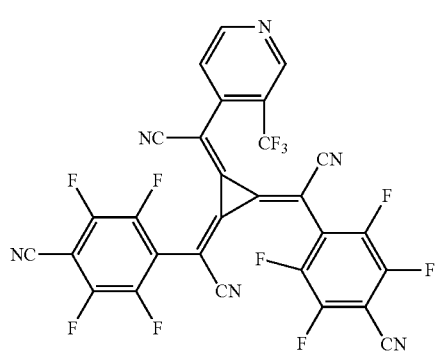 B56
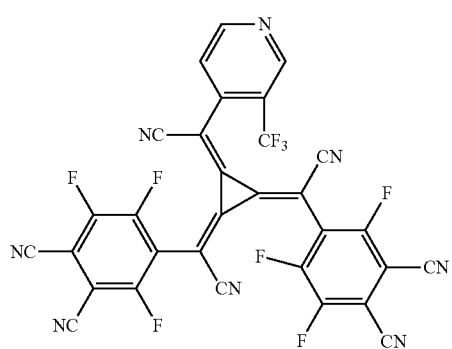 B57
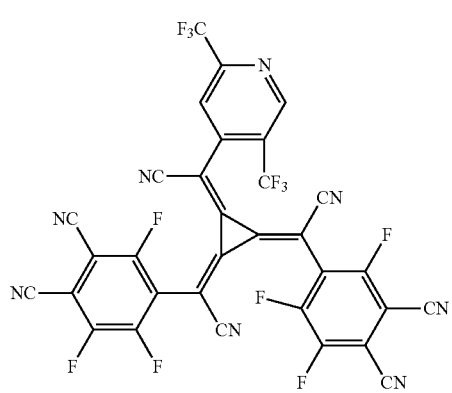 B59
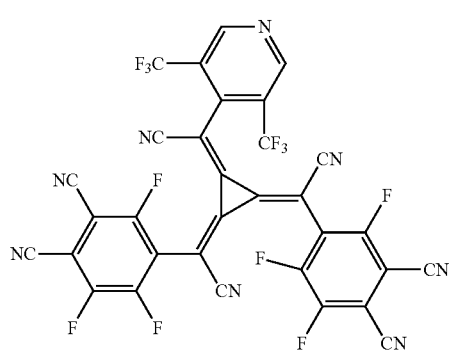 B60
-continued
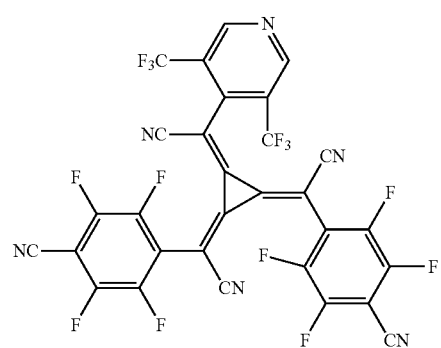 B61
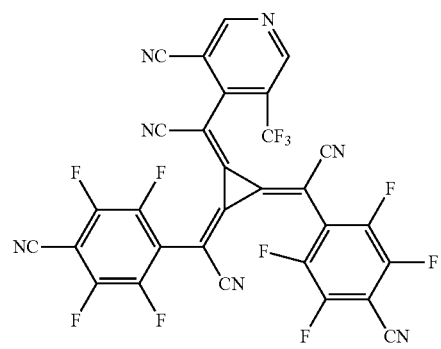 B64
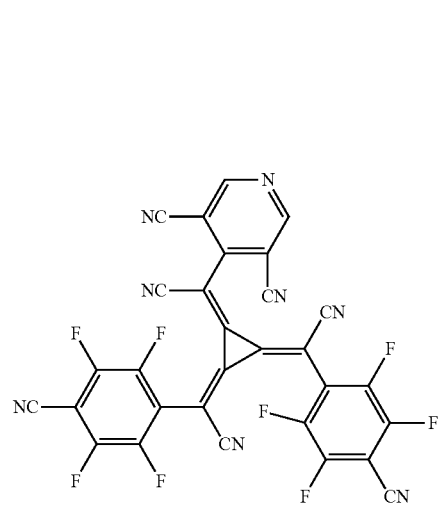 B67
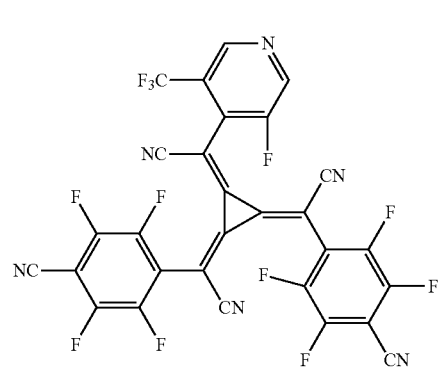 B70

-continued

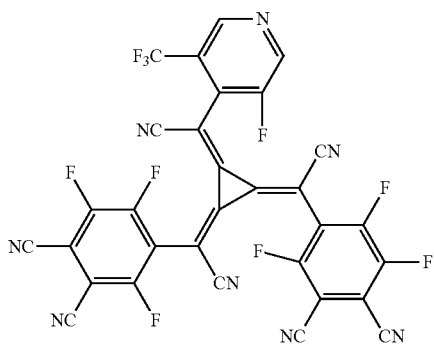
B71

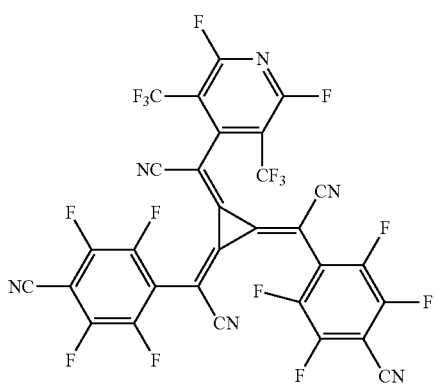
B72

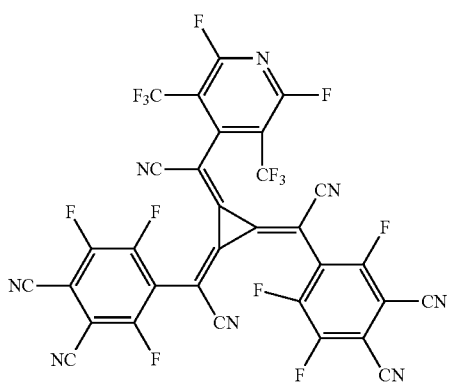
B73

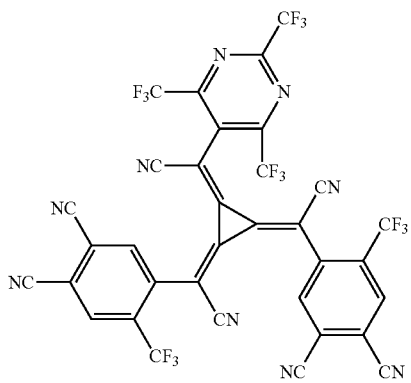
B77

-continued

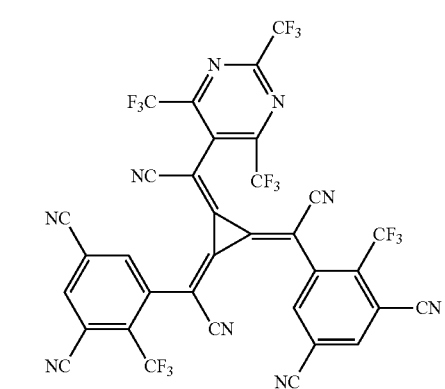
B78

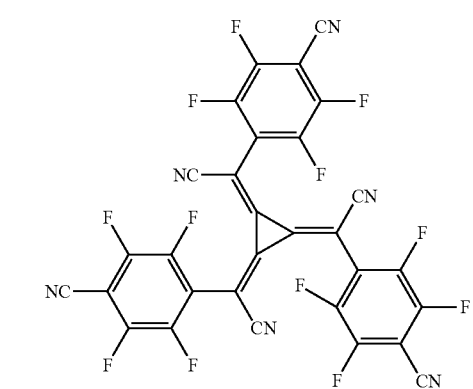
B80 p-type CGL

According to one embodiment of the present invention, the common p-type charge generation layer has a thickness of ≤30 nm, preferably ≤25 nm, more preferably ≤20 nm, more preferably ≤15 nm, and most preferably ≤10 nm.

According to one embodiment of the present invention, the common p-type charge generation layer has a thickness of ≥1 nm, preferably ≥2 nm.

According to an embodiment of the invention, wherein the p-type charge generation layer is free of Dipyrazino[2,3-f:2',3'-h]quinoxaline-2,3,6,7,10,11-hexacarbonitrile (CN-HAT) or 2,2'-(2,5-cyclohexadiene-1,4-diylidene)bismalononitrile (TCNQ) or 2,2'-(perfluorocyclohexa-2,5-diene-1,4-diylidene)dimalononitrile (F4-TCNQ).

According to an embodiment of the invention, wherein the p-type charge generation layer is free of Dipyrazino[2,3-f:2',3'-h]quinoxaline-2,3,6,7,10,11-hexacarbonitrile (CN-HAT) or 2,2'-(2,5-cyclohexadiene-1,4-diylidene)bismalononitrile (TCNQ) or 2,2'-(perfluorocyclohexa-2,5-diene-1,4-diylidene)dimalononitrile (F4-TCNQ) or 2,2'-(1,3,4,5,7,8-Hexafluoro-2,6-naphthalenediylidene)bis[propanedinitrile] (F6-TCNNQ).

Common n-Type CGL

Organic Electron Transport Compound

According to one embodiment of the present invention, the organic electron transport compound has an electron mobility, when measuring the voltage drop $V_{EOD}$, in the range of ≥0.1 V to ≤15 V; alternatively ≥0.1 V to ≤10 V, alternatively ≥0.1 V to ≤7.5 V, alternatively ≥0.1 V to ≤5.0 V; alternatively ≥0.1 V to ≤4.5 V, alternatively ≥0.1 V to ≤4.0 V; alternatively ≥0.1 V to ≤3.5 V; alternatively ≥0.1 V to ≤3.0 V; alternatively ≥0.1 V to ≤2.5 V; alternatively ≥0.1 V to ≤2.0 V; alternatively ≥0.1 V to ≤1.5 V; alternatively ≥0.1 V to ≤1.0 V; alternatively ≥0.1 V to ≤0.9 V; alternatively ≥0.1 V to ≤0.8 V; alternatively ≥0.1 V to ≤0.7 V; alternatively ≥0.1 V to ≤0.6 V; or alternatively ≥0.1 V to ≤0.5 V.

According to one embodiment of the present invention, the organic electron transport compound has an electron mobility, determined by measuring the voltage drop $V_{EOD}$, in the range of ≥0.1 V to ≤15 V; alternatively ≥0.1 V to ≤10 V, alternatively ≥0.1 V to ≤7.5 V, alternatively ≥0.1 V to ≤5.0 V; alternatively ≥0.1 V to ≤4.5 V, alternatively ≥0.1 V to ≤4.0 V; alternatively ≥0.1 V to ≤3.5 V; alternatively ≥0.1 V to ≤3.0 V; alternatively ≥0.1 V to ≤2.5 V; alternatively ≥0.1 V to ≤2.0 V; alternatively ≥0.1 V to ≤1.5 V; alternatively ≥0.1 V to ≤1.0 V; alternatively ≥0.1 V to ≤0.9 V; alternatively ≥0.1 V to ≤0.8 V; alternatively ≥0.1 V to ≤0.7 V; alternatively ≥0.1 V to ≤0.6 V; or alternatively ≥0.1 V to ≤0.5 V.

According to one embodiment of the present invention, the organic electron transport compound has an electron mobility in the range of ≥0.1 V to ≤15 V; alternatively ≥0.1 V to ≤10 V, alternatively ≥0.1 V to ≤7.5 V, alternatively ≥0.1 V to ≤5.0 V; alternatively ≥0.1 V to ≤4.5 V, alternatively ≥0.1 V to ≤4.0 V; alternatively ≥0.1 V to ≤3.5 V; alternatively ≥0.1 V to ≤3.0 V; alternatively ≥0.1 V to ≤2.5 V; alternatively ≥0.1 V to ≤2.0 V; alternatively ≥0.1 V to ≤1.5 V; alternatively ≥0.1 V to ≤1.0 V; alternatively ≥0.1 V to ≤0.9 V; alternatively ≥0.1 V to ≤0.8 V; alternatively ≥0.1 V to ≤0.7 V; alternatively ≥0.1 V to ≤0.6 V; or alternatively ≥0.1 V to ≤0.5 V, whereby the electron mobility is given by measuring the voltage drop $V_{EOD}$.

According to one embodiment of the present invention, the organic electron transport compound has an energy level of the LUMO, expressed in the absolute scale referring to vacuum energy level being zero, calculated using the hybrid functional B3LYP with a Gaussian 6-31G* basis set as implemented in the program package TURBOMOLE V6.5, in the range from ≥−3.5 eV to ≤−1 eV, preferably in the range from ≥−2.5 eV to ≤−1.2 eV, and more preferably in the range from ≥−2.0 eV to ≤−1.5 eV.

According to one embodiment of the present invention, the organic electron transport compound is present in the common n-type charge generation layer in an amount of ≥0.1 wt %, based on the total weight of the n-type charge generation layer, preferably ≥1 wt %, more preferably ≥5 wt %, more preferably ≥10 wt %, more preferably ≥20 wt %, more preferably ≥30 wt %, more preferably ≥40 wt %, more preferably ≥50 wt %, more preferably ≥60 wt %, more preferably ≥70 wt %, more preferably ≥80 wt %, more preferably ≥90 wt, more preferably ≥95 wt %, more preferably ≥96 wt %, more preferably ≥97 wt %, and most preferably ≥98 wt %.

According to one embodiment of the present invention, the organic electron transport compound lacks metal atoms and majority of its skeletal atoms may be selected from C, H, O, N, S, which optionally comprise in addition covalently bound B, P, As and/or Se.

The organic electron transport compound may consists substantially from covalently bound C, H, O, N, S, which optionally comprise in addition covalently bound B, P, As and/or Se.

According to an embodiment of the present invention, the organic electron transport compound preferably comprises at least one $C_2$ to $C_{24}$ N-heteroaryl or P=X group, with X being O, P, Se, with P=O especially preferred.

According to an embodiment of the present invention, the at least one $C_2$ to $C_{24}$ N-heteroaryl may be selected from a compound comprising at least one azine group, preferably at least two azine groups, also preferred three azine groups.

According to an embodiment of the present invention, the organic electron transport compound comprises at least one group selected from the list consisting of pyridine, pyrimidine, triazine, imidazole, benzimidazole, benzooxazole, quinone, benzoquinone, quinoxaline, benzoquinoxaline, acridine, phenanthroline, benzoacridine, dibenzoacridine.

According to one embodiment of the present invention, the organic electron transport compound comprises at least 15 covalently bound atoms, preferably at least 20 covalently bound atoms, more preferably at least 25 covalently bound atoms, and most preferably at least 30 covalently bound atoms.

According to one embodiment of the present invention, the organic substantially covalent electron transport compound comprises at least 15 covalently bound atoms, preferably at least 20 covalently bound atoms, more preferably at least 25 covalently bound atoms, and most preferably at least 30 covalently bound atoms.

According to one embodiment of the present invention, the organic electron transport compound may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, further preferred a molecular weight Mw of ≥550 and ≤900 g/mol, in addition preferred a molecular weight Mw of ≥580 and ≤800 g/mol, also preferred a molecular weight Mw of ≥600 and ≤800 g/mol.

According to one embodiment of the present invention, the organic electron transport compound is a substantially covalent organic electron transport compound.

According to one embodiment of the present invention, the organic electron transport compound is free of a metal complex, metal cation and/or metal-organic compound.

According to one embodiment of the present invention, the organic electron transport compound is not a metal complex or metal cation.

Preferably, the substantially covalent organic electron transport compound is free of metals and/or ionic bonds.

Metal Dopant

According to one embodiment of the present invention, the metal dopant is selected from a metal with an electronegativity of ≤1.4 eV by Pauling scale or a metal alloy comprising a metal with an electronegativity of ≤1.4 eV by Pauling scale.

According to one embodiment of the present invention, the metal dopant is selected from a metal with an electronegativity of ≤1.35 eV by Pauling scale or a metal alloy comprising a metal with an electronegativity of ≤1.35 eV by Pauling scale.

According to one embodiment of the present invention, the metal dopant is a metal selected from the group consisting of Li, Na, K, Rb, Cs, Mg, Ca, Sr, Ba, Sm, Eu or Yb or a metal alloy comprising a metal selected from the group consisting of Li, Na, K, Rb, Cs, Mg, Ca, Sr, Ba, Sm, Eu or Yb.

According to one embodiment of the present invention, the metal dopant is a metal selected from the group consisting of Li, Na, K, Cs, Mg, Ca, Ba, Sm, Eu or Yb or a metal alloy comprising a metal selected from the group consisting of Li, Na, K, Cs, Mg, Ca, Ba, Sm, Eu or Yb.

According to one embodiment of the present invention, the metal dopant is a metal selected from the group consisting of Li, Mg or Yb or a metal alloy comprising a metal selected from the group consisting of Li, Mg or Yb.

According to one embodiment of the present invention, the metal dopant is a metal selected from the group consisting of Li or Yb or metal alloy comprising a metal selected from the group consisting of Li, or Yb.

According to one embodiment of the present invention, the metal dopant is a metal selected from the group consisting of Yb, or a metal alloys comprising a metal selected from the group consisting of Li or Yb.

According to one embodiment of the present invention, the metal dopant is a metal selected from the group consisting of Yb.

n-type CGL

According to one embodiment of the present invention, the common n-type charge generation layer has a thickness of ≤30 nm, preferably ≤25 nm, more preferably ≤20 nm, more preferably ≤15 nm, and most preferably ≤10 nm.

According to one embodiment of the present invention, the common n-type charge generation layer has a thickness of ≥1 nm, preferably ≥2 nm.

Common CGL

According to one embodiment of the present invention, the common charge generation layer has a thickness of ≤60 nm, preferably ≤55 nm, more preferably ≤50 nm, more preferably ≤45 nm, more preferably ≤40 nm, more preferably ≤35 nm, more preferably ≤30 nm, more preferably ≤25 nm, and most preferably ≤20 nm.

According to one embodiment of the present invention, the common charge generation layer has a thickness of ≥2 nm, preferably ≥4 nm.

According to one embodiment of the present invention, the common charge generation layer has a sheet resistance Rs in the range from ≥0.2 giga ohms per square to ≤$10^6$ giga ohms per square, when measured alone, preferably ≥2 giga ohms per square to ≤$10^6$ giga ohms per square, more preferably ≥20 giga ohms per square to ≤$10^6$ giga ohms per square, most preferably 200 giga ohms per square to ≤$10^6$ giga ohms per square.

$10^6$ giga ohms per square are the same as $10^{15}$ ohms per square or 1 peta ohm per square.

A property of organic semi-conducting layers such as charge generation layers is their conductivity. The sheet resistance is for example determined by the so called "transmission line method". At this, a voltage is applied to the thin layer and the current flowing through the layer is measured. The sheet resistance, respectively the electrical conductivity, results by considering the geometry of the contacts and the thickness of the layer of the sample. The unit "ohms per square" thereby is the same as the unit "ohm", wherein the addition "per square" only helps to differentiate between the electrical resistance.

According to one embodiment of the present invention, the sheet resistance is measured by the transmission line method. The transmission line method is described further below.

According to one embodiment of the present invention, the p-type charge generation layer is in direct contact to the n-type charge generation layer.

Electroluminescent Stack

According to one embodiment of the invention, the electroluminescent unit comprises at least one light-emitting layer.

According to one embodiment of the invention, the electroluminescent unit comprises at least one light-emitting layer, a hole transport layer, and an electron transport layer.

According to one embodiment of the invention, the electroluminescent unit comprises at least one light-emitting layer, a hole transport layer, an electron-blocking layer, a hole blocking layer and an electron transport layer.

According to one embodiment of the invention, the electron-blocking layer is arranged between the hole transport layer and the at least one light-emitting layer.

According to one embodiment of the invention, the hole-blocking layer is arranged between the at least one light-emitting layer and the electron transport layer.

Display Device

According to one embodiment of the present invention, the display device comprises at least one common charge generation layer.

According to one embodiment of the present invention, the display device comprises at least two common charge generation layers.

According to one embodiment of the present invention, the display device comprises at least three common charge generation layers.

According to one embodiment of the present invention, the present invention, each pixel comprises at least three vertically stacked electroluminescent units.

According to one embodiment of the present invention, each pixel comprises at least four vertically stacked electroluminescent units.

According to one embodiment of the present invention, the display device comprises between each pair of two vertically stacked electroluminescent units a common charge generation layer.

According to one embodiment of the present invention, the pixels are OLED pixels.

According to one embodiment of the present invention, the display device is an active matrix display.

According to one embodiment of the present invention, the display device is an OLED display.

According to one embodiment of the present invention, the display device comprises a driving circuit configured to separately driving the pixels of the plurality of pixels.

Method of Manufacture

The present invention furthermore relates to a method for the manufacture of a display device according the present invention, the method comprising the step of manufacturing the at least one common charge generation layer, wherein each common layer is deposited onto the complete display area through one large mask opening in one processing step.

Further Layers

In accordance with the invention, the pixel or the display device, may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Layer

The anode layer may be formed by depositing or sputtering a material that is used to form the anode layer. The material used to form the anode layer may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide ($SnO2$), aluminum zinc oxide (AlZO) and zinc oxide (ZnO), may be used to form the anode electrode. The anode layer may also be formed using metals, typically silver (Ag), gold (Au), or metal alloys.

Hole Injection Layer

A hole injection layer (HIL) may be formed on the anode layer by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL may comprise or consist of p-type dopant and the p-type dopant may be selected from tetrafluoro-tetracyanoquinonedimethane (F4TCNQ), 2,2'-(perfluoronaphthalen-2, 6-diylidene) dimalononitrile or 2,2',2"-(cyclopropane-1,2,3-triylidene)tris(2-(p-cyanotetrafluorophenyl)acetonitrile) but not limited hereto. The HIL may be selected from a hole-transporting matrix compound doped with a p-type dopant. Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis(phenyl)-benzidine) doped with F4TCNQ. α-NPD doped with 2,2'-(perfluoronaphthalen-2,6-diylidene) dimalononitrile. The p-type dopant concentrations can be selected from 1 to 20 wt.-%, more preferably from 3 wt.-% to 10 wt.-%.

According to a preferred embodiment of the present invention, however, the HIL comprises a compound of formula (I) as described above.

According to a preferred embodiment of the present invention, the HIL may comprises the same compound of formula (I) as the p-type charge generation layer.

According to a preferred embodiment of the present invention, the HIL may comprises a substantially covalent matrix compound as described above.

According to a preferred embodiment of the present invention, the HIL may comprises a compound of formula (I), as described above, and a compound of formula (VII) or (VIII), as described above.

According to a preferred embodiment of the present invention, the p-type charge generation layer and the hole injection layer may comprise an identical substantially covalent matrix compound.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

A hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

According to one embodiment of the present invention, the hole transport layer may comprise a substantially covalent matrix compound as described above.

According to one embodiment of the present invention, the hole transport layer may comprise a compound of formula (VII) or (VIII) as described above.

According to a preferred embodiment of the present invention, the hole injection layer and the hole transport layer may comprise an identical a compound of formula (VII) or (VIII) as described above.

According to a preferred embodiment of the present invention, the p-type charge generation layer, the hole injection layer and the hole transport layer may comprise an identical substantially covalent matrix compound.

According to a preferred embodiment of the present invention, the p-type charge generation layer, the hole injection layer and the hole transport layer may comprise an identical compound of formula (VII) or (VIII) as described above.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Photoactive Layer (PAL)

According to an embodiment of the present invention, the organic electronic device may further comprise a photoactive layer, wherein the photoactive layer is arranged between the anode layer and the cathode layer.

The photoactive layer converts an electrical current into photons or photons into an electrical current.

The PAL may be formed on the HTL by vacuum deposition, spin coating, slot-die coating, printing, casting, LB deposition, or the like. When the PAL is formed using vacuum deposition or spin coating, the conditions for deposition and coating may be similar to those for the formation of the HIL. However, the conditions for deposition and coating may vary, according to the compound that is used to form the PAL.

According to one embodiment of the present invention, the photoactive layer does not comprise the compound of formula (I).

The photoactive layer may be a light-emitting layer or a light-absorbing layer.

Emission Layer (EML)

According to an embodiment of the present invention, the organic electronic device may further comprise an emission layer, wherein the emission layer is arranged between the anode layer and the cathode layer.

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

According to one embodiment of the present invention, the emission layer does not comprise the compound of formula (I).

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4''-tris(carbazol-9-yl)-triphenylamine(TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzothiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2Ir(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene. 4.4'-bis(4-diphenyl amiostyryl)biphenyl (DPAVBi), 2,5,8, 11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, phenanthroline derivatives and azine derivatives, preferably triazine or pyrimidine derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The organic electronic device according to the present invention may further comprise an electron transport layer (ETL).

According to another embodiment of the present invention, the electron transport layer may further comprise an azine compound, preferably a triazine compound or a pyrimidine compound.

In one embodiment, the electron transport layer may further comprise a dopant selected from an alkali organic complex, preferably LiQ.

The thickness of the ETL may be in the range from about 15 nm to about 50 nm, for example, in the range from about 20 nm to about 40 nm. When the thickness of the EIL is within this range, the ETL may have satisfactory electron-injecting properties, without a substantial penalty in driving voltage.

According to another embodiment of the present invention, the organic electronic device may further comprise a hole blocking layer and an electron transport layer, wherein the hole blocking layer and the electron transport layer comprise an azine compound. Preferably, the azine compound is a triazine compound.

According to an embodiment of the present invention, the n-type charge generation layer is contacting sandwiched between the electron transport layer and the p-type charge generation layer.

According to an embodiment of the present invention, the n-type charge generation layer is contacting sandwiched between the electron transport layer and the p-type charge generation layer; wherein the n-type charge generation layer and/or the electron transport layer comprise an azine compound. Particularly improved performance may be obtained.

According to an embodiment of the present invention, the n-type charge generation layer is contacting sandwiched between the electron transport layer and the p-type charge generation layer; and the electron transport layer is contacting sandwiched between the first emission layer and the n-type charge generation layer; wherein the n-type charge generation layer and/or the electron transport layer comprise an azine compound. Particularly improved performance may be obtained.

According to an embodiment of the present invention, the n-type charge generation layer is contacting sandwiched between the electron transport layer and the p-type charge generation layer; and the electron transport layer is contacting sandwiched between the first emission layer and the n-type charge generation layer; wherein the n-type charge generation layer comprises a phenanthroline compound and the electron transport layer comprise an azine compound, preferably a triazine or a pyrimidine compound. Particularly improved performance may be obtained.

Electron Injection Layer (EIL)

An optional EIL, which may facilitate injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Layer

The cathode layer is formed on the ETL or optional EIL. The cathode layer may be formed of a metal, an alloy, an electrically conductive compound, or a mixture thereof. The cathode electrode may have a low work function. For example, the cathode layer may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode layer may be in the range from about 5 nm to about 1000 nm, for example, in the range from about 10 nm to about 100 nm. When the thickness of the cathode layer is in the range from about 5 nm to about 50 nm, the cathode layer may be transparent or semitransparent even if formed from a metal or metal alloy.

It is to be understood that the cathode layer is not part of an electron injection layer or the electron transport layer.

Pixel

According to one embodiment of the present invention, the pixel further comprises an anode and a cathode layer.

According to one embodiment of the present invention, the pixel further comprises an anode and a cathode layer, wherein the at least two vertically stacked electroluminescent units and the at least one charge generation layer is arranged between the anode layer and the cathode layer.

According to one embodiment of the present invention, the charge generation layer is arranged between the at least one light-emitting layer of the at least two vertically stacked electroluminescent units.

According to one embodiment of the present invention, the pixel further comprises an anode layer, a hole injection layer, an electron injection layer, and a cathode layer.

According to one embodiment of the present invention, the hole injection layer is in direct contact with anode layer.

According to one embodiment of the present invention, the electron injection layer is in direct contact with cathode layer.

According to one embodiment of the present invention, the pixel further comprises an anode layer, a hole transport layer, an electron transport layer, and a cathode layer.

According to one embodiment of the present invention, the pixel further comprises an anode, a hole transport layer, an electron blocking layer, a hole blocking layer, an electron transport layer, and a cathode layer.

According to one embodiment of the present invention, the pixel further comprises an anode, a hole transport layer, an electron blocking layer, a hole blocking layer, an electron transport layer, electron injection layer and a cathode layer.

According to one embodiment of the present invention, the pixel further comprises an anode, a hole injection layer, a hole transport layer, an electron blocking layer, a hole blocking layer, an electron transport layer, electron injection layer and a cathode layer.

DESCRIPTION OF THE DRAWINGS

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the dependent claims and the following description of the respective figures which in an exemplary fashion show preferred embodiment according to the invention. Any embodiment does not necessarily represent the full scope of the invention, however, and reference is made therefore to the claims and herein for interpreting the scope of the invention. It is to be understood that both the foregoing general description and the following detailed description are exemplary and explanatory only and are intended to provide further explanation as claimed.

FIG. 1 is a schematic sectional view of a test elements for measuring the sheet resistance;

FIG. 2 is a schematic sectional view of deposited layer stack.

FIG. 3 is a schematic sectional view of a test element;

FIG. 4 is a schematic sectional view of a test element;

FIG. 5 is a schematic sectional view of a test element for determining the voltage drop in an hole only device;

FIG. 6 is a schematic sectional view of a test element for determining the voltage drop in an electron only device;

FIG. 7 is a schematic sectional view of a display device according to one exemplary embodiment of the present invention; and FIG. 8 is a schematic sectional view of a pixel in a display device according to one exemplary embodiment of the present invention.

Hereinafter, the FIGS. 1 to 8 are illustrated in more detail with reference to examples. However, the present disclosure is not limited to the following figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

Figure 1:
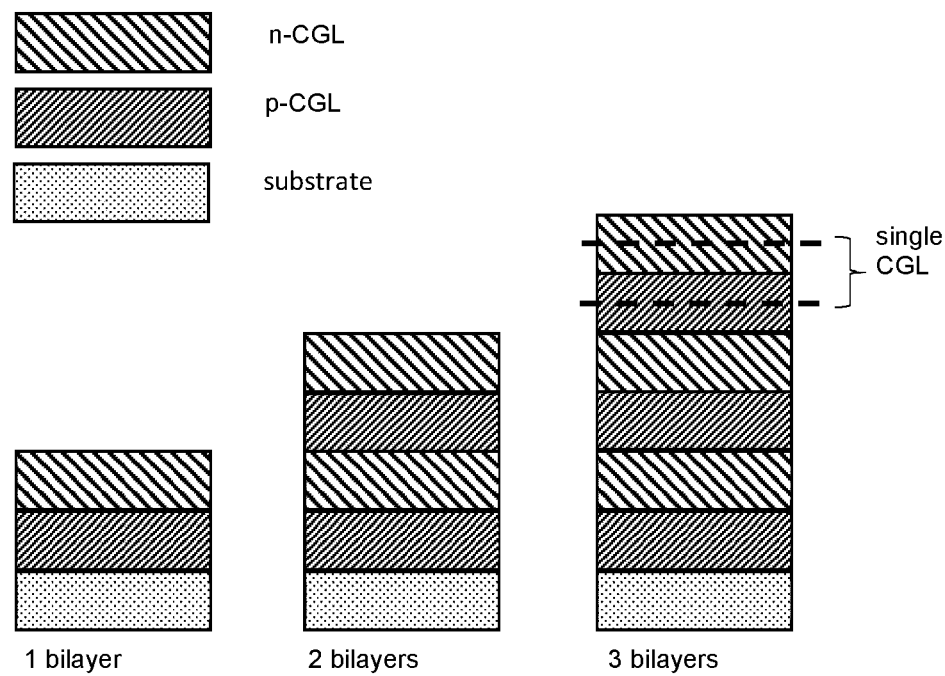
FIGS. 1 to 8

FIG. 1 shows a schematic representation of test elements or devices for measuring the sheet resistance of the charge generation layer. Particularly, the test devices comprise on a substrate charge generation bilayer consisting of a p-type charge generation layer and an n-type charge generation layer. Devices with 1, 2 or 3 bilayers are exemplarily shown.

Figure 2:
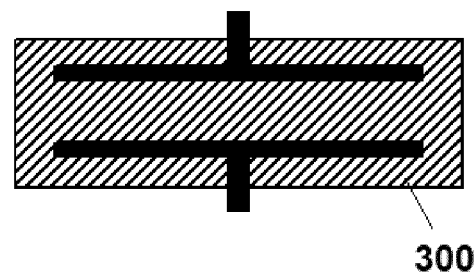

FIG. 2 shows schematic representation of a deposited layer stack on a test element group for determining the sheet resistance. The test element consists of a channel (test element). The deposition layer (300) lies on top of the electrode.

Figure 3:
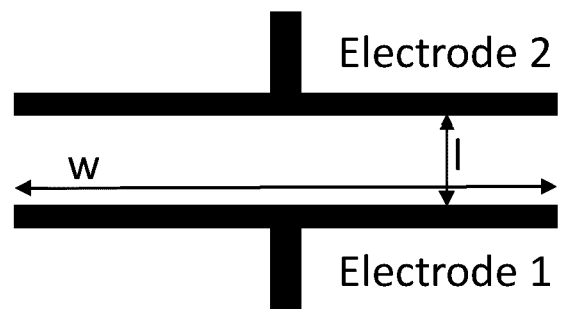

FIG. 3 shows the test element comprising 2 highly conductive electrodes with a gap "l" between the 2 highly conductive electrodes and a width "w" for the respective highly conductive electrodes.

Figure 4:
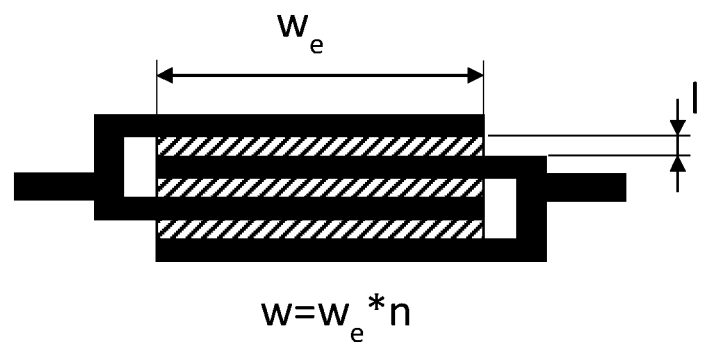

FIG. 4 shows the test element comprising 2 highly conductive electrodes with interdigitated finger pattern with a gap "l" between electrode fingers and total width "w" as product of interdigitation width "we" and number of interdigitation areas.

Figure 5:
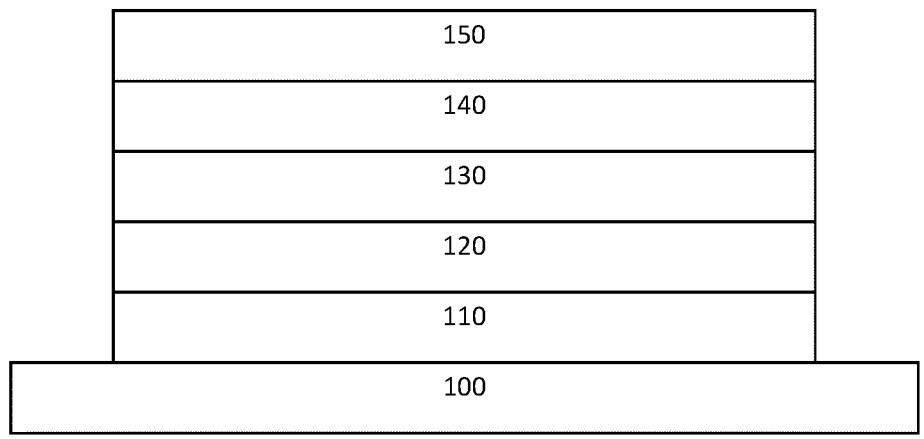

FIG. 5 shows a schematic sectional view of a test element for determining the voltage drop in an hole only device, wherein the device comprises a substrate 100. On the substrate 100 there is an anode layer 110 followed by a hole injection layer 120 consisting of the hole transport compound and 4,4',4''-((1E,1'E,1"E)-cyclopropane-1,2,3-triylidenetris(cyanomethanylylidene))tris(2,3,5,6-tetrafluorobenzonitrile) and a hole transport layer 130 deposited on the hole injection layer 120. The hole transport layer 130 is followed by a layer comprising 1,4,5,8,9,11-Hexaazatriphenylenehexacarbonitrile (HAT-CN) to prevent electron injection from cathode 150.

Figure 6:
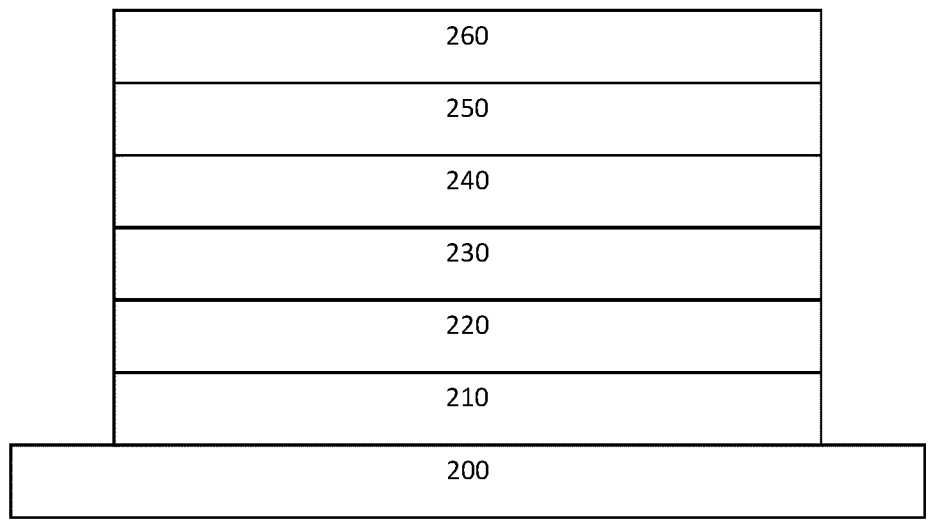

FIG. 6 shows a schematic sectional view of a test element for determining the voltage drop in an electron only device, wherein the device comprises a substrate, a first anode layer 210 followed by a second anode layer 220. On the second anode layer 220, there is an electron injection layer 230 followed by a layer 240 consisting of electron transport compound. Said layer is contacted by an electron injection layer 250 and the cathode 260.

Figure 7:
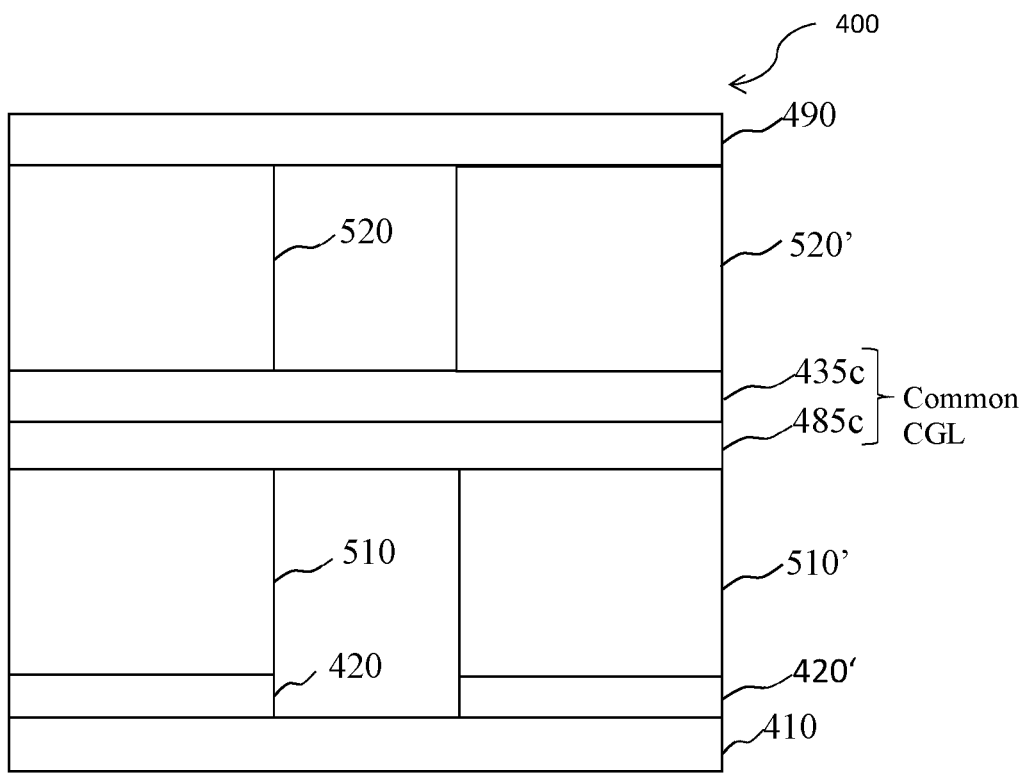

FIG. 7 shows a schematic sectional view of a display device 400 according to one exemplary embodiment of the present invention. In particular the display device 400 includes a substrate 410, the anode layers 420 and 420', the first vertically stacked electroluminescent units 510 and 510', a common n-type charge generation layer 485c, a common p-type charge generation layer 435c, the second vertically stacked electroluminescent units 520 and 520', and a cathode layer 490.

Figure 8:
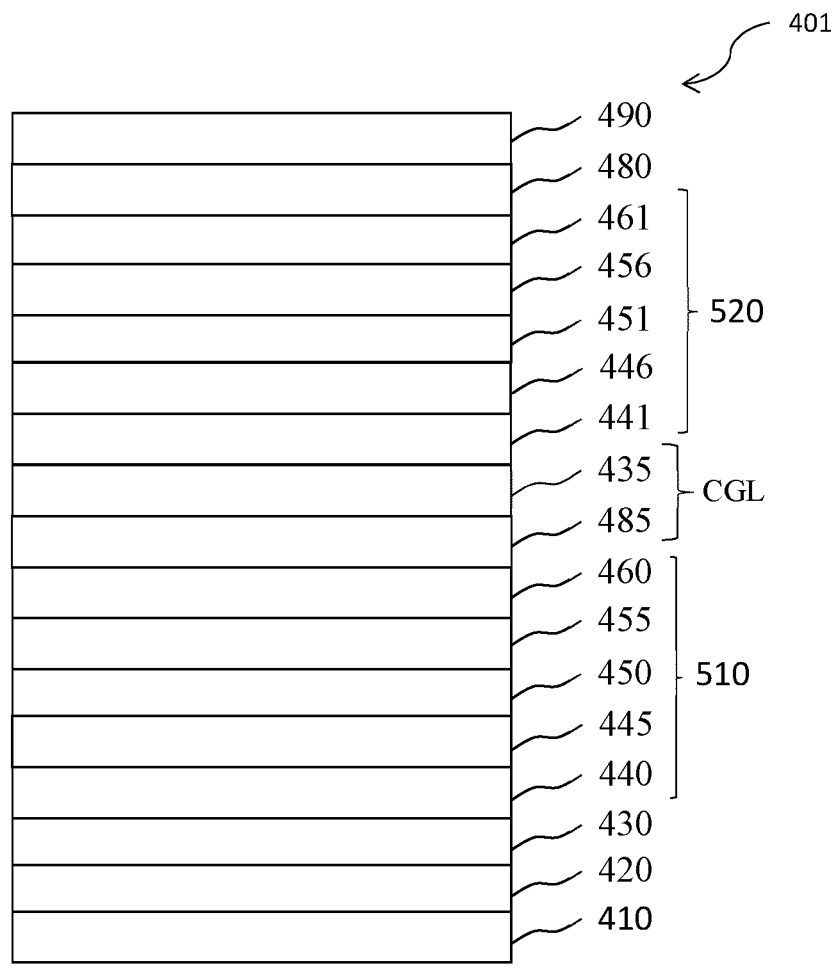

FIG. 8 shows a schematic sectional view of a pixel 401 in a display device 400 according to one exemplary embodiment of the present invention. In particular, the pixel 401 includes a substrate 410, an anode layer 420, a hole injection layer (HIL) 430, a first vertically stacked electroluminescent unit 510 including a first hole transport layer (HTL) 440, a first electron blocking layer (EBL) 445, a first emission layer (EML) 450, a first hole blocking layer (HBL) 455, and a first electron transport layer (ETL) 460; an n-type charge generation layer (n-CGL) 485, a p-type charge generation layer (p-GCL) 435 which may comprise compound of formula (I), a second vertically stacked electroluminescent unit 520 including a second hole transport layer (HTL) 441, a second electron blocking layer (EBL) 446, a second emission layer (EML) 451, a second hole blocking layer (EBL) 456, and a second electron transport layer (ETL) 461; an electron injection layer (EIL) 480 and a cathode layer 490. The HIL may comprise a compound of Formula (I). The p-type charge generation layer 435 and the n-type charge generation layer 485 are a common p-type charge generation layer 435c and a common n-type charge generation layer 485c according to the invention.

Hereinafter, one or more exemplary embodiments of the present invention will be described in detail with, reference to the following examples. However, these examples are not intended to limit the purpose and scope of the one or more exemplary embodiments of the present invention.

DETAILED DESCRIPTION

The invention is furthermore illustrated by the following examples which are illustrative only and non-binding. The compound may be prepared as described in the literature or alternative compounds may be prepared following similar compounds as described in the literature.

Calculated HOMO and LUMO

The HOMO and LUMO are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected.

Measured HOMO

The energy level of the highest occupied molecular orbital is derived from cyclic voltammetry of molecules in solution and expressed in the physical absolute scale against vacuum taken as zero energy level. The given HOMO levels were calculated from redox potential V, (measured by cyclic voltammetry (CV) as specified below and expressed in the scale taking the potential of standard redox pair ferricenium/ferrocene (Fc$^+$/Fc) equal zero) according to equation $E_{HOMO} = -q^* V_{cv} - 4.8$ eV, wherein q* stands for the charge of an electron (1e).

The redox potential can be determined by cyclic voltammetry, e.g. with a potentiostatic device Metrohm PGSTAT30 and software Metrohm Autolab GPES at room temperature. The redox potentials given at particular compounds was measured in an argon de-aerated, dry 0.1M THF (Tetrahydrofuran) solution of the tested substance, under argon atmosphere, with 0.1M tetrabutylammonium hexafluorophosphate supporting electrolyte, between platinum working electrodes and with an Ag/AgCl pseudo-standard electrode (Metrohm Silver rod electrode), consisting of a silver wire covered by silver chloride and immersed directly in the measured solution, with a scan rate of 100 mV/s. In the measurement, the first run was done in the broadest range of the potential set on the working electrodes, and the range was then adjusted within subsequent runs appropriately. The final three runs were done with the addition of ferrocene (in 0.1M concentration) as the standard. The average of potentials corresponding to cathodic and anodic peak of the studied compound, after subtraction of the average of cathodic and anodic potentials observed for the standard Fc+/Fc redox couple, afforded finally the values reported above. All studied compounds as well as the reported comparative compounds showed well-defined reversible electrochemical behavior. Alternatively, dichloromethane can be used as solvent.

A simple rule is very often used for the conversion of redox potentials into electron affinities (EA) and ionization potential (IP): IP (in eV)=4.80 eV+e*Eox (wherein Eox is given in Volt vs. ferrocene/ferrocenium (Fc/Fc+) and EA (in eV)=4.80 eV+e*Ered (Ered is given in Volt vs. Fc/Fc+), respectively (see B. W. D'Andrade, Org. Electron. 6, 11-20 (2005)), e* is the elemental charge. It is common practice, even if not exactly correct, to use the terms "energy of the HOMO" E(HOMO) and "energy of the LUMO" E(LUMO), respectively, as synonyms for the ionization energy and electron affinity (Koopmans Theorem).

Sheet Resistance Measurement

Determination of sheet resistance of a single CGL requires the measurement of the sheet resistance using the transmission line method on CGL test devices with a varied number of CGLs (FIG. 1). These CGL test devices are manufactured by deposition of a number of bilayers consisting of first a p-CGL followed by an n-CGL. By variation of number of bilayers compensation of interface effects can be done. Usually devices with 1, 2 and 3 bilayers are used. This gives 1, 3 and 5 p-n-interfaces. One single CGL is represented by half of the layer thickness of p- and n-CGL thickness used for bilayers. Single CGL sheet resistance is calculated by plotting reciprocal value of sheet resistance of CGL test devices versus number of p-n-interfaces and doing a linear fit. Sheet resistance is equal to reciprocal value of the slope. This calculation compensates substrate influence and interface to air on top of layer stack.

Transmission Line Method

Sheet resistance is measured for a given layer stack on a test element group (see FIG. 2) consisting of test elements called channel providing two highly conductive electrodes with gap "l" between each other and a width "w" of each (see FIG. 3). To improve noise level large "w" may be used and electrodes formed in interdigitated finger structure for reduced area requirement (see FIG. 4). At least three of such channels with different channel length "l" are needed for reliable sheet resistance calculation.

The measurement is done in following way:

First voltage is swept between −5V to +5V with step size smaller than 1V and current is measured. Using a linear fit with current values on x-axis and voltage values on y-axis slope of the fit gives channel resistance "R". This procedure is repeated for each channel "n", resulting in an "Rn" for channel "n" with gap "ln" and width "w". For Rs calculation width "w" must be constant over all channels. Fit quality index $R^2$ must be larger than 0.9 for a reliable resistance value.

In the second step resistance "Rn" is plotted over channel with gap "ln" and linear fitted. Slope of this fit multiplied with channel width "w" gives sheet resistance of measured stack. This calculation removes influence of contact- and series resistance from measurement setup. Electrode gap should be close to target application gap, for example 20 µm, 40 µm, 60 µm. Channel width for low conductive layers might be 100000 µm.

The measurement is done on glass substrates (Corning Eagle XG) with ITO electrodes. After wet cleaning with water based tenside solution and drying by blowing with nitrogen followed by 200° C. 120 minutes baking in nitrogen atmosphere substrates are conditioned with nitrogen plasma. After organic layer deposition before electrical measurement samples are encapsulated using encapsulation glass lids including a desiccant.

Measurement of Hole Mobility

Hole mobility parameter for a given hole transport compound (HTM) is determined by measuring the voltage drop at fixed current density of 10 mA/cm$^2$ (HOD voltage $V_{HOD}$) at 22° C. for hole only device HOD with highly doped hole injection layer HIL and a thick hole transport layer HTL. Highly doped hole injection layer reduces voltage drop from anode to hole transport layer under test and thick hole transport layer ensures device voltage drop is dominated by hole transport layer. Hole only device stack made according to FIG. 5. On substrate 100 there is an ITO anode layer 110 with thickness of 90 nm and 15 ohm/sq sheet resistance. This is followed by a 10 nm hole injection layer 120 consisting of hole transport compound doped with 10 wt % of a compound with the following formula

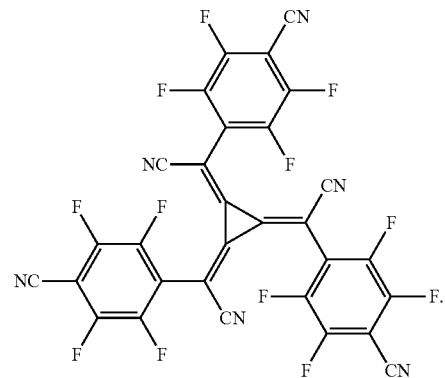 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

Adjacent 400 nm of the hole transport compound is deposited to form hole transport layer 130. This layer is followed by a 10 nm 1,4,5,8,9,11-Hexaazatriphenylenehexacarbonitrile (HAT-CN) layer 140, what prevents electron injection from cathode 150 consisting of a 100 nm silver layer.

HOD voltage $V_{HOD}$ is a measure for hole mobility allowing for comparison of different hole transport materials. Higher values mean lower mobility.

Measurement of Electron Mobility

Electron mobility parameter for a given electron transport compound (ETM) is given by measurement of voltage drop at fixed current density of 15 mA/cm$^2$ at 22° C. for electron only device EOD according to stack shown in FIG. 6. On glass substrate 200 a first anode layer 210 with thickness 100 nm consisting of Silver is deposited. This layer is followed by second anode layer 220 consisting of Magnesium co-evaporated with 40 wt. % Silver. Next electron injection layer 230 consisting of 1 nm LiQ follows. Adjacent layer 240 consisting of 36 nm electron transport compound is deposited. This is followed by 1 nm electron injection layer (EIL) 250 consisting of LiQ for LiQ host or PO-containing LiQ-free ETMs. For non-PO LiQ-free ETMs 3-Phenyl-3H- benzo[b]dinaphtho[2,1-d:1',2'-f]phosphepine-3-oxide:Yb(1 vol %) is used in this EIL. The EOD stack is finished by cathode 260 consisting of 30 nm Magnesium co-evaporated with 40 wt. % Silver.

EOD voltage $V_{EOD}$ is a measure for electron mobility allowing for comparison of different electron transport materials. Higher values mean lower mobility.

General Procedure for Fabrication of OLEDs

For the examples according to the invention and comparative examples in Table 2, a glass substrate with an anode layer comprising a first anode sub-layer of 10 nm ITO, a second anode sub-layer of 120 nm Ag and a third anode sub-layer of 8 nm ITO was cut to a size of 100 mm×100 mm×0.7 mm, ultrasonically washed with water for 60 minutes and then with isopropanol for 20 minutes. The liquid film was removed in a nitrogen stream, followed by plasma treatment, see Table 2, to prepare the anode layer. The plasma treatment was performed in an atmosphere comprising 97.6 vol.-% nitrogen and 2.4 vol.-% oxygen.

Then N-([1,1'-biphenyl]-4-yl)-9,9-dimethyl-N-(4-(9-phenyl-9H-carbazol-3-yl)phenyl)-9H-fluoren-2-amine was vacuum deposited with 8 wt.-% 2,2',2''-(cyclopropane-1,2,3-triylidene)tris(2-(p-cyanotetrafluorophenyl)acetonitrile) to form a hole injection layer having a thickness 10 nm.

Then N-([1,1'-biphenyl]-4-yl)-9,9-dimethyl-N-(4-(9-phenyl-9H-carbazol-3-yl)phenyl)-9H-fluoren-2-amine was vacuum deposited, to form a first hole transport layer having a thickness of 29 nm Then N,N-di([1,1'-biphenyl]-4-yl)-3'-(9H-carbazol-9-yl)-[1,1'-biphenyl]-4-amine was vacuum deposited on the HTL, to form an electron blocking layer (EBL) having a thickness of 5 nm.

Then 97 wt.-% H09 (Sun Fine Chemicals, Korea) as EML host and 3 wt.-% BD200 (Sun Fine Chemicals, Korea) as fluorescent blue dopant were deposited on the EBL, to form a first blue-emitting EML with a thickness of 19 nm.

Then 2-(3'-(9,9-dimethyl-9H-fluoren-2-yl)-[1,1'-biphenyl]-3-yl)-4,6-diphenyl-1,3,5-triazine was vacuum deposited to form a first hole blocking layer having a thickness of 5 nm.

Then, the electron transporting layer (ETL) having a thickness of 10 nm is formed on the hole blocking layer by depositing 2,2'-(1,3-Phenylene)bis[9-phenyl-1,10-phenanthroline;

Then a n-type CGL having a thickness of 7.5 nm is formed on the ETL1 by co-depositing 95 wt.-% of an electron transport compound (ETM of n-CGL) according to Table 2 and 5 wt.-% Yb.

Then a p-type CGL having a thickness of 10 nm is formed on the first n-type CGL by co-depositing a hole transport compound (HTM of p-CGL) according to Table 2 with 10 wt % 2,2',2''-(cyclopropane-1,2,3-triylidene)tris(2-(p-cyanotetrafluorophenyl)acetonitrile) (compound B80) as organic p-dopant.

Then a second hole transport layer having a thickness of 44 nm is formed on the first p-type CGL by depositing a hole transport compound (HTM of second HTL) according to Table 2.

Then a second electron blocking layer having a thickness of 5 nm is formed on the second hole transport layer by depositing N,N-di([1,1'-biphenyl]-4-yl)-3'-(9H-carbazol-9-yl)-[1,1'-biphenyl]-4-amine.

Then 97 wt.-% H09 (Sun Fine Chemicals, Korea) as EML host and 3 wt.-% BD200 (Sun Fine Chemicals, Korea) as fluorescent blue dopant were deposited on the second EBL, to form a second blue-emitting EML with a thickness of 19 nm.

Then 2-(3'-(9,9-dimethyl-9H-fluoren-2-yl)-[1,1'-biphenyl]-3-yl)-4,6-diphenyl-1,3,5-triazine was vacuum deposited to form a second hole blocking layer having a thickness of 5 nm is formed on the second blue-emitting EML.

Then, 50 wt.-% 2-(2',6'-diphenyl-[1,1':4',1''-terphenyl]-4-yl)-4-phenyl-6-(3-(pyridin-4-yl)phenyl)-1,3,5-triazine and 50 wt.-% LiQ were vacuum deposited on the second hole blocking layer to form a second electron transport layer having a thickness of 31 nm.

Then Yb was evaporated at a rate of 0.01 to 1 Å/s at $10^{-7}$ mbar to form an electron injection layer with a thickness of 2 nm on the electron transporting layer.

Ag/Mg (1.8 wt %) is evaporated at a rate of 0.01 to 1 Å/s at $10^{-7}$ mbar to form a cathode with a thickness of 13 nm.

Then, N-({[1,1-'biphenyl]-4-yl)-9,9,dimethyl-N-(4-(9-phenyl-9H-carbazol-3-yl)phenyl)-9H-fluoren-2-amine} was vacuum deposited on the cathode layer to form a capping layer with a thickness of 75 nm.

To assess the performance of the inventive examples compared to the prior art, the current efficiency is measured at 20° C. The current-voltage characteristic is determined using a Keithley 2635 source measure unit, by sourcing a voltage in V and measuring the current in mA flowing through the device under test. The voltage applied to the device is varied in steps of 0.1V in the range between 0V and 10V. Likewise, the luminance-voltage characteristics and CIE coordinates are determined by measuring the luminance in cd/m² using an Instrument Systems CAS-140CT array spectrometer (calibrated by Deutsche Akkreditierungsstelle (DAkkS)) for each of the voltage values. The cd/A efficiency at 10 mA/cm2 is determined by interpolating the luminance-voltage and current-voltage characteristics, respectively.

In bottom emission devices, the emission is predominately Lambertian and quantified in percent external quantum efficiency (EQE). To determine the efficiency EQE in % the light output of the device is measured using a calibrated photodiode at 10 mA/cm2.

In top emission devices, the emission is forward directed, non-Lambertian and also highly dependent on the mircocavity. Therefore, the efficiency EQE will be higher compared to bottom emission devices. To determine the efficiency EQE in % the light output of the device is measured using a calibrated photodiode at 10 mA/cm².

Lifetime LT of the device is measured at ambient conditions (20° C.) and 30 mA/cm², using a Keithley 2400 sourcemeter, and recorded in hours.

The brightness of the device is measured using a calibrated photo diode. The lifetime LT is defined as the time till the brightness of the device is reduced to 97% of its initial value.

The increase in operating voltage ΔU is used as a measure of the operational voltage stability of the device. This increase is determined during the LT measurement and by subtracting the operating voltage after 1 hour after the start of operation of the device from the operating voltage after 100 hours.

$$\Delta U=[U100\ h)-U(1\ h)]$$

or the operating voltage after 1 hour after the start of operation of the device from the operating voltage after 400 hours.

$$\Delta U=[U400\ h)-U(1\ h)]$$

The smaller the value of AU the better is the operating voltage stability.

Technical Effect of the Invention
TABLE 1
| | Hole mobility and HOMO level (CV = Cyclic voltammetry) | | | |
|---|---|---|---|---|
| | Structure of hole transport compound (HTM) | $V_{HOD}$ | HOMO CV (ref −4.80 eV) | HOMO B3LYP/ 6-31G |
| Comparative | 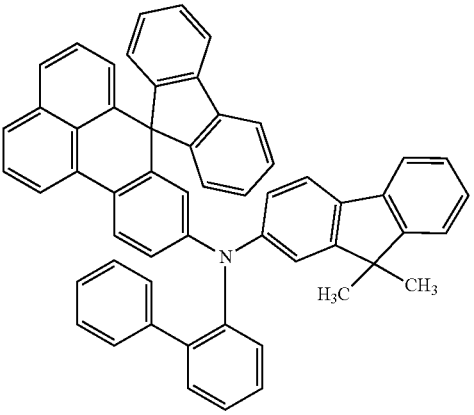 [SMILES: CC1(C)c2ccccc2-c2ccc(N(c3ccc4c(c3)C3(c5ccccc5-c5ccccc53)c3cccc5cccc-4c35)c3ccccc3-c3ccccc3)cc21] | 1,038 | −5,13 | −4.69 |
| F2 | 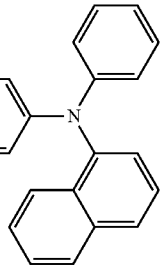 | 1.56 | −5,25 | −4.81 |
| F4 | 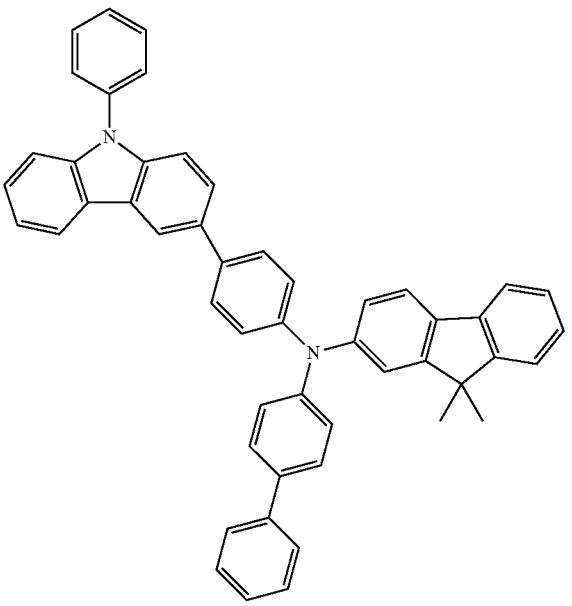 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] | 2.336 | −5,10 | −4.69 |

TABLE 1-continued

| | Structure of hole transport compound (HTM) | $V_{HOD}$ | HOMO CV (ref −4.80 eV) | HOMO B3LYP/ 6-31G |
|---|---|---|---|---|
| F1 | | 1.29 | −5.14 | −4.75 |
| F12 | | 6.15 | −5.13 | −4.71 |
| F11 | | 4.54 | −5.25 | −4.93 |
| F3 | | 1.86 | −5.15 | −4.73 |

TABLE 1-continued

Hole mobility and HOMO level (CV = Cyclic voltammetry)

| Structure of hole transport compound (HTM) | $V_{HOD}$ | HOMO CV (ref −4.80 eV) | HOMO B3LYP/ 6-31G |
|---|---|---|---|
| F14 | 8.67 | −5.25 | −4.96 |
| F5 | 3.45 | −5.09 | −4.70 |
| F19 | 2.81 | −5.02 | −4.64 |

TABLE 1-continued

Hole mobility and HOMO level (CV = Cyclic voltammetry)

| Structure of hole transport compound (HTM) | $V_{HOD}$ | HOMO CV (ref −4.80 eV) | HOMO B3LYP/ 6-31G |
|---|---|---|---|
| F20 | 2.50 | −5.15 | −4.75 |
| F8 | 3.79 | −5.18 | −4.83 |
| F13 | 7.88 | −5.26 | −4.94 |

TABLE 1-continued

Hole mobility and HOMO level (CV = Cyclic voltammetry)

| Structure of hole transport compound (HTM) | $V_{HOD}$ | HOMO CV (ref −4.80 eV) | HOMO B3LYP/ 6-31G |
|---|---|---|---|
| F9 | 3.90 | −5.23 | −4.84 |
| F7 | 3.47 | −5.26 | −4.91 |
| F6 | 3.12 | −5.24 | −4.87 |

TABLE 1-continued

| | Structure of hole transport compound (HTM) | $V_{HOD}$ | HOMO CV (ref −4.80 eV) | HOMO B3LYP/ 6-31G |
|---|---|---|---|---|
| F10 | | 3.92 | −5.26 | −4.96 |

TABLE 2

Performance tests

| | HTM of second HTL | HTM of p-CGL (hole transport compound) | $V_{HOD}$ [V] | ETM of n-CGL (electron transport compound) | LUMO of ETM of n-CGL B3LYP/ 6-31G* | $V_{EOD}$ [V] | Rs [GΩ/ square] | Voltage at 15 mA/cm² | Voltage rel. [%] | LT97 [h] 30 mA/cm² | Lifetime Rel. [%] |
|---|---|---|---|---|---|---|---|---|---|---|---|
| Comp. Ex. 1 | F3 | (Comparative) | 1.04 | | -1.74 | 0.16 | 5 | 7.15 | 100 | 117 | 100 |
| Comp. Ex. 2 | F2 + WO₃ (as dopant) | | >>20V | | -1.74 | 0.16 | >5000 | Does not result in a working OLED, i.e. it does exhibit luminescence. | | | |

TABLE 2-continued

Performance tests

| | HTM of second HTL | HTM of p-CGL (hole transport compound) | $V_{HOD}$ [V] | ETM of n-CGL (electron transport compound) | LUMO of ETM of n-CGL B3LYP/ 6-31G* | $V_{EOD}$ [V] | Rs [GΩ/ square] | Voltage at 15 mA/ cm$^2$ | Voltage rel. [%] | LT97 [h] 30 mA/ cm$^2$ | Life-time Rel. [%] |
|---|---|---|---|---|---|---|---|---|---|---|---|
| Comp. Ex. 3 | F2 | + compound B80 | >>20V | | −1.74 | 0.16 | 31 | Does not result in a working OLED, i.e. it does exhibit luminescence. | | | |
| Comp. Ex. 4 | F4 +WO$_3$ (as dopant) | F4 | 2.336 | | −1.74 | 0.16 | 20 | 9.07 | 127 | 71 | 61 |

TABLE 2-continued

Performance tests

| | HTM of second HTL | HTM of p-CGL (hole transport compound) | $V_{HOD}$ [V] | ETM of n-CGL (electron transport compound) | LUMO of ETM of n-CGL B3LYP/ 6-31G* | $V_{EOD}$ [V] | Rs [GΩ/ square] | Voltage at 15 mA/cm² | Voltage rel. [%] | LT97 [h] 30 mA/cm² | Lifetime Rel. [%] |
|---|---|---|---|---|---|---|---|---|---|---|---|
| Ex. 1 | F2 | F2 | 1.56 | | −1.75 | 0.41 | 124 | 7.42 | 100 | 118 | 100 |
| Ex. 2 | F2 | F2 | 1.56 | | −1.75 | 0.41 | 124 | 7.41 | 100 | 113 | 96 |
| Ex. 3 | F2 | F2 | 1.56 | | −1.74 | 0.16 | 111 | 7.09 | 96 | 168 | 143 |
| Ex. 4 | F3 | F12 | 6.15 | | −1.74 | 0.16 | 154 | 7.27 | 102 | 121 | 104 |

TABLE 2-continued

Performance tests

| | HTM of second HTL | HTM of p-CGL (hole transport compound) | $V_{HOD}$ [V] | ETM of n-CGL (electron transport compound) | LUMO of ETM of n-CGL B3LYP/ 6-31G* | $V_{EOD}$ [V] | Rs [GΩ/square] | Voltage at 15 mA/cm² | Voltage rel. [%] | LT97 [h] 30 mA/cm² | Lifetime Rel. [%] |
|---|---|---|---|---|---|---|---|---|---|---|---|
| Ex. 5 | F3 | F12 | 6.15 | | −1.75 | 0.41 | 153 | 7.55 | 106 | 117 | 100 |
| Ex. 6 | F2 | F14 | 8.67 | | −1.74 | 0.16 | 5280 | 7.37 | 99 | 161 | 137 |

TABLE 2-continued

Performance tests

| | HTM of second HTL | HTM of p-CGL (hole transport compound) | $V_{HOD}$ [V] | ETM of n-CGL (electron transport compound) | LUMO of ETM of n-CGL B3LYP/ 6-31G* | $V_{EOD}$ [V] | Rs [GΩ/ square] | Voltage at 15 mA/cm² | Voltage rel. [%] | LT97 [h] 30 mA/cm² | Life- time Rel. [%] |
|---|---|---|---|---|---|---|---|---|---|---|---|
| Ex. 7 | F2 | F14 | 8.67 | | −1.75 | 0.41 | 19278 | 7.63 | 103 | 112 | 95 |
| Ex. 8 | F3 | F20 | 2.50 | | −1.75 | 0.41 | 43 | 7.44 | 104 | 78 | 67 |

TABLE 2-continued

Performance tests

| | HTM of second HTL | $V_{HOD}$ [V] | HTM of p-CGL (hole transport compound) | ETM of n-CGL (electron transport compound) | LUMO of ETM of n-CGL B3LYP/ 6-31G* | $V_{EOD}$ [V] | Rs [GΩ/ square] | Voltage at 15 mA/cm² | Voltage rel. [%] | LT97 [h] 30 mA/ cm² | Life-time Rel. [%] |
|---|---|---|---|---|---|---|---|---|---|---|---|
| Ex. 9 | F3 | 2.50 | F20 | | −1.68 | 0.62 | 44 | 7.71 | 108 | 72 | 62 |
| Ex. 10 | F2 | 3.79 | F8 | | −1.75 | 0.41 | 4454 | 7.75 | 1.08 | 81 | 69 |

TABLE 2-continued

Performance tests

| | HTM of second HTL | HTM of p-CGL (hole transport compound) | $V_{HOD}$ [V] | ETM of n-CGL (electron transport compound) | LUMO of ETM of n-CGL B3LYP/ 6-31G* | $V_{EOD}$ [V] | Rs [GΩ/ square] | Voltage at 15 mA/ cm² | Voltage rel. [%] | LT97 [h] 30 mA/ cm² | Life-time Rel. [%] |
|---|---|---|---|---|---|---|---|---|---|---|---|
| Ex. 11 | F2 | F11 | 4.54 | | −1.75 | 0.41 | 3282 | 7.61 | 1.06 | 82 | 70 |
| Ex. 12 | F2 | F11 | 4.54 | | −1.68 | 0.62 | 3534 | 7.87 | 110 | 75 | 64 |

When using a hole transport material with a low hole mobility in CGL (e.g. Ex. 7) in comparison to a hole transport material with a high hole mobility in the p-CGL (comparative example), the sheet resistance can be significantly increased, while a good OLED performance such as low operating voltage and a high device lifetime can be maintained.

This may be beneficial for reducing the cross-talk of pixels in display, while the low operating voltage is beneficial for the battery life or a low energy consumption, and a long lifetime may be beneficial for long-time stability of a display.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

The invention claimed is:

1. A display device, comprising a plurality of pixels, wherein each pixel of the plurality of pixels comprises at least two vertically stacked electroluminescent units and at least one charge generation layer arranged between the at least two vertically stacked electroluminescent units, wherein each electroluminescent unit comprises at least one light-emitting layer;
   wherein at least two pixels of the plurality of pixels share as the charge generation layer at least one common charge generation layer,
   wherein the at least one common charge generation layer comprises
   a common n-type charge generation layer comprising an organic electron transport compound and a metal dopant; and
   a common p-type charge generation layer comprising an organic hole transport compound and an organic p-dopant, wherein the organic hole transport compound is present in the p-type charge generation layer in an amount of ≥60 wt %, based on the total weight of the p-type charge generation layer;
   wherein,
   the organic hole transport compound has a hole mobility, determined by measuring the voltage drop $V_{HOD}$, in the range of ≥1.2 V to ≤20 V,
   and the organic electron transport compound has an electron mobility, determined by measuring the voltage drop $V_{EOD}$, in the range of ≥0.1 V to ≤20 V;
   wherein the hole mobility is measured by measuring the voltage drop $V_{HOD}$ at a fixed current density of 10 mA/cm² at 20° C. to 25° C. for a hole only device, and the electron mobility is measured by measuring the voltage drop $V_{EOD}$ at a fixed current density of 15 mA/cm² at 20° C. to 25° C. for an electron only device;
   wherein the hole only device has a structure in the following order
   a glass substrate,
   90 nm anode layer consisting of ITO with a sheet resistance of 15 ohm/square,
   10 nm layer consisting of the organic hole transport compound and 10 wt % 4,4',4"-((1E,1'E,1"E)-cyclopropane-1,2,3-triylidenetris(cyanomethanylylidene))tris(2,3,5,6-tetrafluorobenzonitrile),
   400 nm layer consisting of the organic hole transport compound
   10 nm layer consisting of CNHAT (Dipyrazino[2,3-f: 2',3'-h]quinoxaline-2,3,6,7,10,11-hexacarbonitrile),
   100 nm cathode layer consisting of silver; and
   wherein the electron only device has a structure in the following order
   glass substrate
   100 nm anode layer consisting of silver,
   30 nm anode layer consisting of Mg:Ag (90:10 vol %),
   1 nm layer consisting of 8-Hydroxyquinolinolato-lithium,
   36 nm layer consisting of the organic electron transport compound,
   1 nm layer consisting of 8-Hydroxyquinolinolato-lithium,
   30 nm cathode layer consisting of Mg:Ag (90:10 vol %);
   wherein the layer of the structure for measuring the voltage drop are deposited by evaporation.

2. Display device according to claim 1, wherein the organic hole transport compound has a hole mobility, determined by measuring the voltage drop $V_{HOD}$, in the range of ≥1.5 V to ≤20 V.

3. Display device according to claim 1, wherein the organic hole transport compound has a hole mobility, determined by measuring the voltage drop $V_{HOD}$, in the range of ≥1.7 V to ≤20 V.

4. Display device according to claim 1, wherein the organic hole transport compound has a hole mobility, determined by measuring the voltage drop $V_{HOD}$, in the range of ≥1.9 V to ≤20 V.

5. Display device according to claim 1, wherein the organic hole transport compound has a hole mobility, determined by measuring the voltage drop $V_{HOD}$, in the range of ≥2.1 V to ≤20 V.

6. Display device according to claim 1, wherein the organic hole transport compound has a hole mobility, determined by measuring the voltage drop $V_{HOD}$, in the range of ≥2.3 V to ≤20 V.

7. Display device according to claim 1, wherein the organic hole transport compound has an energy level of the HOMO, expressed in the absolute scale referring to vacuum energy level being zero, measured by cyclic voltammetry, in the range of ≥−6 eV to ≤−5.10 eV.

8. Display device according to claim 1, wherein the organic hole transport compound is present in the p-type charge generation layer in an amount of ≥65 wt %, based on the total weight of the p-type charge generation layer.

9. Display device according to claim 1, wherein the organic p-dopant has an energy level of the LUMO, expressed in the absolute scale referring to vacuum energy level being zero, calculated using the hybrid functional B3LYP with a Gaussian 6-31G* basis set as implemented in the program package TURBOMOLE V6.5, in the range from ≥−5.7 eV to ≤−4.7 eV.

10. Display device according to claim 1, wherein the organic p-dopant is selected from a compound according to formula (I)

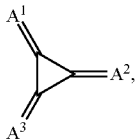

wherein in formula (I)

$A^1$ is independently selected from a group according to formula (II)

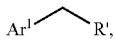

wherein $Ar^1$ is independently selected from substituted or unsubstituted $C_6$ to $C_{36}$ aryl and substituted or unsubstituted $C_2$ to $C_{36}$ heteroaryl;

wherein for the case that $Ar^1$ is substituted, one or more of the substituents are independently selected from the group consisting of an electron-withdrawing group, F, CN, partially fluorinated or perfluorinated alkyl, and —$NO_2$;

$A^2$ and $A^3$ are independently selected from a group of formula (III)

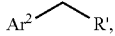

wherein $Ar^2$ is independently selected from substituted or unsubstituted $C_6$ to $C_{36}$ aryl and substituted or unsubstituted $C_2$ to $C_{36}$ heteroaryl;

wherein for the case that $Ar^2$ is substituted, one or more of the substituents are independently selected from an electron-withdrawing group, F, CN, partially fluorinated or perfluorinated alkyl, and —$NO_2$;

and wherein each R' is independently selected from substituted or unsubstituted $C_6$ to $C_{18}$ aryl, $C_3$ to $C_{18}$ heteroaryl, electron-withdrawing group, partially fluorinated or perfluorinated $C_1$ to $C_8$ alkyl, halogen, F or CN.

11. Display device according to claim 1, wherein the common p-type charge generation layer has a thickness of ≤30 nm.

12. Display device according to claim 1, wherein the organic electron transport compound has an energy level of the LUMO, expressed in the absolute scale referring to vacuum energy level being zero, calculated using the hybrid functional B3LYP with a Gaussian 6-31G* basis set as implemented in the program package TURBOMOLE V6.5, in the range from ≥−3.5 eV to ≤−1 e V.

13. Display device according to claim 1, wherein the organic electron transport compound comprises at least 15 covalently bound atoms.

14. Display device according to claim 1, wherein the organic electron transport compound is present in the common n-type charge generation layer in an amount of ≥0.1 wt %, based on the total weight of the n-type charge generation layer.

15. Display device according to claim 1, wherein the metal dopant is a metal selected from the group consisting of Yb, or a metal alloys comprising a metal selected from the group consisting of Li or Yb.

16. Display device according to claim 1, wherein the common n-type charge generation layer has a thickness of ≤30 nm.

17. Display device according to claim 1, wherein the common charge generation layer has a sheet resistance Rs in the range from ≥0.2 giga ohms per square to ≤$10^6$ giga ohms per square, when measured alone.

18. Display device according to claim 1, wherein the display device comprises a driving circuit configured to separately driving the pixels of the plurality of pixels.

19. Method for the manufacture of a display device according to claim 1, the method comprising the step of manufacturing the at least one common charge generation layer, wherein each common layer is deposited onto the complete display area through one large mask opening in one processing step.

* * * * *